US008324615B2

(12) United States Patent
Seo et al.

(10) Patent No.: US 8,324,615 B2
(45) Date of Patent: Dec. 4, 2012

(54) LIGHT-EMITTING ELEMENT, LIGHT-EMITTING DEVICE, AND ELECTRONIC DEVICE

(75) Inventors: Satoshi Seo, Kanagawa (JP); Tsunenori Suzuki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 280 days.

(21) Appl. No.: 12/688,104

(22) Filed: Jan. 15, 2010

(65) Prior Publication Data

US 2010/0181562 A1    Jul. 22, 2010

(30) Foreign Application Priority Data

Jan. 21, 2009  (JP) .................................. 2009-011410

(51) Int. Cl.
*H01L 35/24*    (2006.01)
(52) U.S. Cl. ............ 257/40; 257/E33.013; 257/E51.026
(58) Field of Classification Search ........... 257/E33.013, 257/E51.026
See application file for complete search history.

(56) References Cited

U.S. PATENT DOCUMENTS

| | | | |
|---|---|---|---|
| 5,061,569 A | 10/1991 | VanSlyke et al. | |
| 6,603,150 B2 | 8/2003 | Liao et al. | |
| 6,998,487 B2 | 2/2006 | Kim et al. | |
| 7,163,831 B2 | 1/2007 | Hasegawa et al. | |
| 7,173,370 B2 | 2/2007 | Seo et al. | |
| 7,192,659 B2 | 3/2007 | Ricks et al. | |
| 7,196,360 B2 | 3/2007 | Seo et al. | |
| 7,268,484 B2 | 9/2007 | Nakamura | |
| 7,365,360 B2 | 4/2008 | Kang et al. | |
| 8,040,047 B2 * | 10/2011 | Ushikubo et al. | 313/504 |
| 2002/0086180 A1 | 7/2002 | Seo et al. | |
| 2002/0093283 A1 | 7/2002 | Seo et al. | |
| 2002/0109136 A1 | 8/2002 | Seo et al. | |
| 2002/0113546 A1 | 8/2002 | Seo et al. | |
| 2002/0121860 A1 | 9/2002 | Seo et al. | |
| 2002/0139303 A1 | 10/2002 | Yamazaki et al. | |
| 2002/0155632 A1 | 10/2002 | Yamazaki et al. | |
| 2003/0010288 A1 | 1/2003 | Yamazaki et al. | |
| 2004/0151943 A1 | 8/2004 | Lee et al. | |
| 2004/0154542 A1 | 8/2004 | Yamazaki et al. | |
| 2005/0179378 A1 | 8/2005 | Oooka et al. | |
| 2005/0221121 A1 | 10/2005 | Ishihara et al. | |

(Continued)

FOREIGN PATENT DOCUMENTS

JP    2008-204934    9/2008

*Primary Examiner* — Lex Malsawma
(74) *Attorney, Agent, or Firm* — Husch Blackwell LLP

(57) ABSTRACT

A light-emitting element includes a first electrode, a first light-emitting layer formed over the first electrode, a second light-emitting layer formed on and in contact with the first light-emitting layer to be in contact therewith, and a second electrode formed over the second light-emitting layer. The first light-emitting layer includes a first light-emitting substance and a hole-transporting organic compound, and the second light-emitting layer includes a second light-emitting substance and an electron-transporting organic compound. Substances are selected such that a difference in LUMO levels between the first light-emitting substance, the second light-emitting substance, and the electron-transporting organic compound is 0.2 eV or less, a difference in HOMO levels between the hole-transporting organic compound, the first light-emitting substance, and the second light-emitting substance is 0.2 eV or less, and a difference in LUMO levels between the hole-transporting organic compound and the first light-emitting substance is greater than 0.3 eV.

28 Claims, 19 Drawing Sheets

U.S. PATENT DOCUMENTS

| | | |
|---|---|---|
| 2005/0221124 A1 | 10/2005 | Hwang et al. |
| 2005/0225235 A1 | 10/2005 | Kim et al. |
| 2005/0260440 A1 | 11/2005 | Seo et al. |
| 2006/0210828 A1 | 9/2006 | Nakayama et al. |
| 2006/0243967 A1 | 11/2006 | Nomura et al. |
| 2006/0243970 A1 | 11/2006 | Seo et al. |
| 2007/0020483 A1 | 1/2007 | Park et al. |
| 2007/0020484 A1 | 1/2007 | Kim et al. |
| 2007/0145888 A1 | 6/2007 | Yabunouchi et al. |
| 2007/0159083 A1 | 7/2007 | Matsuura et al. |
| 2007/0216292 A1 | 9/2007 | Seo et al. |
| 2007/0231503 A1 | 10/2007 | Hwang et al. |
| 2008/0006821 A1 | 1/2008 | Suzuki et al. |
| 2008/0006822 A1 | 1/2008 | Ohsawa |
| 2008/0014464 A1 | 1/2008 | Kawamura et al. |
| 2008/0124572 A1 | 5/2008 | Mizuki et al. |
| 2008/0142794 A1 | 6/2008 | Shitagaki et al. |
| 2008/0231177 A1 | 9/2008 | Nomura et al. |
| 2008/0242871 A1 | 10/2008 | Kawakami et al. |
| 2008/0261075 A1 * | 10/2008 | Seo et al. ............ 428/690 |
| 2008/0268282 A1 | 10/2008 | Spindler et al. |
| 2009/0140634 A1 | 6/2009 | Nomura et al. |
| 2009/0160323 A1 | 6/2009 | Nomura et al. |
| 2009/0284140 A1 | 11/2009 | Osaka et al. |

* cited by examiner

LIGHT-EMITTING ELEMENT, LIGHT-EMITTING DEVICE, AND ELECTRONIC DEVICE

BACKGROUND OF THE INVENTION

1. Field of the Invention

The present invention relates to a current excitation type light-emitting element, in particular, a light-emitting element in which a layer containing an organic compound is provided between electrodes. Further, the present invention relates to a light-emitting device and an electronic device including such a light-emitting element.

2. Description of the Related Art

In recent years, research and development have been extensively conducted on light-emitting elements using electroluminescence (EL). In a basic structure of these light-emitting elements, a light-emitting substance is interposed between a pair of electrodes. By applying voltage to such a light-emitting element, light emission can be obtained from the light-emitting substance.

Since such a light-emitting element is a self-luminous type, there are advantages such as higher visibility of a pixel and unnecessity of a backlight, compared to a liquid crystal display. Accordingly, such a light-emitting element is suitable for a flat panel display element. Another major advantage of such a light-emitting element is that it can be manufactured to be thin and lightweight. In addition, extremely high response speed is also one of the features.

Furthermore, since such a light-emitting element can be formed into a film shape, plane light emission can be easily obtained by formation of a large-area element. This is a feature that is hard to be obtained in point light sources typified by a filament lamp and an LED or linear light sources typified by a fluorescent light. Therefore, such a light-emitting element also has a high utility value as a plane light source that can be applied to lighting or the like.

Deterioration of a light-emitting element is one of the main reasons why the above-described light-emitting element with many advantages and a light-emitting device including such a light-emitting element are limited to a partial practical use. A light-emitting element deteriorates such that the luminance is lowered in accordance with the accumulation of driving time even if the same amount of current is fed thereto. It is essential to obtain a light-emitting element whose degree of deterioration is acceptable for an actual product so that the light-emitting device can be widespread. A light-emitting element has been researched from many aspects such as aspects of a driver circuit, sealing, an element structure, and a material (for example, Patent Document 1).

REFERENCE

Patent Document

[Patent Document 1]
Japanese Published Patent Application No. 2008-204934

SUMMARY OF THE INVENTION

It is an object of an embodiment of the present invention to achieve long lifetime of a light-emitting element. In addition, it is another object of an embodiment of the present invention to provide an electronic device using a light-emitting element with long lifetime.

An embodiment of the present invention is a light-emitting element including a first electrode, a first light-emitting layer formed over the first electrode, a second light-emitting layer formed on the first light-emitting layer to be in contact with the first light-emitting layer, and a second electrode formed over the second light-emitting layer. The first light-emitting layer includes a first light-emitting substance and a hole-transporting organic compound, and the second light-emitting layer includes a second light-emitting substance and an electron-transporting organic compound. In the light-emitting element, a difference in lowest unoccupied molecular orbital levels between the first light-emitting substance, the second light-emitting substance, and the electron-transporting organic compound is less than or equal to 0.2 eV. In addition, a difference in highest occupied molecular orbital levels between the hole-transporting organic compound, the first light-emitting substance, and the second light-emitting substance is less than or equal to 0.2 eV. Further, a difference in lowest unoccupied molecular orbital levels between the hole-transporting organic compound and the first light-emitting substance is greater than 0.3 eV.

Another embodiment of the present invention is a light-emitting element including a first electrode, a first light-emitting layer formed over the first electrode, a second light-emitting layer formed on the first light-emitting layer to be in contact with the first light-emitting layer, and a second electrode formed over the second light-emitting layer. The first light-emitting layer includes a first light-emitting substance and a hole-transporting organic compound, and the second light-emitting layer includes a second light-emitting substance and an electron-transporting organic compound. In the light-emitting element, the hole-transporting organic compound is a compound having an arylamine skeleton; the electron-transporting organic compound is a compound having a tricyclic, tetracyclic, pentacyclic, or hexacyclic aromatic hydrocarbon skeleton; and each of the first and second light-emitting substances is a compound having a tricyclic, tetracyclic, pentacyclic, or hexacyclic aromatic hydrocarbon skeleton and an arylamine skeleton.

Another embodiment of the present invention is a light-emitting element including a first electrode, a first light-emitting layer formed over the first electrode, a second light-emitting layer formed on the first light-emitting layer to be in contact with the first light-emitting layer, and a second electrode formed over the second light-emitting layer. The first light-emitting layer includes a first light-emitting substance and a hole-transporting organic compound, and the second light-emitting layer includes a second light-emitting substance and an electron-transporting organic compound. In the light-emitting element, the hole-transporting organic compound is a compound represented by the general formula (1) below; the electron-transporting organic compound is a compound having a tricyclic, tetracyclic, pentacyclic, or hexacyclic aromatic hydrocarbon skeleton; and each of the first and second light-emitting substances is a compound represented by the general formula (2) below.

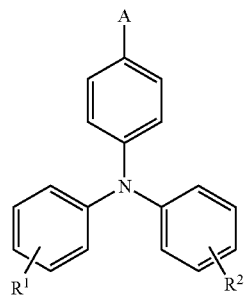

(1)

In the formula, A represents any one of a substituted or unsubstituted phenyl group and a substituted or unsubstituted naphthyl group. Each of $R^1$ and $R^2$ represents any one of hydrogen, an alkyl group having 1 to 4 carbon atoms, a substituted or unsubstituted phenyl group, a substituted or unsubstituted naphthyl group, and a substituted or unsubstituted carbazolyl group.

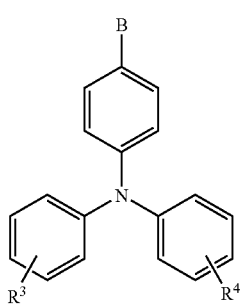

(2)

In the formula, B represents a tricyclic, tetracyclic, pentacyclic, or hexacyclic aromatic hydrocarbon skeleton and may have a substituent. Each of $R^3$ and $R^4$ represents any one of hydrogen, an alkyl group having 1 to 4 carbon atoms, a substituted or unsubstituted phenyl group, a substituted or unsubstituted naphthyl group, and a substituted or unsubstituted carbazolyl group.

Another embodiment of the present invention is a light-emitting element including a first electrode, a first light-emitting layer formed over the first electrode, a second light-emitting layer formed on the first light-emitting layer to be in contact with the first light-emitting layer, and a second electrode formed over the second light-emitting layer. The first light-emitting layer includes a first light-emitting substance and a hole-transporting organic compound, and the second light-emitting layer includes a second light-emitting substance and an electron-transporting organic compound. In the light-emitting element, the hole-transporting organic compound is a compound represented by the general formula (3) below, the electron-transporting organic compound is a compound having a tricyclic, tetracyclic, pentacyclic, or hexacyclic aromatic hydrocarbon skeleton, and each of the first and second light-emitting substances is a compound represented by the general formula (4) below.

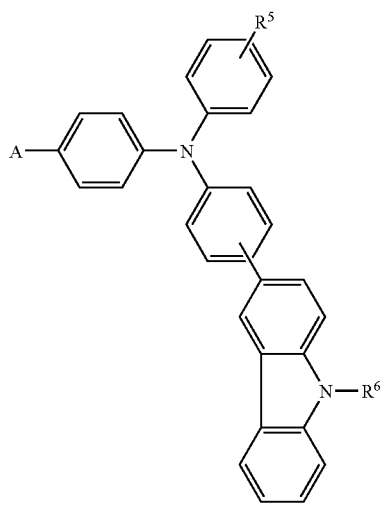

(3)

In the formula, A represents any one of a substituted or unsubstituted phenyl group and a substituted or unsubstituted naphthyl group. $R^5$ represents any one of hydrogen, an alkyl group having 1 to 4 carbon atoms, a substituted or unsubstituted phenyl group, and a substituted or unsubstituted naphthyl group. $R^6$ represents any one of an alkyl group having 1 to 4 carbon atoms, a substituted or unsubstituted phenyl group, and a substituted or unsubstituted naphthyl group.

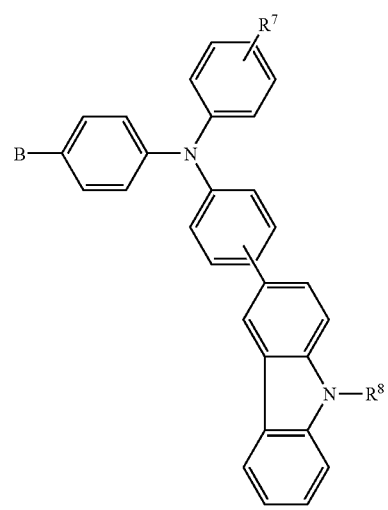

(4)

In the formula, B represents a tricyclic, tetracyclic, pentacyclic, or hexacyclic aromatic hydrocarbon skeleton and may have a substituent. $R^7$ represents any one of hydrogen, an alkyl group having 1 to 4 carbon atoms, a substituted or unsubstituted phenyl group, and a substituted or unsubstituted naphthyl group. $R^8$ represents any one of an alkyl group having 1 to 4 carbon atoms, a substituted or unsubstituted phenyl group, and a substituted or unsubstituted naphthyl group.

Another embodiment of the present invention is a light-emitting element with the above structure, in which a proportion of the first light-emitting substance in the first light-emitting layer is 30 wt % to 70 wt % inclusive.

Another embodiment of the present invention is a light-emitting element with the above structure, in which the first and second light-emitting layers emit light of the same color.

Another embodiment of the present invention is a light-emitting element with the above structure, in which a maximum peak of an emission spectrum of light from the first and second light-emitting layers is located in a wavelength of 430 nm to 470 nm inclusive.

Another embodiment of the present invention is a light-emitting device including the light-emitting element having any of the above structures, or an electronic device including the light-emitting device.

Embodiments of the present invention described above achieve at least one of the above objects.

Note that a light-emitting device in this specification includes an image display device and a lighting device using a light-emitting element. Further, the category of the light-emitting device includes a module in which a light-emitting element is provided with a connector such as an anisotropic conductive film, TAB (tape automated bonding) tape, or a TCP (tape carrier package); a module in which the top of the TAB tape or the TCP is provided with a printed wiring board;

and a module in which an IC (integrated circuit) is directly mounted on a light-emitting element by a COG (chip on glass) method.

Note that the ordinal numbers such as "first" and "second" in this specification are used for convenience and do not denote the order of steps and the stacking order of layers. In addition, the ordinal numbers in this specification do not denote particular names which specify the invention.

Further, in this specification, "an electron-transporting organic compound" means at least an organic compound having an electron-transporting property higher than a hole-transporting property, and "a hole-transporting organic compound" means at least an organic compound having a hole-transporting property higher than an electron-transporting property.

By implementing an embodiment of the present invention, a light-emitting element with long lifetime can be obtained.

DETAILED DESCRIPTION OF THE INVENTION

Hereinafter, embodiments of the present invention will be described with reference to the drawings. However, the present invention can be embodied in many different modes and it is easily understood by those skilled in the art that modes and details can be variously changed without departing from the spirit and the scope of the present invention. Therefore, the present invention should not be construed as being limited to the description of the embodiments. Note that in the description of "quantity", "amount", or "content" in this specification, the description is based on mass, if not otherwise specified. Further, the term "anode" in this specification means an electrode that injects holes to a layer containing a light-emitting material, and the term "cathode" means an electrode that injects electrons to the layer containing a light-emitting material.

Embodiment 1

Figure 1A:
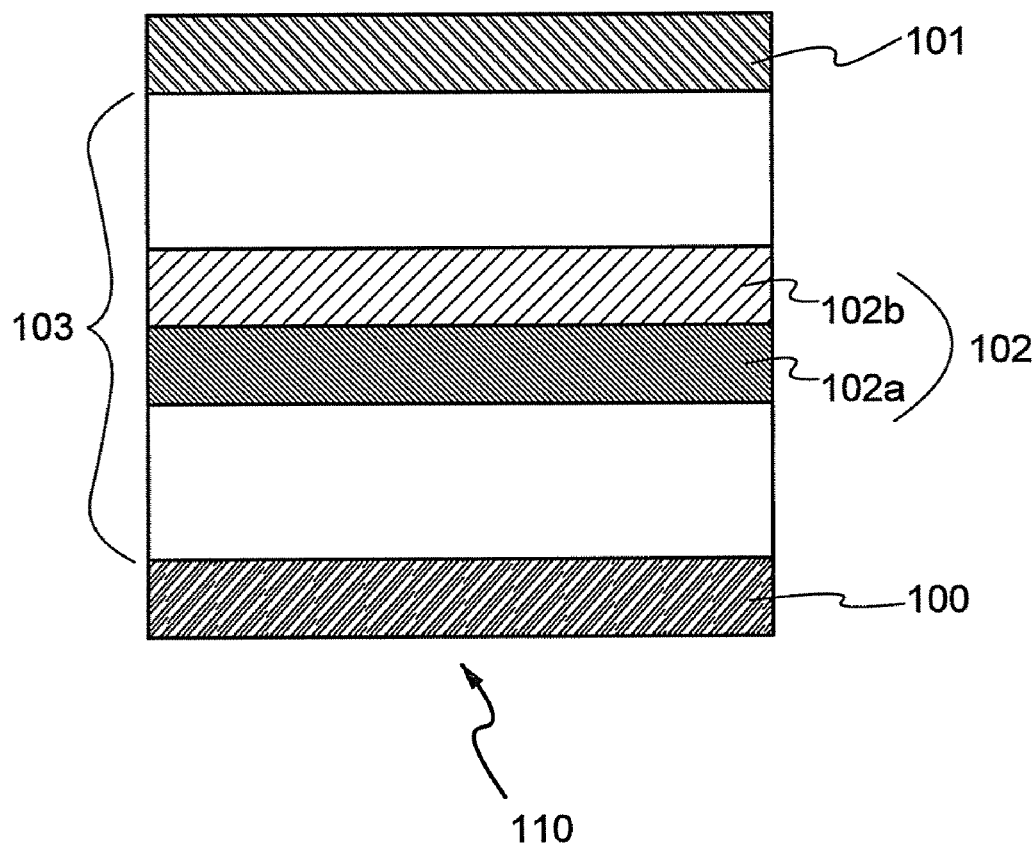
FIG. 1A illustrates an element structure and FIG. 1B is a band diagram of a light-emitting element.

FIG. 1A is an example of a conceptual view of a light-emitting element 110 of this embodiment. The light-emitting element 110 of this embodiment includes an EL layer 103 including a plurality of layers between an anode 100 and a cathode 101. The EL layer 103 includes at least a light-emitting layer 102, and the light-emitting layer 102 includes two layers, that is, a first light-emitting layer 102a and a second light-emitting layer 102b, stacked over the anode 100. Note that the two layers are formed in contact with each other.

The first light-emitting layer 102a contains a first light-emitting substance and a hole-transporting organic compound. The second light-emitting layer 102b contains a second light-emitting substance and an electron-transporting organic compound. When forward voltage is applied between the anode 100 and the cathode 101 in the light-emitting element 110, light is emitted from the first light-emitting substance in the first light-emitting layer 102a, and light is emitted from the second light-emitting substance in the second light-emitting layer 102b.

Figure 1B:
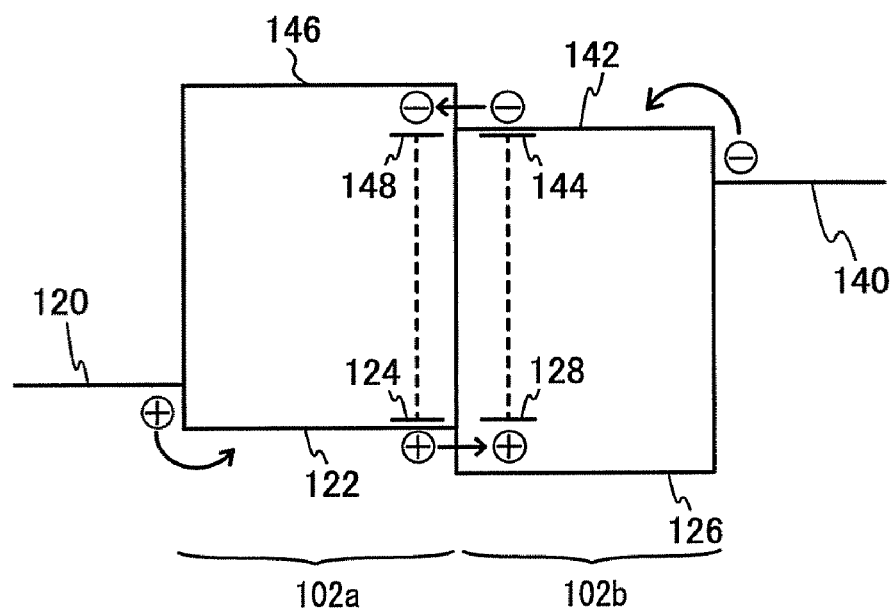

FIG. 1B is an example of a band diagram of the light-emitting element 110 described in this embodiment. In FIG. 1B, reference numeral 120 denotes the Fermi level of the anode 100, and reference numeral 140 denotes the Fermi level of the cathode 101. In addition, reference numeral 122 denotes the HOMO (highest occupied molecular orbital) level of the hole-transporting organic compound contained in the first light-emitting layer 102a; 146, the LUMO (lowest unoccupied molecular orbital) level of the hole-transporting organic compound; 124, the HOMO level of the first light-emitting substance contained in the first light-emitting layer 102a; and 148, the LUMO level of the first light-emitting substance. In addition, reference numeral 126 denotes the HOMO level of the electron-transporting organic compound contained in the second light-emitting layer 102b; 142, the LUMO level of the electron-transporting organic compound; 128, the HOMO level of the second light-emitting substance contained in the second light-emitting layer 102b; and 144, the LUMO level of the second light-emitting substance.

Holes injected from the anode 100 are injected to the first light-emitting layer 102a. Holes injected to the first light-emitting layer 102a are transported in the first light-emitting layer 102a, and some of the holes recombine with electrons injected from the second light-emitting layer 102b around the interface between the first light-emitting layer 102a and the second light-emitting layer 102b, and the other holes are injected to the second light-emitting layer 102b.

When the HOMO level 122 of the hole-transporting organic compound contained in the first light-emitting layer 102a, the HOMO level 124 of the first light-emitting substance contained in the first light-emitting layer 102a, and the HOMO level 128 of the second light-emitting substance contained in the second light-emitting layer 102b are at substantially the same level as shown in FIG. 1B, holes which are carriers can be easily transported between the hole-transporting organic compound, the first light-emitting substance, and the second light-emitting substance. Specifically, a difference in HOMO levels between the above substances is preferably less than or equal to 0.2 eV. Further, the electron-transporting organic compound contained in the second light-emitting layer 102b is a substance having an electron-transporting property higher than a hole-transporting property, and thus, the holes injected to the second light-emitting layer 102b are not easily transported. As a result, the probability of recombination of carriers in the second light-emitting layer 102b is increased, and thus, occurrence of a phenomenon in which holes travel toward the cathode without recombining with electrons can be suppressed.

On the other hand, electrons injected from the cathode 101 are injected to the second light-emitting layer 102b. The electrons injected to the second light-emitting layer 102b are transported in the second light-emitting layer 102b, and some of the electrons recombine with holes injected from the first light-emitting layer 102a around the interface between the first light-emitting layer 102a and the second light-emitting layer 102b, and the other electrons are injected to the first light-emitting layer 102a.

When the LUMO level 148 of the first light-emitting substance contained in the first light-emitting layer 102a, the LUMO level 144 of the second light-emitting substance contained in the second light-emitting layer 102b, and the LUMO level 142 of the electron-transporting organic compound contained in the second light-emitting layer 102b are at substantially the same level in the light-emitting element 110, electrons which are carriers can be easily transported between the first light-emitting substance, the second light-emitting substance, and the electron-transporting organic compound. Accordingly, accumulation of electrons at the interface between the first light-emitting layer 102a and the second light-emitting layer 102b can be suppressed, so that deterioration of the light-emitting element with the passage of time can be suppressed. Specifically, a difference in LUMO levels between the above substances is preferably less than or equal to 0.2 eV.

In order to prevent electrons from traveling toward the anode 100 from the first light-emitting layer 102a, as the hole-transporting organic compound, a substance whose LUMO level 146 is higher than the LUMO level 148 of the first light-emitting substance is used. That is, an electron-blocking substance is used. Therefore, a barrier against injection of electrons from the first light-emitting substance to the hole-transporting organic compound is elevated. Thus, electrons are not easily transported in the first light-emitting layer 102a, compared to the case of using a single layer of the first light-emitting substance. As a result, the probability of recombination of carriers in the first light-emitting layer 102a is increased, and thus, occurrence of a phenomenon in which electrons travel toward the anode without recombining with holes can be suppressed. Furthermore, occurrence of a phenomenon in which a recombination region in the first light-emitting layer 102a is unnecessarily enlarged and the emission spectrum becomes broad (chromaticity is lowered) can be suppressed. Specifically, the difference between the LUMO level 146 of the hole-transporting organic compound and the LUMO level 148 of the first light-emitting substance needs to be at least greater than 0.2 eV, preferably, greater than 0.3 eV.

As described above, while suppressing accumulation of electrons around the interface between the first light-emitting layer 102a and the second light-emitting layer 102b, the probability of recombination of electrons and holes around the interface described above can be increased.

As a measuring method of the highest occupied molecular orbital level (HOMO level) and the lowest unoccupied molecular orbital level (LUMO level), there is a calculation method using cyclic voltammetry (CV) measurement. In addition, the ionization potential of a thin film is measured with a photoelectron spectrometer and the HOMO level can be calculated. Further, the LUMO level can be calculated from the result of the above calculation and an energy gap obtained from an absorption spectrum of the thin film.

Next, the light-emitting element described above will be described more specifically in accordance with a manufacturing method thereof. Note that an element structure and a manufacturing method described here are just examples, and other known structures, materials, and manufacturing methods can be applied without departing from the purpose of this embodiment.

First, the anode 100 is formed over a base having an insulating surface. For the anode 100, a metal, an alloy, a conductive compound, a mixture thereof, or the like having a high work function (specifically, greater than or equal to 4.0 eV) is preferably used. Specifically, indium tin oxide (ITO), indium tin oxide containing silicon or silicon oxide, indium oxide containing zinc oxide (ZnO), indium oxide containing tungsten oxide and zinc oxide (IWZO), or the like is given. Such a conductive metal oxide film is usually formed by a sputtering method, but may also be formed by applying a sol-gel method or the like. For example, a film of indium oxide containing zinc oxide (ZnO) can be formed by a sputtering method using a target in which 1 wt % to 20 wt % zinc oxide is added to indium oxide. In addition, a film of indium oxide containing tungsten oxide and zinc oxide (IWZO) can be formed by a sputtering method using a target in which 0.5 wt % to 5 wt % tungsten oxide and 0.1 wt % to 1 wt % zinc oxide are contained in indium oxide. Moreover, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used.

Figure 2:
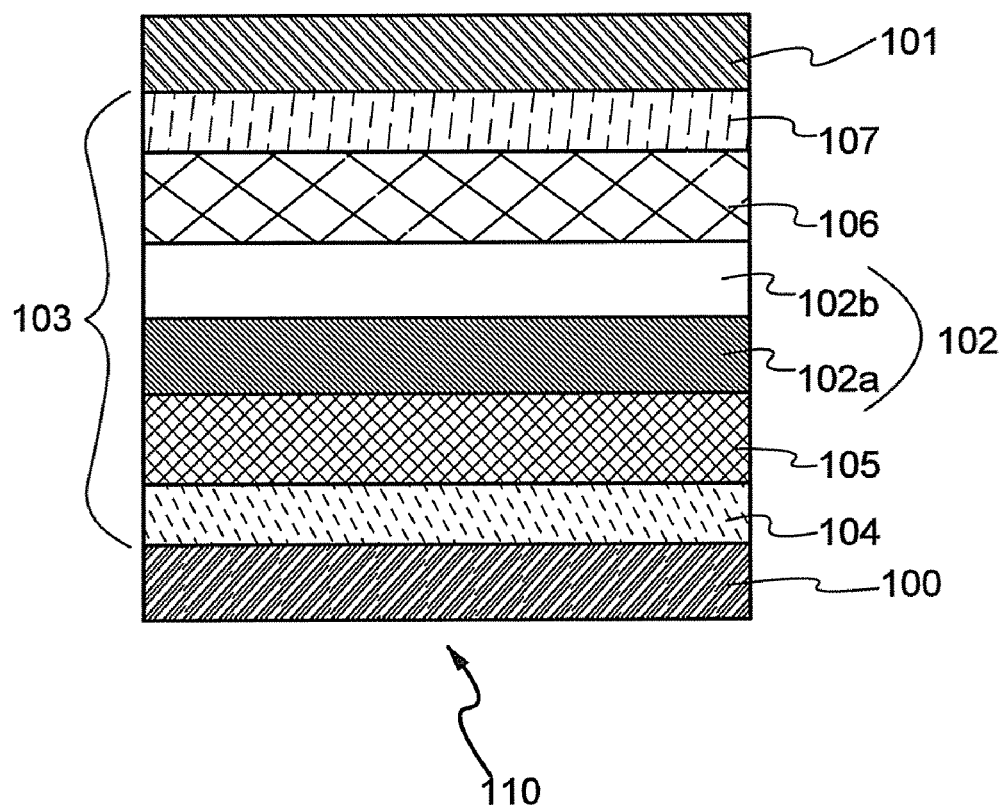
FIG. 2 illustrates an element structure of a light-emitting element.

Then, the EL layer 103 is formed. The EL layer 103 includes at least the light-emitting layer 102 which includes the first light-emitting layer 102a and the second light-emitting layer 102b, and may have a structure in which layers other than the light-emitting layer are also stacked. The EL layer 103 can be formed using either a low molecular material or a high molecular material. Note that a material for forming the EL layer 103 is not limited to a material containing only an organic compound material, but it may also partially contain an inorganic compound material. In addition, other than the light-emitting layer, functional layers with various functions such as a hole-injecting layer, a hole-transporting layer, a hole-blocking layer, an electron-transporting layer, an electron-injecting layer, and the like can be provided. The EL layer 103 may also be formed using a layer having two or more functions of the above layers. Of course, a layer other than the above functional layers may also be provided. In this embodiment, as illustrated in FIG. 2, a light-emitting element having a structure in which a hole-injecting layer 104, a hole-transporting layer 105, the light-emitting layer 102 (the first light-emitting layer 102a and the second light-emitting layer 102b), an electron-transporting layer 106, and an electron-injecting layer 107 are stacked sequentially as the EL layer 103 over the anode 100 is described as an example.

The hole-injecting layer 104 is a layer containing a substance having a high hole-injecting property. As the substance having a high hole-injecting property, for example, a metal oxide such as vanadium oxide, molybdenum oxide, ruthenium oxide, or aluminum oxide or the like can be given. Alternatively, a porphyrin-based compound is effective among organic compounds, and phthalocyanine ($H_2Pc$), copper phthalocyanine (CuPc), or the like can be used. Furthermore, for the hole-injecting layer 104, a high-molecular compound (an oligomer, a dendrimer, a polymer, or the like) can be used. For example, any of the following high molecular compounds can be used: poly(N-vinylcarbazole) (PVK); poly(4-vinyltriphenylamine) (PVTPA); poly[N-(4-{N'-[4-(4-diphenylamino)phenyl]phenyl-N'-phenylamino}phenyl) methacryla mide] (PTPDMA); and poly[N,N'-bis(4-butylphenyl)-N,N'-bis(phenyl)benzidine] (Poly-TPD). In addition, a high molecular compound to which acid such as poly(3,4-ethylenedioxythiophene)/poly(styrenesulfonic acid) (PEDOT/PSS) or polyaniline/poly(styrenesulfonic acid) (PAni/PSS) is added can be used. The hole-injecting layer is formed to be in contact with the anode. By providing the hole-injecting layer 104, a carrier injection barrier can be lowered and carriers are efficiently injected to the light-emitting element; as a result, driving voltage can be reduced.

In addition, for the hole-injecting layer 104, a material obtained by making a substance having a high hole-transporting property contain an acceptor substance (hereinafter, a composite material) can also be used. Note that, by using the composite material, the hole-injecting layer 104 can have an ohmic contact with the electrode and a material used to form the electrode can be selected regardless of its work function. In other words, besides a material with a high work function, a material with a work function that is not so high or a material with a low work function may also be used for the anode. As the acceptor substance, an organic compound or a transition metal oxide such as 7,7,8,8-tetracyano-2,3,5,6-tetrafluoroquinodimethane ($F_4$-TCNQ) or chloranil can be given. Moreover, an oxide of a metal belonging to any of Groups 4 to 8 in the periodic table can be used. Specifically, vanadium oxide, niobium oxide, tantalum oxide, chromium oxide, molybdenum oxide, tungsten oxide, manganese oxide, rhenium oxide, or the like is preferable because its electron-accepting property is high. In particular, molybdenum oxide is particularly preferable because of its stability in the air, a low hygroscopic property, and easiness in handling.

Note that, in this specification, "composition" means not only a simple mixture of two materials but also a mixture of a plurality of materials to obtain a condition where an electric charge can be given and received between the materials.

As the substance having a high hole-transporting property used for the composite material, various compounds such as an aromatic amine compound, a carbazole derivative, aromatic hydrocarbon, and a high molecular compound (such as an oligomer, a dendrimer, or a polymer) can be used. A substance having a hole mobility of greater than or equal to $10^{-6}$ cm$^2$/Vs is preferably used as a substance having a high hole-transporting property used for the composite material. However, other materials can also be used, as long as they have a hole-transporting property higher than an electron-transporting property. The organic compound which can be used for the composite material is specifically described below.

Examples of the aromatic amine compound which can be used for the composite material include 4,4'-bis[N-(1-naphthyl)-N-phenylamino]biphenyl (NPB or α-NPD), N,N'-bis(4-methylphenyl)-N,N'-diphenyl-p-phenylenediamine (DT-DPPA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenylamino) biphenyl (DNTPD), 1,3,5-tris[N-(4-diphenylaminophenyl)-N-phenylamino]benzene (DPA3B), and the like.

As the carbazole derivative which can be used for the composite material, the following can be specifically given: 3-[N-(9-phenylcarbazol-3-yl)-N-phenylamino]-9-phenyl-carbazole (PCzPCA1); 3,6-bis[N-(9-phenylcarbazol-3-yl)-N-phenylamino]-9-phenylcarbazole (PCzPCA2); 3-[N-(1-naphthyl)-N-(9-phenylcarbazol-3-yl)amino]-9-phenylcarbazole (PCzPCN1); 4,4'-di(N-carbazolyl)biphenyl (CBP); 1,3,5-tris[4-(N-carbazolyl)phenyl]benzene (TCPB); 9-[4-(10-phenyl-9-anthryl)phenyl]-9H-carbazole (CzPA); 1,4-bis[4-(N-carbazolyl)phenyl]-2,3,5,6-tetraphenylbenzene; and the like.

As the aromatic hydrocarbon which can be used for the composite material, the following can be given for example: 2-tert-butyl-9,10-di(2-naphthyl)anthracene (t-BuDNA); 2-tert-butyl-9,10-di(1-naphthyl)anthracene; 9,10-bis(3,5-diphenylphenyl)anthracene (DPPA); 2-tert-butyl-9,10-bis(4-phenylphenyl)anthracene (t-BuDBA); 9,10-di(2-naphthyl) anthracene (DNA); 9,10-diphenylanthracene (DPAnth); 2-tert-butylanthracene (t-BuAnth); 9,10-bis(4-methyl-1-naphthyl)anthracene (DMNA); 9,10-bis[2-(1-naphthyl)phenyl]-2-tent-butyl-anthracene; 9,10-bis[2-(1-naphthyl)phenyl]anthracene; 2,3,6,7-tetramethyl-9,10-di(1-naphthyl) anthracene; 2,3,6,7-tetramethyl-9,10-di(2-naphthyl) anthracene; 9,9'-bianthryl; 10,10'-diphenyl-9,9'-bianthryl; 10,10'-bis(2-phenylphenyl)-9,9'-bianthryl; 10,10'-bis[(2,3,4, 5,6-pentaphenyl)phenyl]-9,9'-bianthryl; anthracene; tetracene; rubrene; perylene; 2,5,8,11-tetra(tert-butyl)perylene; and the like. In addition to these, pentacene, coronene, and the like can also be used. The aromatic hydrocarbon having a hole mobility of greater than or equal to $1\times 10^{-6}$ cm$^2$/Vs and 14 to 42 carbon atoms is more preferably used.

The aromatic hydrocarbon which can be used for the composite material may have a vinyl skeleton. As the aromatic hydrocarbon having a vinyl group, for example, 4,4'-bis(2,2-diphenylvinyl)biphenyl (DPVBi); 9,10-bis[4-(2,2-diphenylvinyl)phenyl]anthracene (DPVPA); or the like is given.

Note that the hole-injecting layer can also be formed using a composite material of the above-described high molecular compound, such as PVK, PVTPA, PTPDMA, or Poly-TPD, and the above-described acceptor substance.

When the composite material as described above is used for the hole-injecting layer 104, any of various kinds of metals, alloys, electrically conductive compounds, a mixture thereof, or the like can be used for the anode 100, regardless of its work function. Therefore, for example, aluminum (Al), silver (Ag), an aluminum alloy (AlSi), or the like can be used as the anode, in addition to the above-described materials. Further, an element belonging to Group 1 or Group 2 in the periodic table, which is a low work function material, that is, an alkali metal such as lithium (Li) or cesium (Cs), an alkaline earth metal such as magnesium (Mg), calcium (Ca), or strontium (Sr), an alloy containing these metals (such as MgAg or AlLi), a rare earth metal such as europium (Eu) or ytterbium (Yb), an alloy containing such rare earth metals, or the like can be used. A film of an alkali metal, an alkaline earth metal, or an alloy containing these can be formed by a vacuum evaporation method. In addition, an alloy containing an alkali metal or an alkaline earth metal can be formed by a sputtering method. Further, silver paste or the like can be deposited by an ink-jet method or the like.

The hole-transporting layer 105 is a layer that contains a substance having a high hole-transporting property. For the substance having a high hole-transporting property, for example, an appropriate material such as N,N'-bis(spiro-9,9'-bifluoren-2-yl)-N,N'-diphenylbenzidine (BSPB); 4,4'-bis[N-(1-naphthyl)-N-phenylamino]biphenyl (NPB or α-NPD); 4,4'-bis[N-(3-methylphenyl)-N-phenylamino]biphenyl (TPD); 4,4',4"-tris(N,N-diphenylamino)triphenylamine (TDATA); 4,4',4"-tris[N-(3-methylphenyl)-N-phenylamino]triphenylamine (MTDATA); N,N'-bis[4-[bis(3-methylphenyl)amino]phenyl]-N,N'-diphenyl-[1,1'-biphenyl]-4,4'-diamine (DNTPD); 1,3,5-tris[N,N-di(m-tolyl)amino]benzene (m-MTDAB); 4,4',4"-tris(N-carbazolyl)triphenylamine (TCTA); phthalocyanine (H₂Pc); copper phthalocyanine (CuPc); or vanadyl phthalocyanine (VOPc) can be used. Note that the hole-transporting layer is preferably formed using a substance having a hole mobility of greater than or equal to $1 \times 10^{-6}$ cm²/Vs, but any substance can be used as long as the substance has a hole-transporting property higher than an electron-transporting property. In addition, the hole-transporting layer may be formed with not only a single layer but also a multilayer of two or more layers made of substances which satisfy the above conditions. The hole-transporting layer can be formed by a vacuum evaporation method or the like.

As the hole-transporting layer 105, the high-molecular compound such as PVK, PVTPA, PTPDMA, or Poly-TPD which is mentioned as the material of the hole-injecting layer 104 can also be used. In this case, a solution process such as an ink-jet method or a spin coating method can be used.

The light-emitting layer 102 is formed with a stack in which two layers, that is, the first light-emitting layer 102a and the second light-emitting layer 102b are stacked over the hole-transporting layer 105. The first light-emitting layer 102a contains the first light-emitting substance and the hole-transporting organic compound. The second light-emitting layer 102b contains the second light-emitting substance and the electron-transporting organic compound.

As the hole-transporting organic compound contained in the first light-emitting layer 102a, a compound having a hole-transporting property and an electron-blocking property needs to be used so that holes can be injected to the first light-emitting layer 102a and electrons can be prevented from traveling toward the anode. As such a hole-transporting organic compound, a compound having an arylamine skeleton can be preferably used.

In addition, when the hole-transporting organic compound has an arylamine skeleton and a tricyclic, tetracyclic, pentacyclic, or hexacyclic aromatic hydrocarbon skeleton, since the tricyclic, tetracyclic, pentacyclic, or hexacyclic aromatic hydrocarbon skeleton has a high electron-accepting property and an electron-transporting property, the organic compound keeps some degree of electron transporting capability even though it has a high hole-transporting property by having the arylamine skeleton. In the case of using such a hole-transporting organic compound for the first light-emitting layer, the influence of deterioration and reduction in efficiency due to electrons traveling toward the electrode may be accelerated, depending on the conditions. Therefore, for the hole-transporting organic compound, a compound which has an arylamine skeleton and does not have a tricyclic, tetracyclic, pentacyclic, or hexacyclic aromatic hydrocarbon skeleton, as represented by the following general formula (1), is more preferably used.

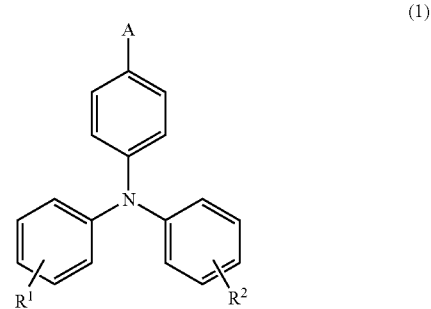

(1)

In the formula, A represents any one of a substituted or unsubstituted phenyl group and a substituted or unsubstituted naphthyl group. Each of $R^1$ and $R^2$ represents any one of hydrogen, an alkyl group having 1 to 4 carbon atoms, a substituted or unsubstituted phenyl group, a substituted or unsubstituted naphthyl group, and a substituted or unsubstituted carbazolyl group. As a substituent which can be bonded to A, $R^1$, or $R^2$, for example, an alkyl group such as a methyl group, an ethyl group, or a propyl group, or an aryl group having a bicyclic or monocyclic aromatic hydrocarbon skeleton such as a pheny group or a naphthyl group can be given.

Alternatively, because a compound represented by the following general formula (3) has a high hole-transporting property, chemical stability, and heat resistance, it can be preferably used as the hole-transporting organic compound.

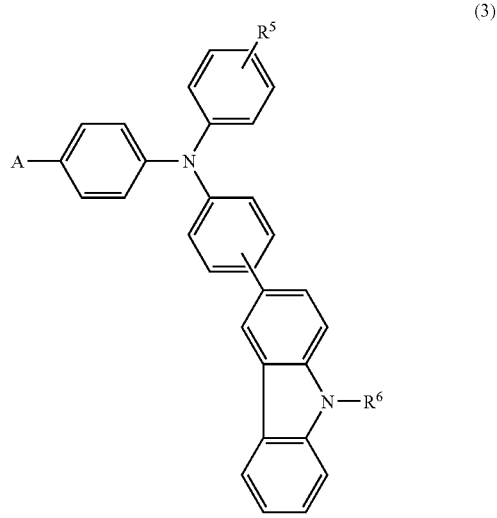

(3)

In the formula, A represents any one of a substituted or unsubstituted phenyl group and a substituted or unsubstituted naphthyl group. $R^5$ represents any one of hydrogen, an alkyl group having 1 to 4 carbon atoms, a substituted or unsubstituted phenyl group, and a substituted or unsubstituted naphthyl group. $R^6$ represents any one of an alkyl group having 1 to 4 carbon atoms, a substituted or unsubstituted phenyl group, and a substituted or unsubstituted naphthyl group. As a substituent which can be bonded to A, $R^5$, or $R^6$, for example, an alkyl group such as a methyl group, an ethyl group, or a propyl group, or a bicyclic or monocyclic aryl group such as a pheny group or a naphthyl group can be given.

For example, as the hole-transporting organic compound for the first light-emitting layer 102a, any of the following materials can be preferably used: 4-(1-naphthyl)-4'-(9-phenyl-9H-carbazol-3-yl)-triphenylamine (PCBANB), 4-phenyl-4'-(9-phenyl-9H-carbazol-3-yl)triphenylamine (PCBA1BP), 4,4'-diphenyl-4"-(9-phenyl-9H-carbazol-3-yl)triphenylamine (PCBBi1 BP), 4,4'-di(1-naphthyl)-4"-(9-phenyl-9H-carbazol-3-yl)-triphenylamine (PCBNBB), 4-(1-naphthyl)-4'-phenyl-4"-(9-phenyl-9H-carbazol-3-yl)triphenylamine (PCBBiNB), 4-[9-(biphenyl-4-yl)-9H-carbazol-3-yl]-4'-phenyl-triphenylamine (BCBA1BP), 4-[9-(biphenyl-4-yl)-9H-carabazol-3-yl]-4'-(1-naphthyl)triphenylamine (BCBANB), 4-[9-(biphenyl-4-yl)-9H-carbazol-3-yl]-4'-(1-naphthyl)-4"-phenyl-triphenylamine (BCBBiNB), 4-{9-[4-(1-naphthyl)phenyl]-9H-carbazol-3-yl}-4'-phenyl-triphenylamine (NBCBA1BP), 4-[9-(1-naphthyl)-9H-carbazol-3-yl]-4'-phenyl-triphenylamine (NCBA1BP), 4,4'-diphenyl-4"-(6,9-diphenyl-9H-carbazol-3-yl)triphenylamine (PCBBi1BPIII), 4-(1-naphthyl)-4'-phenyltriphenylamine (αNBA1BP), 4,4'-di-(1-naphthyl)-4"-phenyltriphenylamine (αNBB1BP), and the like.

The first light-emitting substance can be an emission center substance in the first light-emitting layer 102a. The second light-emitting substance can be an emission center substance in the second light-emitting layer 102b. Light emission from each of the light-emitting substances can be either fluorescence or phosphorescence.

As described using FIG. 1B, the first light-emitting substance and the second light-emitting substance are selected such that holes and electrons are easily transferred between the first light-emitting layer 102a and the second light-emitting layer 102b. In other words, as the first and second light-emitting substances, materials which satisfy the following conditions are used: the HOMO levels of the first and second light-emitting substances and the HOMO level of the hole-transporting organic compound are at substantially the same level, preferably have a difference of less than or equal to 0.2 eV, and the LUMO levels of the first and second light-emitting substances and the LUMO level of the electron-transporting organic compound are at substantially the same level, preferably have a difference of less than or equal to 0.2 eV. In addition, as the first light-emitting substance, a material whose LUMO level is lower than that of the hole-transporting organic compound, preferably lower than that by more than 0.3 eV, is used such that electrons injected from the second light-emitting layer 102b to the first light-emitting layer 102a do not travel toward the anode. As such first and second light-emitting substances, a compound having a tricyclic, tetracyclic, pentacyclic, or hexacyclic aromatic hydrocarbon skeleton and an arylamine skeleton can be preferably used.

By having an arylamine skeleton, each of the first and second light-emitting substances can be a compound having a HOMO level which is substantially the same as that of the hole-transporting organic compound having an arylamine skeleton. Further, each of the first and second light-emitting substances has a tricyclic, tetracyclic, pentacyclic, or hexacyclic aromatic hydrocarbon skeleton, whereby a difference in LUMO levels between the first and second light-emitting substances and the hole-transporting organic compound can be greater than 0.3 eV. Furthermore, when the first and second light-emitting substances and the electron-transporting organic compound have the same polycyclic aromatic hydrocarbon skeleton, their LUMO levels can be closer to each other. As the tricyclic, tetracyclic, pentacyclic, or hexacyclic aromatic hydrocarbon skeleton, specifically, an anthracene skeleton, a pyrene skeleton, a chrysene skeleton, a dibenzo[g,p]chrysene skeleton, or the like is given.

The arylamine skeleton of the first and second light-emitting substances is preferably the same skeleton as that of the hole-transporting organic compound. Therefore, each of the first and second light-emitting substances is preferably a compound represented by the following general formula (2).

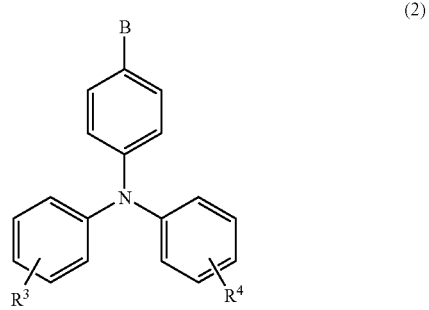

(2)

In the formula, B represents a tricyclic, tetracyclic, pentacyclic, or hexacyclic aromatic hydrocarbon skeleton and may have a substituent. Each of $R^3$ and $R^4$ represents any one of hydrogen, an alkyl group having 1 to 4 carbon atoms, a substituted or unsubstituted phenyl group, a substituted or unsubstituted naphthyl group, and a substituted or unsubstituted carbazolyl group. As a substituent which can be bonded to B, $R^3$, or $R^4$, for example, an alkyl group such as a methyl group, an ethyl group, or a propyl group, or an aryl group including a bicyclic or monocyclic aromatic hydrocarbon skeleton such as a pheny group or a naphthyl group can be given.

Since the first and second light-emitting substances have high emission efficiency, chemical stability, and heat resistance, a compound represented by the following general formula (4) can be preferably used.

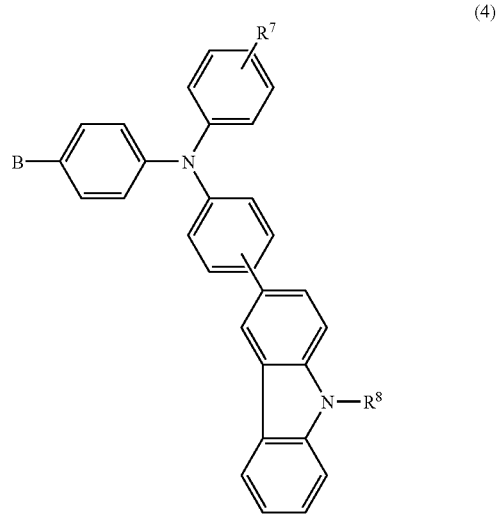

(4)

In the formula, B represents a tricyclic, tetracyclic, pentacyclic, or hexacyclic aromatic hydrocarbon skeleton and may have a substituent. $R^7$ represents any one of hydrogen, an alkyl group having 1 to 4 carbon atoms, a substituted or unsubstituted phenyl group, and a substituted or unsubstituted naphthyl group. $R^8$ represents any one of an alkyl group having 1 to 4 carbon atoms, a substituted or unsubstituted phenyl group, and a substituted or unsubstituted naphthyl group. As a substituent which can be bonded to B, $R^7$, or $R^8$, an alkyl group such as a methyl group, an ethyl group, or a propyl group, or a bicyclic or monocyclic aryl group such as a pheny group or a naphthyl group can be given.

As the first and second light-emitting substances, specifically, 4-(10-phenyl-9-anthryl)-4'-(9-phenyl-9H-carbazol-3-yl)triphenylamine (PCBAPA), 4-(1-naphthyl)-4'-(10-phenyl-9-anthryl)-4''-(9-phenyl-9H-carbazol-3-yl) triphenylamine (PCBNAPA), 4-(9,10-diphenyl-2-anthryl)-triphenylamine (2TPPA), or the like can be used. The first and second light-emitting substances are not necessarily the same substance. However, since the first and second light-emitting substances have substantially the same HOMO levels and LUMO levels, the first light-emitting layer 102a and the second light-emitting layer 102b emit light of the same color. Therefore, the structure of the light-emitting element according to this embodiment is suitable for a light-emitting element which emits light of a single color. In general, when a light-emitting substance emits light of blue, the light-emitting substance does not easily trap carriers and the carriers tend to travel through the light-emitting layer. However, in the light-emitting element of this embodiment, since the light-emitting element contains the hole-transporting organic compound having an electron-blocking property, travel of electrons toward the anode can be suppressed. Therefore, the light-emitting element of this embodiment is particularly effective as a light-emitting element which emits light of blue, that is, a light-emitting element whose emission spectrum of light from the first and second light-emitting layers has a maximum peak in a wavelength of 430 nm to 470 nm inclusive.

In addition, in the first light-emitting layer 102a, the first light-emitting substance preferably accounts for 30 wt % to 70 wt % inclusive. When the first light-emitting substance is contained at greater than or equal to 30 wt %, the first light-emitting layer 102a can easily receive electrons from the second light-emitting layer 102b. In addition, when the first light-emitting substance is contained at less than or equal to 70 wt % (that is, the hole-transporting organic compound is contained at greater than or equal to 30 wt %), travel of electrons toward the anode can be suppressed.

In addition, in the second light-emitting layer 102b, the electron-transporting organic compound is used as a host in which the second light-emitting substance serving as an emission center substance is dispersed. In the second light-emitting layer 102b, preferably, the electron-transporting organic compound is a main component and the second light-emitting substance is contained at greater than or equal to 0.001 wt % and less than 50 wt %. The electron-transporting organic compound is preferably a substance whose energy gap is larger than that of the second light-emitting substance. Further, the electron-transporting organic compound is a material having a LUMO level that is substantially the same as those of the first and second light-emitting substances. As such an electron-transporting organic compound, a compound having a tricyclic, tetracyclic, pentacyclic, or hexacyclic aromatic hydrocarbon skeleton can be used. As the compound having a tricyclic, tetracyclic, pentacyclic, or hexacyclic aromatic hydrocarbon skeleton, for example, an anthracene derivative, a pyrene derivative, a chrysene derivative, a dibenzo[g,p]chrysene derivative, or the like is given. Furthermore, when the first and second light-emitting substances and the electron-transporting organic compound have the same polycyclic aromatic hydrocarbon skeleton, their LUMO levels can be closer to each other.

As the electron-transporting organic compound, specifically, 9-[4-(10-phenyl-9-antryl)phenyl]-9H-carbazole (CzPA), 3,6-diphenyl-9-[4-(10-phenyl-9-antryl)phenyl]-9H-carbazole (DPCzPA), 9,10-bis(3,5-diphenylphenyl)anthracene (DPPA), 9,10-di(2-naphthyl)anthracene (DNA), 2-tert-butyl-9,10-di(2-naphthyl)anthracene (t-BuDNA), 9,9'-bianthryl (BANT), 3,3',3''-(benzene-1,3,5-triyl)tripyrene (TPB3), or the like can be used.

In the case of using the electron-transporting layer 106, it is provided between the light-emitting layer 102 and the electron-injecting layer 107. The electron-transporting layer 106 is a layer that contains a substance having a high electron-transporting property. As the substance having a high electron-transporting property, for example, a metal complex having a quinoline or benzoquinoline skeleton, such as tris (8-quinolinolato)aluminum (Alq), tris(4-methyl-8-quinolinolato)aluminum ($Almq_3$), bis(10-hydroxybenzo[h]-quinolinato)beryllium ($BeBq_2$), or bis(2-methyl-8-quinolinolato)-(4-hydroxy-biphenyl)-aluminum (BAlq), or the like can be used. Alternatively, a metal complex having an oxazole-based or thiazole-based ligand, such as bis[2-(2-hydroxyphenyl)-benzoxazolato]zinc ($Zn(BOX)_2$) or bis[2-(2-hydroxyphenyl)-benzothiazolato]zinc ($Zn(BTZ)_2$) or the like can be used. In addition to the metal complex, 2-(4-biphenylyl)-5-(4-tert-butylphenyl)-1,3,4-oxadiazole (PBD); 1,3-bis[5-(p-tert-butylphenyl)-1,3,4-oxadiazol-2-yl]benzene (OXD-7), bathophenanthroline (BPhen), bathocuproine (BCP), or the like can be used. A substance having an electron mobility of greater than or equal to $10^{-6}$ $cm^2/Vs$ is preferably used for the electron-transporting layer. However, any other substances may also be used as the electron-transporting layer as long as they have an electron-transporting property higher than a hole-transporting property. Furthermore, the electron-transporting layer may be formed with not only a single layer but also a multilayer of two or more layers made of substances which satisfy the above conditions. The electron-transporting layer can be formed by a vacuum evaporation method or the like.

For the electron-transporting layer, a high molecular compound can also be used. For example, poly[(9,9-dihexylfluorene-2,7-diyl)-co-(pyridine-3,5-diyl)](PF-Py), poly[(9,9-dioctylfluorene-2,7-diyl)-co-(2,2'-bipyridine-6,6'-diyl)] (PF-BPy), or the like can be used. In this case, a solution process such as an ink-jet method or spin coating can be used.

Note that for the electron-transporting layer 106 which is in contact with the second light-emitting layer 102b, a substance having an energy gap (or triplet energy) larger than that of the second light-emitting substance which is an emission center substance of the second light-emitting layer 102b is preferably used. With such a structure, energy transfer from the light-emitting layer 102 to the electron-transporting layer 106 can be suppressed, and high emission efficiency can be realized.

The electron-injecting layer 107 is a layer containing a substance having a high electron-injecting property. As the substance having a high electron-injecting property, an alkali metal compound, an alkaline earth metal compound, or the like such as calcium fluoride, lithium fluoride, lithium oxide, or lithium chloride can be preferably used. Alternatively, a layer in which an electron-transporting material such as tris (8-quinolinolato)aluminum (Alq) or bathocuproine (BCP) is combined with an alkali metal or an alkaline earth metal such as lithium or magnesium can also be used. The electron-injecting layer is formed to be in contact with the cathode. By providing the electron-injecting layer, a carrier injection barrier can be lowered and carriers are efficiently injected to the light-emitting element; as a result, driving voltage can be reduced. It is preferable to use the layer in which an electron-transporting substance is combined with an alkali metal or an alkaline earth metal as the electron-injecting layer, since electron injection from the cathode efficiently proceeds. The electron-injecting layer can be formed by a vacuum evaporation method or the like. By providing the electron-injecting layer 107, any of a variety of conductive materials such as Al, Ag, ITO, and indium oxide-tin oxide containing silicon or silicon oxide can be used as the cathode, regardless of its work function.

Note that the EL layer 103 can be formed by either a wet process or a dry process, such as an evaporation method, an ink-jet method, a spin coating method, or a dip coating method, as well as the above-described method.

After that, the cathode 101 is formed, so that the light-emitting element 110 is completed. As the cathode 101, a metal, an alloy, a conductive compound, a mixture thereof, or the like having a low work function (specifically, less than or equal to 3.8 eV) is preferably used. Specifically, a metal belonging to Group 1 or 2 of the periodic table, that is, an alkali metal such as lithium (Li) or cesium (Cs); an alkaline earth metal such as magnesium (Mg), calcium (Ca), or strontium (Sr); or an alloy containing these metals (MgAg, AlLi, or the like) can be given. Alternatively, a rare-earth metal such as europium (Eu) or ytterbium (Yb), an alloy containing these metals, or the like can be given. A film of an alkali metal, an alkaline earth metal, or an alloy containing these metals can be formed by a vacuum evaporation method. In addition, an alloy containing an alkali metal or an alkaline earth metal can also be formed by a sputtering method. Further, silver paste or the like can be deposited by an ink-jet method or the like. Moreover, by providing the electron-injecting layer 107 between the cathode 101 and the electron-transporting layer 106, any of a variety of conductive materials such as Al, Ag, ITO, and indium oxide-tin oxide containing silicon or silicon oxide can be used for the cathode, regardless of its work function.

Note that a conductive composition containing a conductive high molecule (also referred to as a conductive polymer) can also be used for the anode 100 or the cathode 101. When a thin film of the conductive composition is formed as the anode 100 or the cathode 101, the thin film preferably has a sheet resistance of less than or equal to 10000 Ω/square and a light transmissivity of greater than or equal to 70% at a wavelength of 550 nm. In addition, the resistivity of the conductive high molecule which is contained in the conductive composition is preferably less than or equal to 0.1 Ω·cm.

As the conductive high molecule, a so-called π-electron conjugated conductive high molecule can be used. For example, polyaniline and/or a derivative thereof, polypyrrole and/or a derivative thereof, polythiophene and/or a derivative thereof, and a copolymer of two or more kinds of those materials can be given.

Specific examples of the conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

Any of the above-described conductive high molecules can be used alone for the anode 100 or the cathode 101, or an organic resin is added to such a conductive high molecule in order to adjust film characteristics, so that it can be used as a conductive composition.

As for the organic resin, a thermosetting resin, a thermoplastic resin, or a photocurable resin may be used as long as the resin is compatible to a conductive high molecule or the resin can be mixed and dispersed into a conductive high molecule. For example, a polyester-based resin such as poly(ethylene terephthalate), poly(butylene terephthalate), or poly(ethylene naphthalate); a polyimide-based resin such as polyimide or polyamide imide; a polyamide resin such as polyamide 6, polyamide 6,6, polyamide 12, or polyamide 11; a fluorine resin such as poly(vinylidene fluoride), poly(vinyl fluoride), polytetrafluoroethylene, ethylene-tetrafluoroethylene copolymer, or polychlorotrifluoroethylene; a vinyl resin such as poly(vinyl alcohol), poly(vinyl ether), poly(vinyl butyral), poly(vinyl acetate), or polyvinylchloride; an epoxy resin; a xylene resin; an aramid resin; a polyurethane-based resin; a polyurea-based resin, a melamine resin; a phenol-based resin; polyether; an acrylic-based resin, and a copolymer of any of those resins can be given.

Furthermore, in order to adjust the electric conductivity of the conductive high molecule or the conductive composition, the conductive high molecule or the conductive composition may be doped with an acceptor dopant or a donor dopant to change the oxidation-reduction potential of conjugated electrons of a conjugated conductive high molecule.

As the acceptor dopant, a halogen compound, an organic cyano compound, an organic metal compound, or the like can be used. As examples of the halogen compound, chlorine, bromine, iodine, iodine chloride, iodine bromide, iodine fluoride, and the like can be given. As the organic cyano compound, a compound in which two or more cyano groups are included in a conjugated bond can be used. In addition, phosphorus pentafluoride, arsenic pentafluoride, antimony pentafluoride, boron trifluoride, boron trichloride, boron tribromide, or the like; inorganic acid such as hydrochloric acid, sulfuric acid, nitric acid, phosphoric acid, fluoroboric acid, hydrofluoric acid, or perchloric acid; or organic acid such as organic carboxylic acid or organic sulfonic acid can also be used. As the organic carboxylic acid and the organic sulfonic acid, the above-described carboxylic acid compounds or sulfonic acid compounds can be used. For example, tetracyanoethylene, tetracyanoethylene oxide, tetracyanobenzene, tetracyanoquinodimethane, tetracyanoazanaphthalene, and the like can be given.

As the donor dopant, an alkali metal, an alkaline-earth metal, or the like can be used.

Further, a thin film to be the anode 100 or the cathode 101 can be formed by a wet process using a solution in which the conductive high molecule or the conductive composition is dissolved in water or an organic solvent (e.g., an alcohol-based solvent, a ketone-based solvent, an ester-based solvent, a hydrocarbon-based solvent, or an aromatic solvent).

There is no particular limitation on the solvent in which the conductive high molecule or the conductive composition is dissolved, as long as the above-described conductive high molecule and the high molecular resin compound such as the organic resin are dissolved. For example, the conductive high molecule or the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methylethylketone, methylisobutylketone, toluene, and/or the like.

After the conductive composition is dissolved in the solvent as described above, a film thereof can be formed by a wet process, such as an application method, a coating method, a droplet discharge method (also referred to as an ink-jet method), or a printing method. The solvent may dried with heat treatment or may be dried under low pressure. In the case where the organic resin is a thermosetting resin, heat treatment may be further performed. In the case where the organic resin is a photocurable resin, light irradiation treatment may be performed.

Note that by varying the materials of the anode 100 and the cathode 101, the light-emitting element of this embodiment can have a variety of structures. For example, with the anode 100 having a light-transmitting property, light is emitted through the anode 100, whereas with the anode 100 having a light-blocking property (reflectivity, in particular) and the cathode 101 having a light-transmitting property, light is emitted through the cathode 101. Furthermore, with both the anode 100 and the cathode 101 having a light-transmitting property, light can be emitted through both the anode and the cathode.

The light-emitting element according this embodiment as described above can achieve long lifetime.

Embodiment 2

In this embodiment, as examples of a light-emitting device which is manufactured with the use of the light-emitting element described in Embodiment 1, a passive matrix light-emitting device and an active matrix light-emitting device will be described.

FIGS. 3A to 3D and FIG. 4 illustrate an example of a passive matrix light-emitting device.

In a passive-matrix (also referred to as "simple-matrix") light-emitting device, a plurality of anodes arranged in stripes (in stripe form) are provided to be orthogonal to a plurality of cathodes arranged in stripes, and a light-emitting layer is interposed at each intersection. Therefore, a pixel at an intersection of an anode selected (to which voltage is applied) and a cathode selected emits light.

Figure 3A:
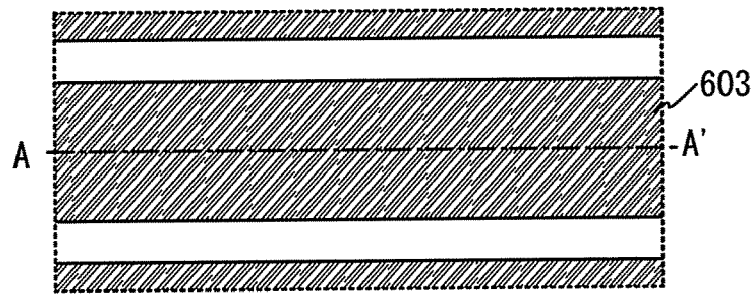
FIGS. 3A to 3D illustrate a passive matrix light-emitting device.
Figure 3B:
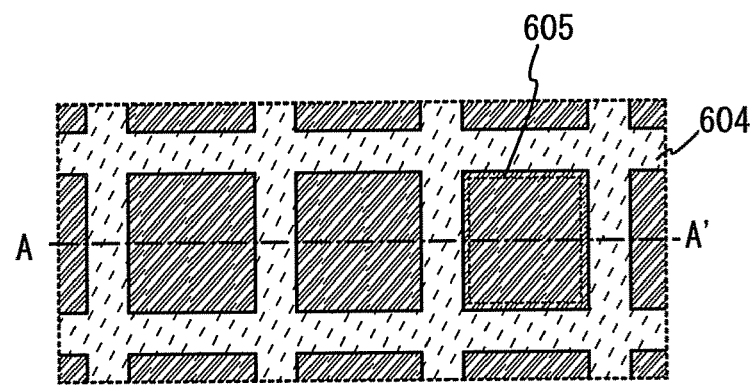
Figure 3C:
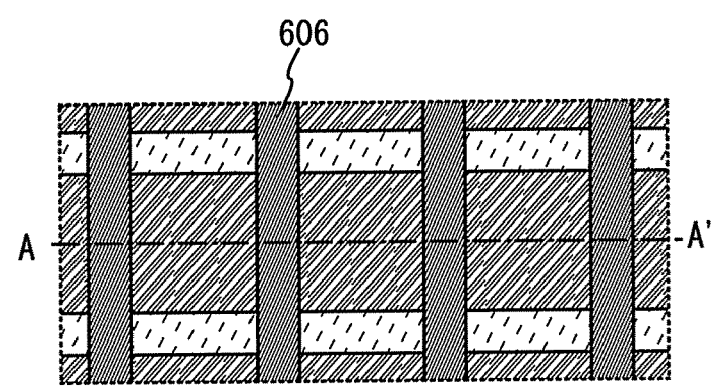
Figure 3D:
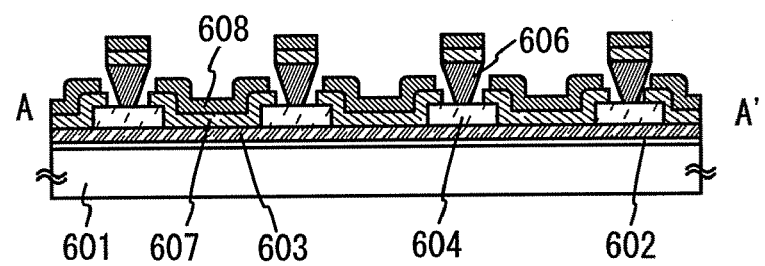

FIGS. 3A to 3C are top views of a pixel portion before sealing, and FIG. 3D is a cross-sectional view taken along chain line A-A' in FIGS. 3A to 3C.

Over a substrate 601, an insulating layer 602 is formed as a base insulating layer. Note that the insulating layer 602 is not necessarily formed if the base insulating layer is not needed. Over the insulating layer 602, a plurality of first electrodes 603 are arranged in stripes with equal spacing therebetween (FIG. 3A). Note that the first electrode 603 corresponds to the anode 100 in Embodiment 1.

A partition wall 604 having openings each corresponding to a pixel is provided over the first electrodes 603. The partition wall 604 having openings is formed using an insulating material (a photosensitive or nonphotosensitive organic material (polyimide, acrylic, polyamide, polyimide amide, resist, or benzocyclobutene) or an SOG film (such as a silicon oxide film containing an alkyl group)). Note that an opening 605 corresponding to each pixel acts as a light-emitting region (FIG. 3B).

Over the partition wall 604 that has openings, a plurality of mutually parallel inversely tapered partition walls 606 are provided to intersect with the first electrodes 603 (FIG. 3C). The inversely tapered partition walls 606 are formed by a photolithography method using a positive-type photosensitive resin by which a portion unexposed to light remains as a pattern, and the amount of light exposure or the length of development time is adjusted so that a lower portion of the pattern is etched more.

After the inversely tapered partition walls 606 are formed as illustrated in FIG. 3C, EL layers 607 and second electrodes 608 are sequentially formed as illustrated in FIG. 3D. The EL layer 607 in this embodiment corresponds to the EL layer 103 in Embodiment 1 and includes at least a light-emitting layer. In the light-emitting layer, two layers, that is, a first light-emitting layer and a second light-emitting layer in contact with the first light-emitting layer are stacked over the anode. In this embodiment, the second electrode 608 corresponds to the cathode 101 in Embodiment 1. The height obtained by adding the height of the partition wall 604 having openings and the height of the inversely tapered partition wall 606 is larger than the sum of the thicknesses of the EL layer 607 and the second electrode 608. Therefore, as illustrated in FIG. 3D, the EL layers 607 and the second electrodes 608 which are separated into a plurality of regions are formed. Note that the plurality of separated regions are electrically isolated from one another.

The second electrodes 608 are electrodes in stripes which are parallel to each other and extend in a direction intersecting with the first electrodes 603. Note that a part of the EL layers 607 and a part of conductive layers forming the second electrodes 608 are formed over the inversely tapered partition walls 606; however, they are separated from the EL layers 607 and the second electrodes 608.

In addition, a sealing member such as a sealing can or a glass substrate may be attached to the substrate 601 with adhesive such as a sealant so that the light-emitting element can be placed in a sealed space, if necessary. In this manner, the light-emitting element can be prevented from deteriorating. The sealed space may be filled with filler or a dry inert gas. In addition, a desiccant or the like may be put between the substrate and the sealing member so that deterioration of the light-emitting element due to moisture or the like can be prevented. The desiccant removes a minute amount of moisture, thereby achieving sufficient desiccation. The desiccant can be a substance which absorbs moisture by chemical adsorption such as an oxide of an alkaline earth metal typified by calcium oxide or barium oxide. Note that a substance which adsorbs moisture by physical adsorption such as zeolite or silica gel may be used as well.

Figure 4:
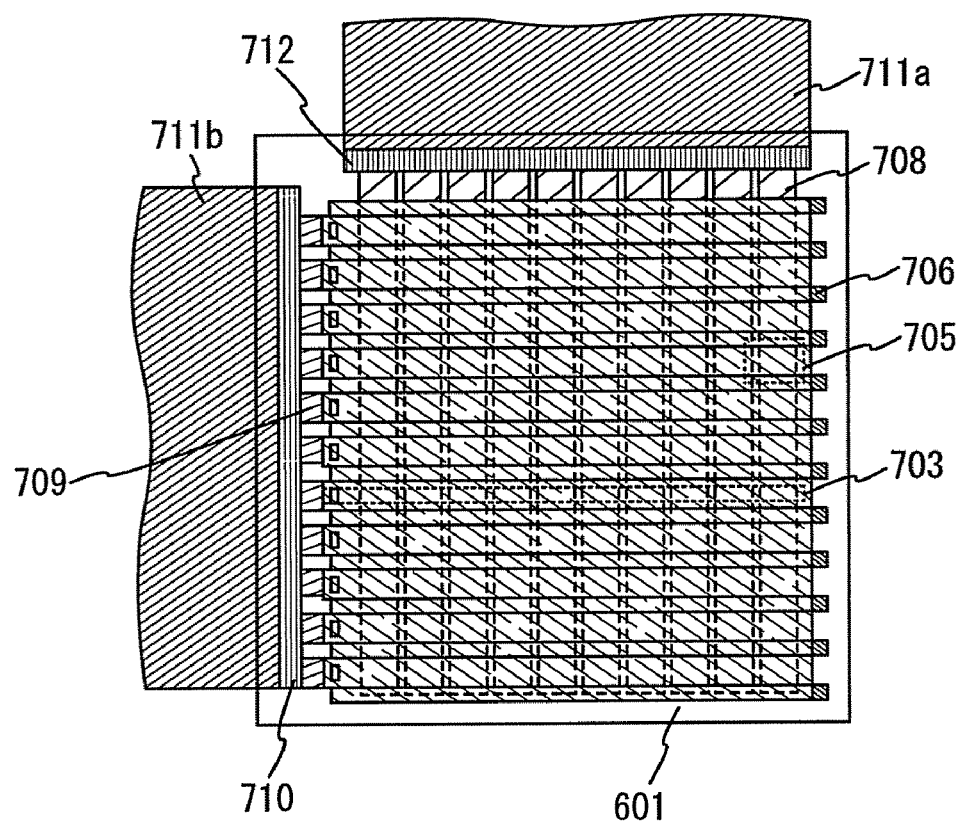
FIG. 4 illustrates a passive matrix light-emitting device.

FIG. 4 is a top view of the case where the passive-matrix light-emitting device illustrated in FIGS. 3A to 3D is provided with an FPC or the like.

As illustrated in FIG. 4, in a pixel portion forming an image display, scanning lines and data lines intersect with each other so that they are orthogonal to each other.

The first electrodes 603 in FIGS. 3A to 3D correspond to scan lines 703 in FIG. 4; the second electrodes 608 in FIGS. 3A to 3D correspond to data lines 708 in FIG. 4; and the inversely tapered partition walls 606 correspond to partition walls 706. The EL layers 607 illustrated in FIG. 3D are interposed between the data lines 708 and the scanning lines 703, and an intersection indicated by a region 705 corresponds to one pixel.

Note that the scanning lines 703 are electrically connected at their ends to connection wirings 709, and the connection wirings 709 are connected to an FPC 711 via an input terminal 710. The data lines 708 are connected to an FPC 711a via an input terminal 712.

If necessary, a polarizing plate, a circularly polarizing plate (including an elliptically polarizing plate), a retardation plate (a quarter-wave plate or a half-wave plate), or an optical film such as a color filter may be appropriately provided over a light-emitting surface. Further, the polarizing plate or the circularly polarizing plate may be provided with an anti-reflection film. For example, anti-glare treatment may be carried out by which reflected light can be diffused by projections and depressions on the surface so as to reduce the reflection.

Although FIG. 4 illustrates the example in which a driver circuit is not provided over the substrate, an IC chip including a driver circuit may be mounted on the substrate.

When the IC chip is mounted, a data line side IC and a scanning line side IC, in each of which the driver circuit for transmitting a signal to a pixel portion is formed, are mounted on the periphery of (outside) the pixel portion by a COG method. The mounting may be performed using TCP or a wire bonding method other than the COG method. TCP is TAB tape mounted with an IC, and the TAB tape is connected to a wiring over an element formation substrate and the IC is mounted. Each of the data line side IC and the scanning line side IC may be formed using a silicon substrate or may be formed by formation of a driver circuit using a TFT over a glass substrate, a quartz substrate, or a plastic substrate.

Figure 5A:
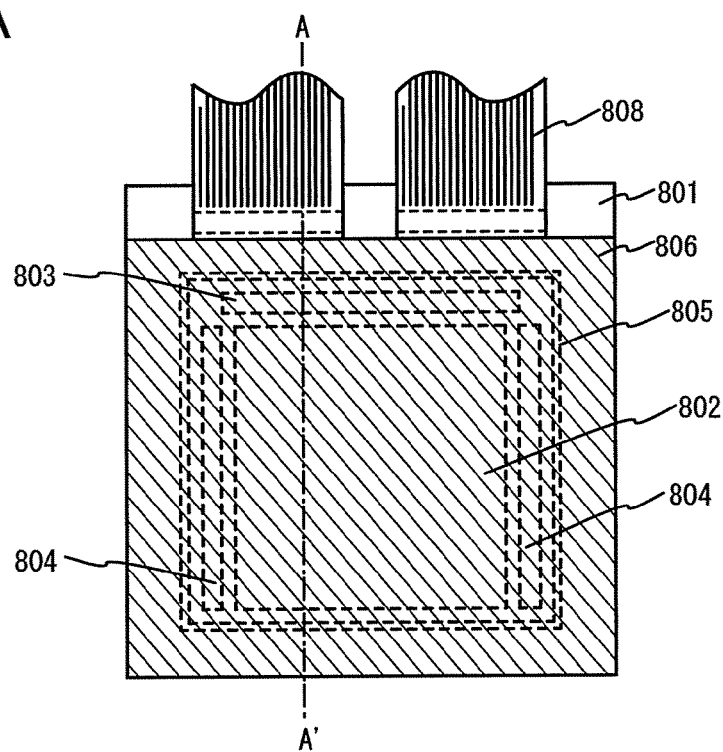
FIGS. 5A and 5B illustrate an active matrix light-emitting device.
Figure 5B:
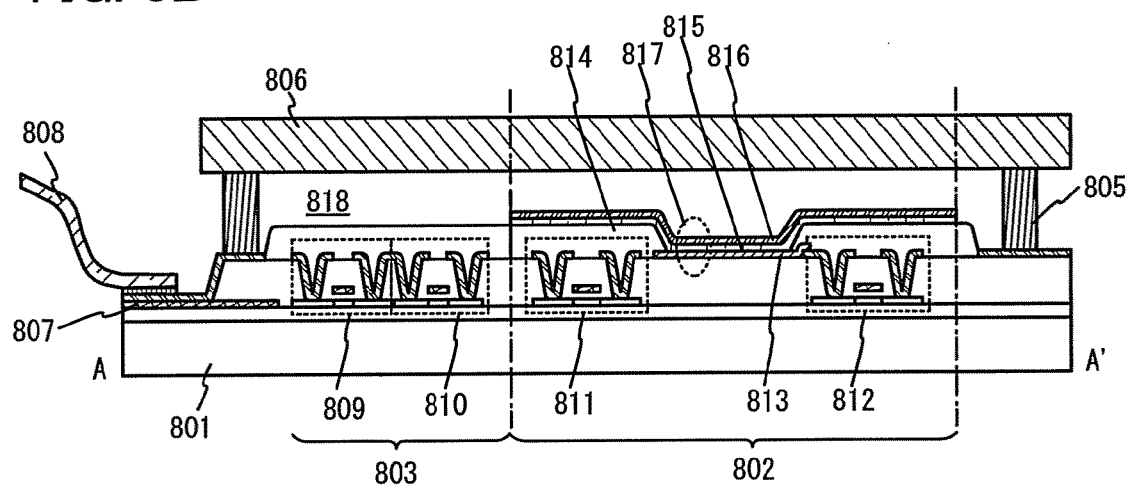

Next, an example of an active-matrix light-emitting device is described with reference to FIGS. 5A and 5B. Note that FIG. 5A is a top view illustrating a light-emitting device and FIG. 5B is a cross-sectional view taken along chain line A-A' in FIG. 5A. The active-matrix light-emitting device of this embodiment includes, over an element substrate 801, a pixel portion 802, a driver circuit portion (a source side driver circuit) 803, and a driver circuit portion (a gate side driver circuit) 804. The pixel portion 802, the driver circuit portion 803, and the driver circuit portion 804 are sealed with a sealant 805 between the element substrate 801 and a sealing substrate 806.

In addition, over the element substrate 801, a lead wiring 807 for connecting an external input terminal, through which a signal (e.g., a video signal, a clock signal, a start signal, a reset signal, or the like) or electric potential from the outside is transmitted to the driver circuit portion 803 and the driver circuit portion 804, is provided. Here, an example is described in which a flexible printed circuit (FPC) 808 is provided as the external input terminal. Although only the FPC is illustrated here, this FPC may have a printed wiring board (PWB) attached. The light-emitting device in this specification includes not only a light-emitting device itself but also a state in which an FPC or a PWB is attached thereto.

Next, a cross-sectional structure will be described with reference to FIG. 5B. Although the driver circuit portions and the pixel portion are formed over the element substrate 801, in FIG. 5B, the pixel portion 802 and the driver circuit portion 803 which is the source side driver circuit are illustrated.

An example is illustrated in which a CMOS circuit which is a combination of an n-channel TFT 809 and a p-channel TFT 810 is formed as the driver circuit portion 803. Note that a circuit included in the driver circuit portion may be formed using various CMOS circuits, PMOS circuits, or NMOS circuits. Although a driver integrated type in which the driver circuit is formed over the substrate is described in this embodiment, the driver circuit is not necessarily formed over the substrate, and the driver circuit can be formed outside, not over the substrate.

Further, the pixel portion 802 has a plurality of pixels, each including a switching TFT 811, a current control TFT 812, and an anode 813 electrically connected to a wiring (a source electrode or a drain electrode) of the current control TFT 812. An insulator 814 is formed so as to cover an edge portion of the anode 813. In this embodiment, the insulator 814 is formed using a positive photosensitive acrylic resin.

In addition, in order to obtain favorable coverage by a film which is to be stacked over the insulator 814, the insulator 814 is preferably formed so as to have a curved surface with curvature at an upper edge portion or a lower edge portion. For example, in the case of using a positive photosensitive acrylic resin as a material for the insulator 814, the insulator 814 is preferably formed so as to have a curved surface with a curvature radius (0.2 µm to 3 µm) at the upper edge portion. Either a negative photosensitive material which becomes insoluble in an etchant by light or a positive photosensitive material which becomes soluble in an etchant by light can be used for the insulator 814. As the insulator 814, without limitation to an organic compound, an inorganic compound such as silicon oxide or silicon oxynitride can be used.

An EL layer 815 and a cathode 816 are stacked over the anode 813. Note that when an ITO film is used as the anode 813, and a stacked film of a titanium nitride film and a film containing aluminum as its main component or a stacked film of a titanium nitride film, a film containing aluminum as its main component, and a titanium nitride film is used as a wiring of the current control TFT 812 which is connected to the anode 813, resistance of the wiring can be low and favorable ohmic contact with the ITO film can be obtained. Note that, although not illustrated, the cathode 816 is electrically connected to the FPC 808 which is an external input terminal.

The light-emitting element includes the anode 813, the EL layer 815, and the cathode 816 as described above. The specific structures and materials of the light-emitting element have been described in Embodiment 1, so that the repeated description is omitted. Note that the anode 813, the EL layer 815, and the cathode 816 in FIGS. 5A and 5B correspond to the anode 100, the EL layer 103, and the cathode 101 in Embodiment 1, respectively.

In addition, although the cross-sectional view of FIG. 5B illustrates only one light-emitting element 817, a plurality of light-emitting elements are arranged in matrix in the pixel portion 802. Light-emitting elements that emit light of three kinds of colors (R, G, and B) are formed in the pixel portion 802, whereby a light-emitting device capable of full color display can be obtained. Alternatively, a light-emitting device which is capable of full color display may be manufactured by a combination with color filters.

By attachment of the sealing substrate 806 to the element substrate 801 with the sealant 805, a structure in which the light-emitting element 817 is provided in a space 818 surrounded by the element substrate 801, the sealing substrate 806, and the sealant 805 is obtained. Note that the space 818 may be filled with an inert gas (such as nitrogen and argon) or the sealant 805.

It is preferable to use an epoxy-based resin for the sealant 805. In addition, preferably, the material does not transmit moisture or oxygen as much as possible. As the sealing substrate 806, a plastic substrate formed of FRP (fiberglass-reinforced plastics), PVF (polyvinyl fluoride), polyester, acrylic, or the like can be used besides a glass substrate or a quartz substrate.

As described above, an active-matrix light-emitting device can be obtained.

Note that the structure described in this embodiment can be combined with any of the structures described in other embodiments as appropriate.

Embodiment 3

In this embodiment, various electronic devices and lighting devices, each of which is completed using the light-emitting device described in Embodiment 2, will be described with reference to FIGS. 6A to 6E.

As the electronic devices described in this embodiment, for example, there are a television set (also called TV or a television receiver), a monitor for a computer or the like, a camera such as a digital camera or a digital video camera, a digital photo frame, a mobile phone set (also called a mobile phone or a portable telephone device), a portable game machine, a portable information terminal, an audio playback device, a large game machine such as a pachinko machine, and the like. Specific examples of these electronic devices and lighting devices are illustrated in FIGS. 6A to 6E.

Figure 6A:
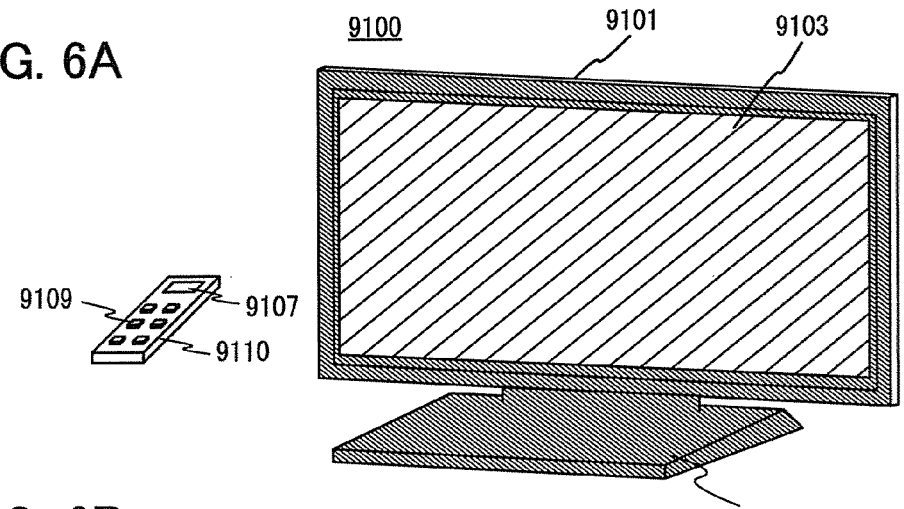
FIGS. 6A to 6E each illustrate an electronic device.

FIG. 6A illustrates an example of a television set 9100. A display portion 9103 is incorporated in a housing 9101 of the television set 9100. Images can be displayed in the display portion 9103, for which the light-emitting device described in Embodiment 2 can be used. Further, the housing 9101 is supported by a stand 9105 here.

The television set 9100 can be operated by an operation switch of the housing 9101 or a separate remote controller 9110. The channel and volume can be controlled with operation keys 9109 of the remote controller 9110 and the images displayed in the display portion 9103 can be controlled. Furthermore, the remote controller 9110 may be provided with a display portion 9107 for displaying data output from the remote controller 9110.

Note that the television set 9100 is provided with a receiver, a modem, and the like. With the receiver, a general television broadcast can be received. Furthermore, when the television set 9100 is connected to a communication network by wired or wireless connection via the modem, one-way (from a transmitter to a receiver) or two-way (between a transmitter and a receiver, between receivers, or the like) data communication can be performed.

Since the light-emitting device formed in accordance with the above embodiments has long lifetime, a television set with long lifetime can be provided by using the light-emitting device for the display portion 9103. Further, since the light-emitting device exhibits high chromaticity, by using the light-emitting device for the display portion 9103 of the television set, an image with improved quality can be displayed.

Figure 6B:
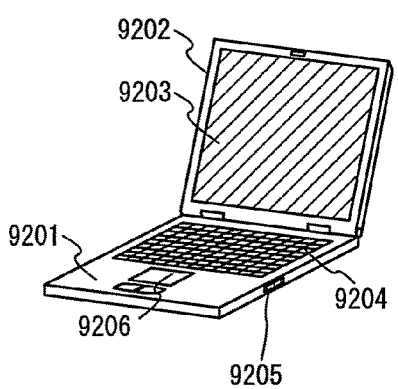

FIG. 6B is a computer including a main body 9201, a housing 9202, a display portion 9203, a keyboard 9204, an external connection port 9205, a pointing device 9206, and the like. Note that the computer is manufactured using the light-emitting device which is formed in accordance with the above embodiments for the display portion 9203.

Since the light-emitting device formed in accordance with the above embodiments has long lifetime, a computer with long lifetime can be provided by using the light-emitting device for the display portion 9203 of the computer. Further, since the light-emitting device exhibits high chromaticity, by using the light-emitting device for the display portion 9203 of the computer, an image with improved quality can be displayed.

Figure 6C:
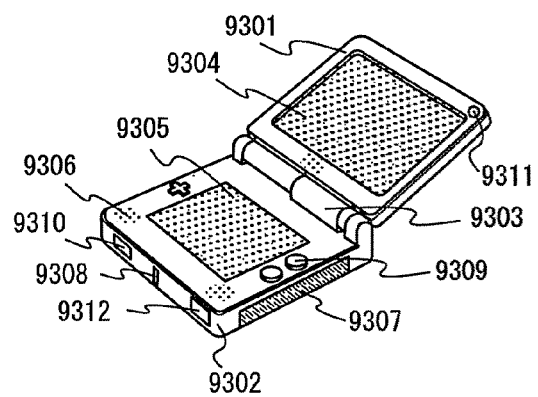

FIG. 6C illustrates a portable amusement machine including two housings: a housing 9301 and a housing 9302. The housings 9301 and 9302 are connected with a connection portion 9303 so as to be opened and closed. A display portion 9304 is incorporated in the housing 9301 and a display portion 9305 is incorporated in the housing 9302. In addition, the portable amusement machine illustrated in FIG. 6C includes an input means such as an operation key 9309, a connection terminal 9310, a sensor 9311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9312. The portable amusement machine may also be provided with a speaker portion 9306, a recording medium insertion portion 9307, an LED lamp 9308, and the like. Of course, the structure of the portable amusement machine is not limited to the above and it is acceptable as long as the light-emitting device formed in accordance with the above embodiments is used at least for one or both of the display portion 9304 and the display portion 9305. The portable amusement machine may also include other accessories as appropriate.

The portable amusement machine illustrated in FIG. 6C has a function of reading a program or data stored in a recording medium to display it in the display portion, and a function of sharing information with another portable amusement machine by wireless communication. Note that the functions of the portable amusement machine illustrated in FIG. 6C are not limited to these functions, and the portable amusement machine can have various functions.

Since the light-emitting device formed in accordance with the above embodiments has long lifetime, a portable amusement machine with long lifetime, can be provided by using the light-emitting device for the display portions 9304 and 9305 of the portable amusement machine. Further, since the light-emitting device exhibits high chromaticity, by using the light-emitting device for the display portions 9304 and 9305 of the portable amusement machine, an image with improved quality can be displayed.

Figure 6D:
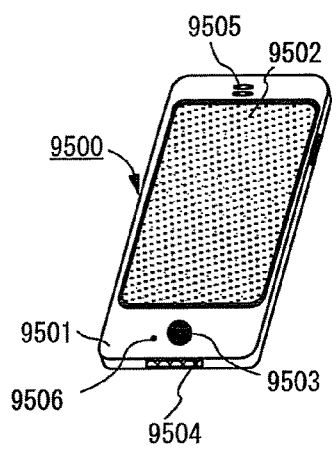

FIG. 6D illustrates an example of a mobile phone set. A mobile phone set 9500 is provided with a display portion 9502 incorporated in a housing 9501, an operation button 9503, an external connection port 9504, a speaker 9505, a microphone 9506, and the like. The mobile phone set 9500 is manufactured using the light-emitting device which is formed in accordance with the above embodiments for the display portion 9502.

When the display portion 9502 of the mobile phone set 9500 illustrated in FIG. 6D is touched with a finger or the like, data can be input to the mobile phone set 9500. In addition, operations such as phone call or composing of a mail can be conducted by touching the display portion 9502 with a finger or the like.

There are mainly three screen modes for the display portion 9502. The first mode is a display mode mainly for displaying an image. The second mode is an input mode mainly for inputting information such as text. The third mode is a display-and-input mode in which two modes of the display mode and the input mode are combined.

For example, in the case of making a phone call or composing a mail, a text input mode mainly for inputting text is selected for the display portion 9502 so that characters displayed on a screen can be input. In this case, it is preferable to display a keyboard or number buttons on almost the entire screen of the display portion 9502.

When a detection device including a sensor for detecting inclination, such as a gyroscope or an acceleration sensor, is provided inside the mobile phone set 9500, display on the screen of the display portion 9502 can be automatically switched by determining the orientation of the mobile phone set 9500 (whether the mobile phone set 9500 is placed horizontally or vertically for a landscape mode or a portrait mode).

Further, the screen modes are switched by touching the display portion 9502 or operating the operation button 9503 of the housing 9501. Alternatively, the screen modes can be switched depending on kinds of images displayed in the display portion 9502. For example, when a signal for an image displayed in the display portion is data of moving images, the screen mode is switched to the display mode. When the signal is text data, the screen mode is switched to the input mode.

Moreover, in the input mode, when input by touching the display portion 9502 is not performed within a specified period of time while a signal detected by an optical sensor in the display portion 9502 is detected, the screen mode may be controlled so as to be switched from the input mode to the display mode.

The display portion 9502 may also function as an image sensor. For example, an image of a palm print, a fingerprint, or the like is taken by touching the display portion 9502 with a palm or a finger, whereby personal authentication can be performed. Furthermore, by providing a backlight or a sensing light source emitting near-infrared light for the display portion, an image of a finger vein, a palm vein, or the like can also be taken.

Since the light-emitting device formed in accordance with the above embodiments has long lifetime, a mobile phone set with long lifetime can be provided by using the light-emitting device for the display portion 9502 of the mobile phone set. Further, since the light-emitting device exhibits high chromaticity, by using the light-emitting device for the display portion 9502 of the mobile phone set, an image with improved quality can be displayed.

Figure 6E:
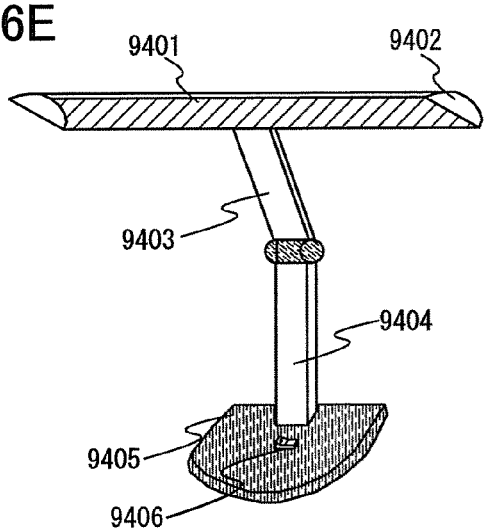

FIG. 6E illustrates a desk lamp including a lighting portion 9401, a shade 9402, an adjustable arm 9403, a support 9404, a base 9405, and a power source switch 9406. The desk lamp is manufactured using the light-emitting device which is formed in accordance with the above embodiments for the lighting portion 9401. Note that the lighting device includes a ceiling light, a wall light, and the like.

Since the light-emitting device formed in accordance with the above embodiments has long lifetime, a desk lamp with long lifetime can be provided by using the light-emitting device for the lighting portion 9401 of the desk lamp.

Figure 7:
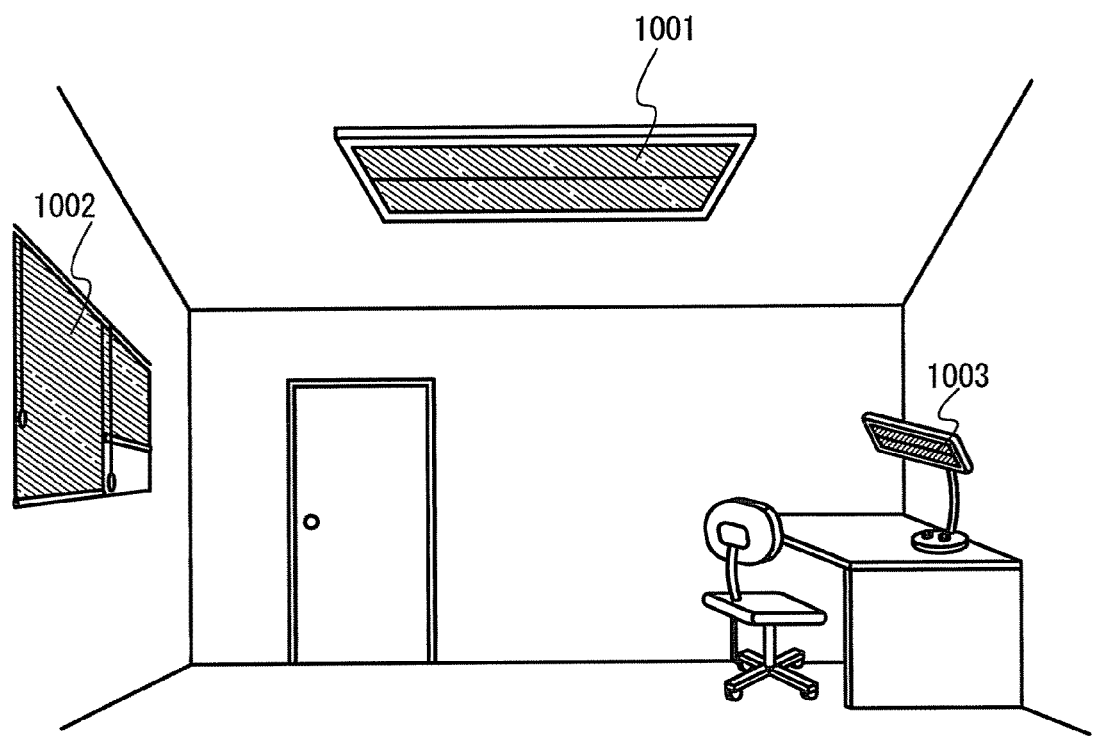
FIG. 7 illustrates a lighting device.

FIG. 7 is an example in which the light-emitting device formed in accordance with the above embodiments is used as an indoor lighting device 1001. Since the light-emitting device described in the above embodiments can be increased in area, the light-emitting device can be used as a lighting device having a large area. In addition, the light-emitting device described in the above embodiments can be thinned and thus can be used as a roll-up type lighting device 1002. Since the light-emitting device formed in accordance with the above embodiments has a long-lifetime light-emitting element, the light-emitting device can be used as a long-lifetime lighting device. As illustrated in FIG. 7, a desk lamp 1003 as illustrated in FIG. 6E may be used in a room provided with the indoor lighting device 1001.

As described above, an electronic device or a lighting device can be obtained by using the light-emitting device described in the above embodiments. The light-emitting device has a remarkably wide application range, and can be applied to electronic devices in various fields.

Note that the structure described in this embodiment can be combined with any of the structures described in other embodiments as appropriate.

Example 1

Light-emitting elements of Example 1 will be described, referring to results of reference light-emitting elements.

The molecular structures of organic compounds used in this example are represented by the following structural formulas (10) to (16). The element structure is the same as that in FIG. 2.

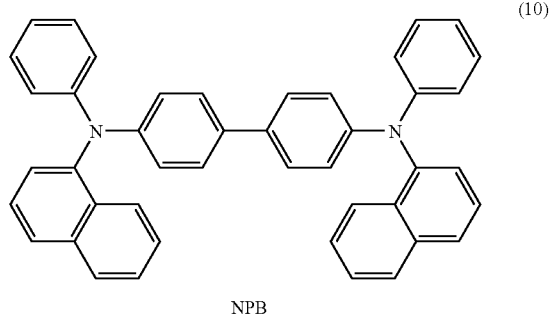

NPB (10)

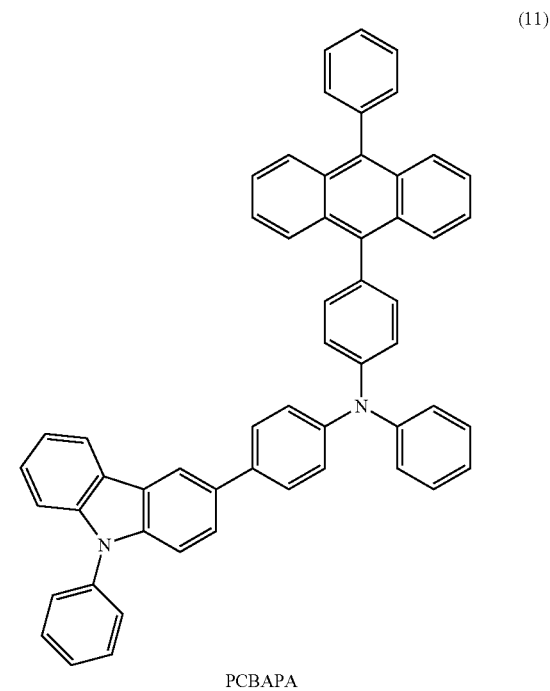

PCBAPA (11)

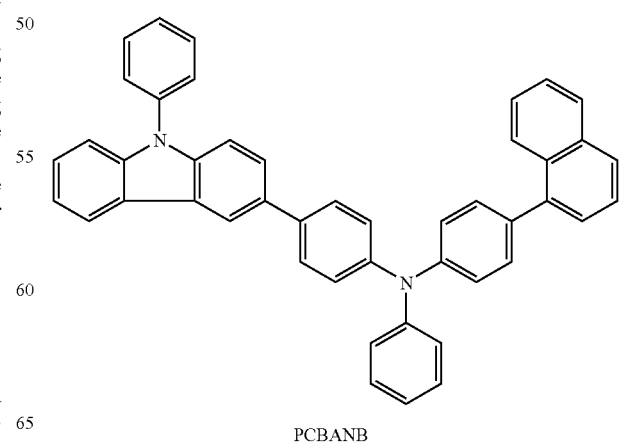

PCBANB (12)

-continued (13)

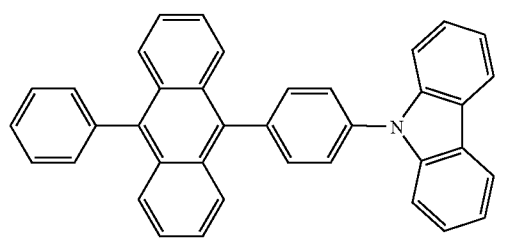

CzPA (14)

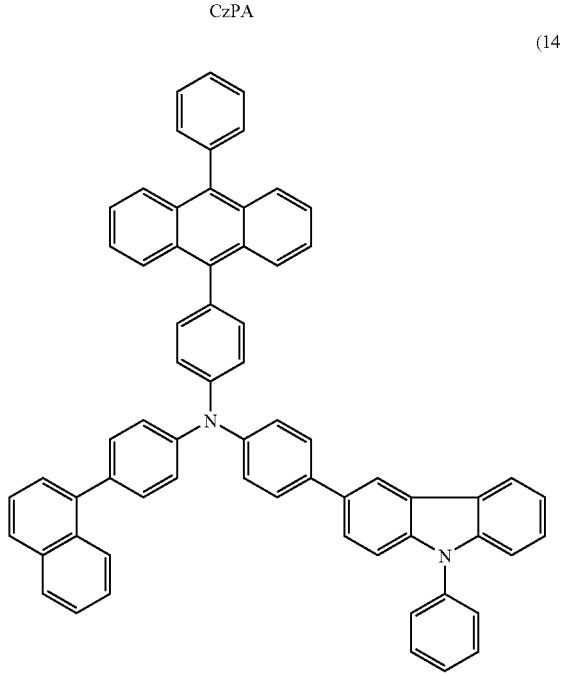

PCBNAPA (15)

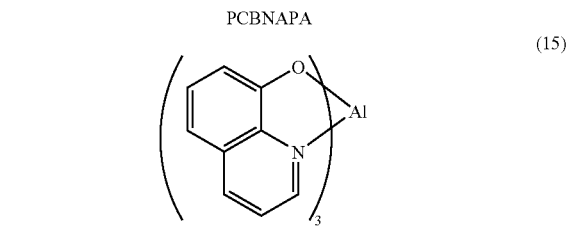

Alq3

(16)

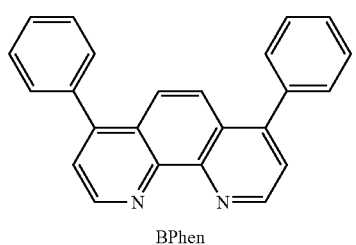

BPhen

Hereinafter, manufacturing methods of a light-emitting element 1, a light-emitting element 2, a reference light-emitting element 1, and a reference light-emitting element 2 are described.

First, a glass substrate over which a film of indium tin silicon oxide (ITSO) was formed with a thickness of 110 nm as an anode 100 was prepared. The periphery of a surface of the ITSO film was covered with a polyimide film so that an area of 2 mm×2 mm of the surface was exposed, whereby the electrode area was 2 mm×2 mm. As pretreatment for forming a light-emitting element over the substrate, the surface of the substrate was washed with water and baked at 200° C. for 1 hour and then, subjected to UV ozone treatment for 370 seconds. Then, the substrate was introduced into a vacuum evaporation apparatus in which the pressure was reduced to approximately $10^{-4}$ Pa, and vacuum baking at 170° C. for 30 minutes was conducted in a heating chamber of the vacuum evaporation apparatus, and then the substrate was cooled down for approximately 30 minutes.

Then, the substrate was fixed on a holder provided in the vacuum evaporation apparatus such that the surface of the substrate provided with the ITSO film faced down.

After the pressure in the vacuum evaporation apparatus was reduced to $10^{-4}$ Pa, 4,4'-bis[N-(1-naphthyl)-N-phenylamino]biphenyl (NPB) represented by the above structural formula (10) and molybdenum(VI) oxide were co-evaporated so as to meet NPB:molybdenum(VI) oxide=4:1 (mass ratio), whereby a hole-injecting layer 104 was formed. The thickness of the hole-injecting layer 104 was 50 nm. Note that the co-evaporation is an evaporation method in which some different substances are evaporated from some different evaporation sources at the same time. Next, NPB was evaporated to be 10 nm thick, whereby a hole-transporting layer 105 was formed.

Further, a first light-emitting layer 102*a* was formed on the hole-transporting layer 105.

In each of the light-emitting elements 1 and 2, the first light-emitting layer 102*a* was formed by co-evaporation of 4-(10-phenyl-9-anthryl)-4'-(9-phenyl-9H-carbazol-3-yl) triphenylamine (PCBAPA) which was a first light-emitting substance and represented by the above structural formula (11) and 4-(1-naphthyl)-4'-(9-phenyl-9H-carbazol-3-yl)-triphenylamine (PCBANB) which was a hole-transporting organic compound and represented by the above structural formula (12). The first light-emitting layer 102*a* was deposited such that PCBAPA:PCBANB was 1:0.5 in the light-emitting element 1 and 1:2 in the light-emitting element 2 (mass ratio). The first light-emitting layer 102*a* of the reference light-emitting element 1 was formed by evaporation of PCBAPA, and the first light-emitting layer 102*a* of the reference light-emitting element 2 was formed by evaporation of PCBANB. In each of the light-emitting elements, the thickness of the first light-emitting layer 102*a* was 25 nm.

Next, on the first light-emitting layer 102*a* of each of the light-emitting elements, a second light-emitting layer 102*b* was formed by co-evaporation of 9-[4-(10-phenyl-9-antryl) phenyl]-9H-carbazole (CzPA) which was an electron-transporting organic compound and represented by the above structural formula (13) and 4-(1-naphthyl)-4'-(10-phenyl-9-anthryl)-4"-(9-phenyl-9H-carbazol-3-yl)triphenylamine (PCBNAPA) which was a second light-emitting substance and represented by the above structural formula (14). In this manner, a light-emitting layer 102 including the first light-emitting layer 102*a* and the second light-emitting layer 102*b* was formed. Note that the mass ratio of CzPA to PCBNAPA in the second light-emitting layer 102*b* was set to be CzPA: PCBNAPA=1:0.1. The thickness of the second light-emitting layer 102*b* was 30 nm.

Next, tris(8-quinolinolato)aluminum(III) (Alq) represented by the above structural formula (15) was deposited to be 10 nm thick and then bathophenanthroline (BPhen) represented by the above structural formula (16) was deposited to be 15 nm thick, so that an electron-transporting layer 106 was formed. An electron-injecting layer 107 was formed using lithium fluoride to be 1 nm thick on the electron-transporting layer 106. Lastly, an aluminum film was deposited to be 200 nm thick as a cathode 101. In this manner, the light-emitting elements were completed. All the above evaporation processes were performed by a resistance heating method.

The element structures of the light-emitting element 1, the light-emitting element 2, the reference light-emitting element 1, and the reference light-emitting element 2 which were manufactured as described above are shown in Table 1. The light-emitting element 1 and the light-emitting element 2 are each a light-emitting element having the structure described in Embodiment 1. In addition, the reference light-emitting element 1 has a structure including the first light-emitting layer 102a formed using PCBAPA which is the first light-emitting substance, and the reference light-emitting element 2 has a structure including the first light-emitting layer 102a formed using PCBANB which is the hole-transporting organic compound.

the reference light-emitting element 1. In addition, the light-emitting elements 1 and 2 had blue light emission having a higher chromaticity than the reference light-emitting element 1. The reason for this is probably as follows. In the light-emitting elements 1 and 2, since the first light-emitting layer 102a contains the first light-emitting substance (PCBAPA in this example) and the hole-transporting organic compound (PCBANB in this example), transport of electrons is controlled in the first light-emitting layer 102a and a light-emitting region is formed around the interface between the first and second light-emitting layers. On the other hand, in the reference light-emitting element 1 in which the first light-emitting layer is formed with a single film of the first light-emitting substance, electrons are easily transported in the first light-emitting layer 102a, and a light-emitting region is possibly formed throughout the first light-emitting layer 102a.

TABLE 1

| | Anode | Hole-injecting layer | Hole-transporting layer | First light-emitting layer | Second light-emitting layer | Electron-transporting layer | | Electron-injecting layer | Cathode |
|---|---|---|---|---|---|---|---|---|---|
| Light-emitting element 1 | ITSO 110 nm | NPB:MoOx (=4:1) 50 nm | NPB 10 nm | PCBAPA:PCBANB (=1:0.5) 25 nm | CzPA:PCBNAPA (=1:0.1) 30 nm | Alq 10 nm | BPhen 15 nm | LiF 1 nm | Al 200 nm |
| Light-emitting element 2 | ITSO 110 nm | NPB:MoOx (=4:1) 50 nm | NPB 10 nm | PCBAPA:PCBANB (=1:2) 25 nm | CzPA:PCBNAPA (=1:0.1) 30 nm | Alq 10 nm | BPhen 15 nm | LiF 1 nm | Al 200 nm |
| Reference light emitting element 1 | ITSO 110 nm | NPB:MoOx (=4:1) 50 nm | NPB 10 nm | PCBAPA 25 nm | CzPA:PCBNAPA (=1:0.1) 30 nm | Alq 10 nm | BPhen 15 nm | LiF 1 nn | Al 200 nm |
| Reference light emitting element 2 | ITSO 110 nm | NPB:MoOx (=4:1) 50 nm | NPB 10 nm | PCBANB 25 nm | CzPA:PCBNAPA (=1:0.1) 30 nm | Alq 10 nm | BPhen 15 nm | LiF 1 nm | Al 200 nm |

The thus obtained light-emitting element 1, light-emitting element 2, reference light-emitting element 1, and reference light-emitting element 2 were put into a glove box under a nitrogen atmosphere so that the light-emitting elements were sealed from the air. Then, the operating characteristics of these light-emitting elements were measured. The measurement was carried out at room temperature (under an atmosphere kept at 25° C.).

Figure 8:
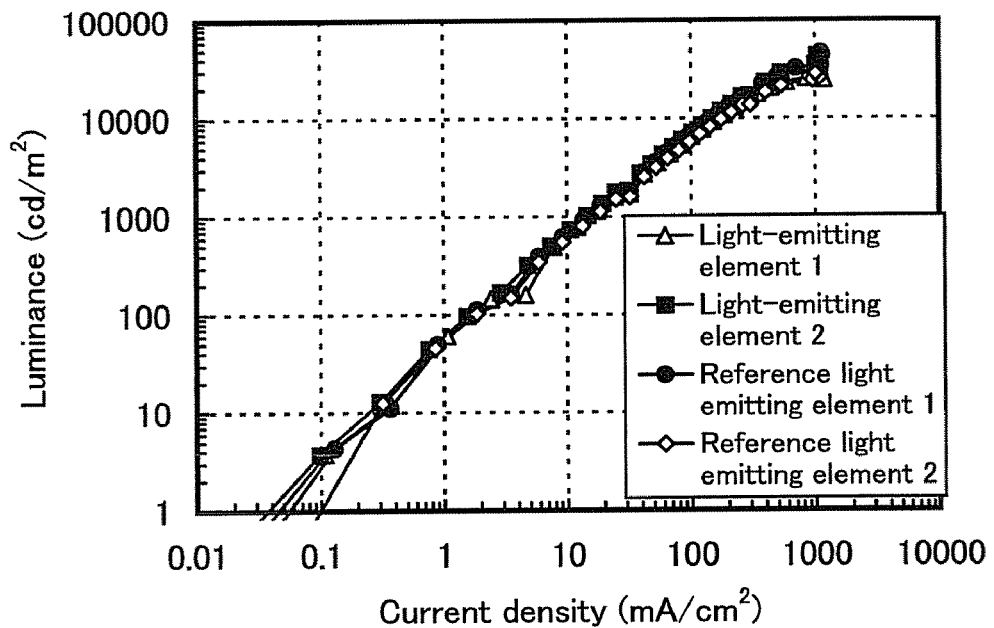
FIG. 8 shows characteristics of light-emitting elements and reference light-emitting elements of Example 1.
Figure 9:
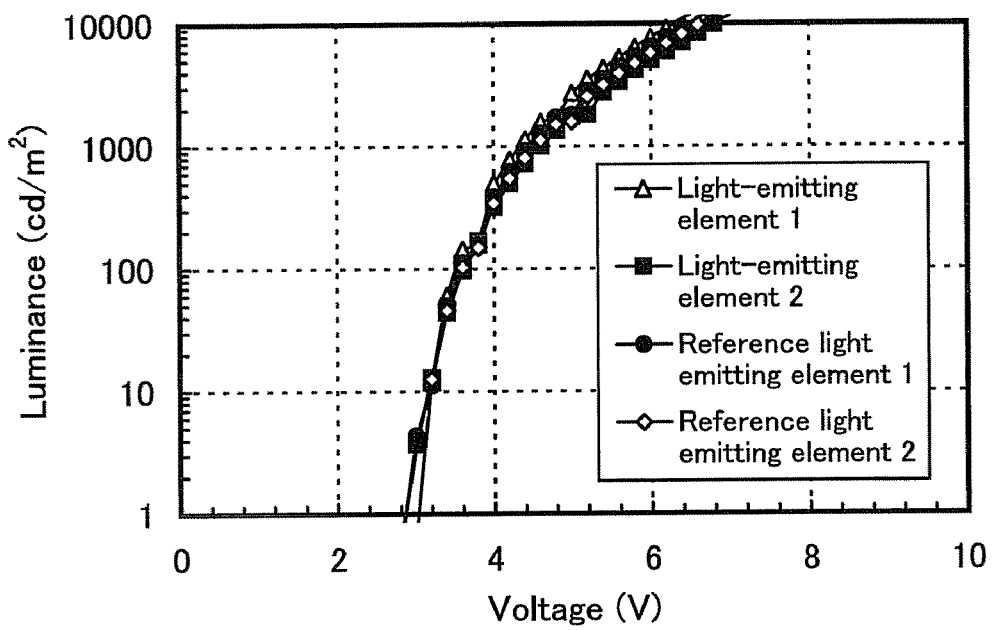
FIG. 9 shows characteristics of light-emitting elements and reference light-emitting elements of Example 1.
Figure 10:
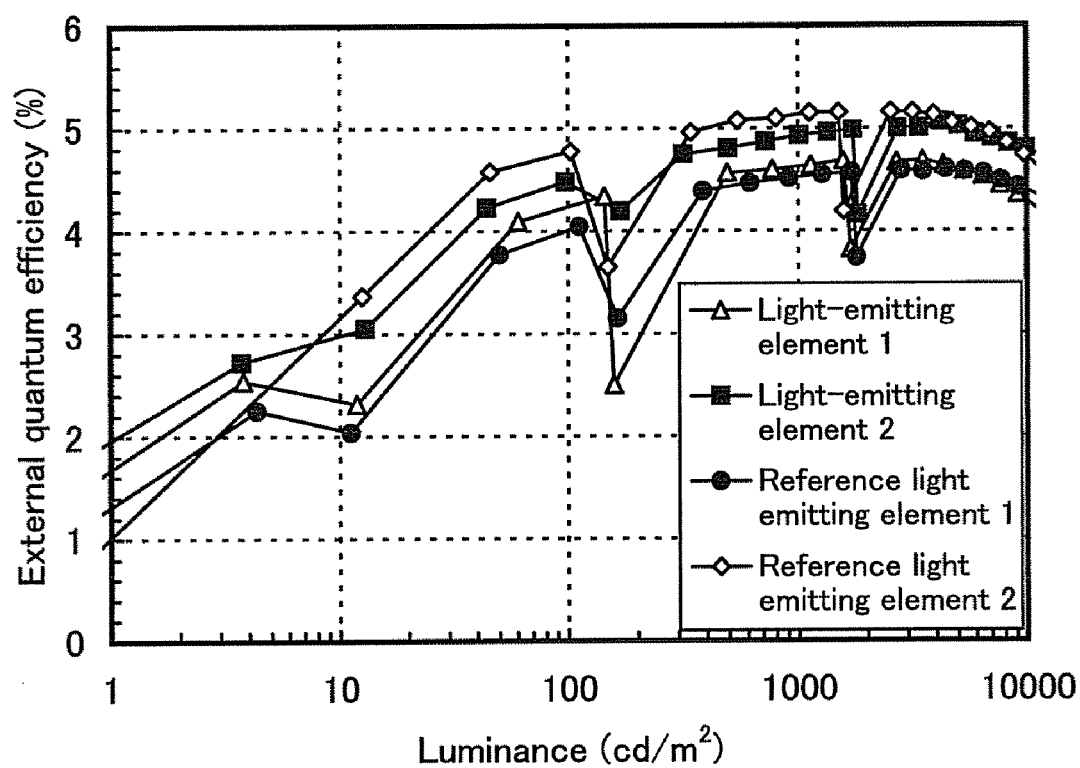
FIG. 10 shows characteristics of light-emitting elements and reference light-emitting elements of Example 1.

FIG. 8 shows current density-luminance characteristics, FIG. 9 shows voltage-luminance characteristics, and FIG. 10 shows luminance-external quantum efficiency characteristics of the light-emitting elements. Table 2 shows voltage, external quantum efficiency, chromaticity, and emission peak wavelength of each of the light-emitting elements at around 1000 cd/m$^2$.

TABLE 2

| | Luminance (cd/m$^2$) | Voltage (V) | External quantum efficiency (%) | Chromaticity (x, y) | Emission peak wavelength (nm) |
|---|---|---|---|---|---|
| Light-emitting element 1 | 1130 | 4.4 | 4.64 | (0.15, 0.19) | 466 |
| Light-emitting element 2 | 1010 | 4.6 | 4.93 | (0.15, 0.20) | 471 |
| Reference light emitting element 1 | 910 | 4.4 | 4.51 | (0.15, 0.22) | 472 |
| Reference light emitting element 2 | 1120 | 4.6 | 5.15 | (0.15, 0.15) | 461 |

Figure 11:
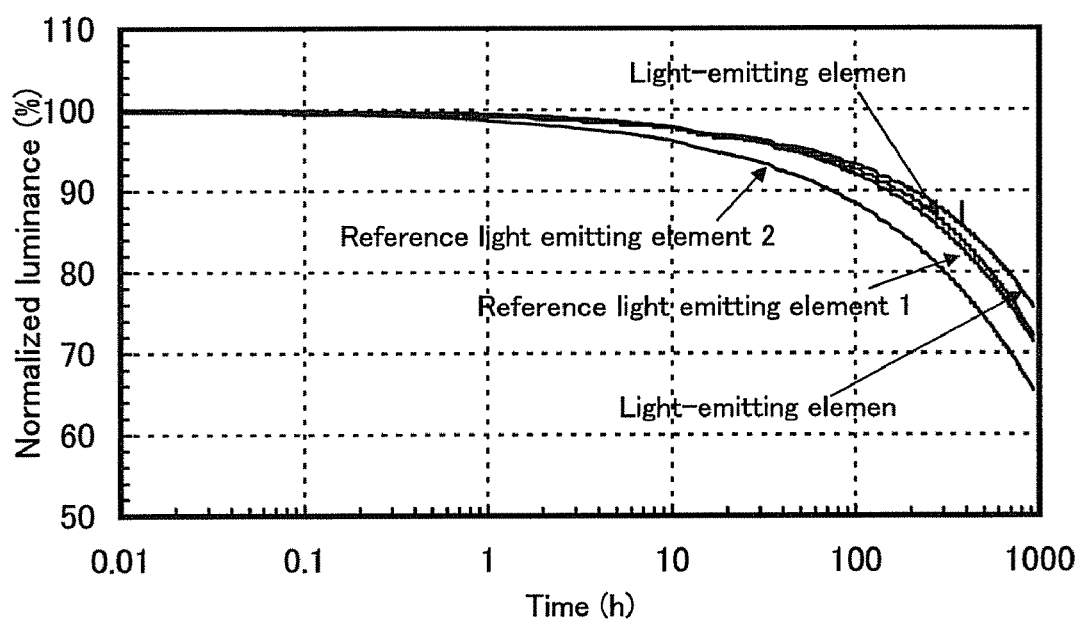
FIG. 11 shows characteristics of light-emitting elements and reference light-emitting elements of Example 1.

As is clear from FIG. 10 and Table 2, the light-emitting elements 1 and 2 had higher external quantum efficiency than Reliability tests were conducted on the light-emitting element 1, the light-emitting element 2, the reference light-emitting element 1, and the reference light-emitting element 2 which were manufactured as described above. In the reliability tests, the initial luminance was set at 1000 cd/m$^2$, and the elements were driven at a constant current density. The luminance was measured every time a predetermined period of time passed. FIG. 11 shows the results obtained by the reliability tests. In FIG. 11, the horizontal axis represents current flow time (hour) and the vertical axis represents the percentage of luminance to the initial luminance at each time, that is, normalized luminance (%).

As is clear from FIG. 11, the light-emitting elements 1 and 2 kept 76% and 72% of the initial luminance, respectively, after having been driven for 930 hours. Furthermore, the luminance of the reference light-emitting element 1 after driving for 930 hours was 71% of the initial luminance, whereas that of the reference light-emitting element 2 decreased to 65% of the initial luminance. Accordingly, it is found that the luminance of each of the light-emitting elements 1 and 2 does not easily decrease with the passage of time compared to the reference light-emitting elements in this example, particularly, the reference light-emitting element 2, and the light-emitting elements 1 and 2 have long lifetime.

In the light-emitting elements 1 and 2, since the first light-emitting layer 102a contains the first light-emitting substance having a LUMO level that is substantially the same as that of the electron-transporting organic compound (CzPA in this example) contained in the second light-emitting layer 102b, electrons can be easily transported between the first light-emitting layer 102a and the second light-emitting layer 102b. On the other hand, in the reference light-emitting element 2 in which the first light-emitting layer 102a is formed with a single film of the hole-transporting organic compound, an injection barrier is high and electrons cannot be easily injected, so it is probable that the electrons are accumulated at the interface between the first light-emitting layer 102a and the second light-emitting layer 102b, and that the light-emitting element deteriorates with the passage of time.

As described above, the light-emitting elements 1 and 2 of this example can have improved emission efficiency and longer lifetime, and furthermore, high color purity.

Example 2

In this example, light-emitting elements having structures different from those in Example 1 will be described, referring to results of reference light-emitting elements. The molecular structure of one of organic compounds used in this example is represented by the following structural formula (17). Note that the organic compounds whose molecular structures are already shown in other examples are not shown in this example. The element structure is the same as that in Example 1, about which FIG. 2 is referred to.

(17)

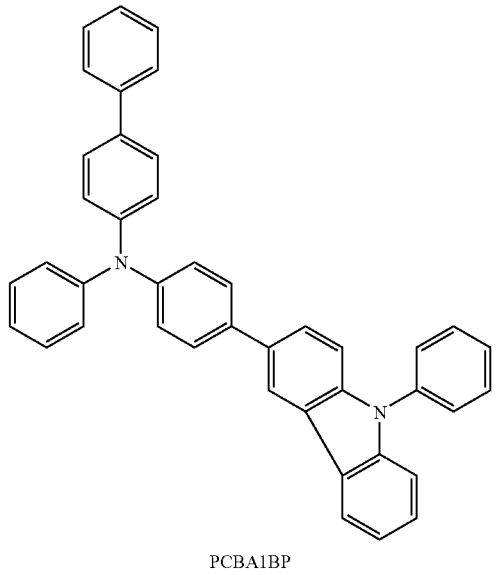

PCBA1BP

Hereinafter, manufacturing methods of a light-emitting element 3, a light-emitting element 4, a light-emitting element 5, and a reference light-emitting element 3 of this example are described. In addition, a reference light-emitting element 1 of this example was manufactured by a method similar to that of the reference light-emitting element 1 of Example 1.

The light-emitting element 3, the light-emitting element 4, the light-emitting element 5, and the reference light-emitting element 3 were formed in a manner similar to the light-emitting elements 1 and 2 and the reference light-emitting elements 1 and 2 in Example 1, including and up to formation of a hole-transporting layer 105.

On the hole-transporting layer 105, a first light-light-emitting layer 102a was formed in each of the light-emitting elements. In each of the light-emitting elements 3, 4, and 5, the first light-emitting layer 102a was formed by co-evaporation of 4-(10-phenyl-9-anthryl)-4'-(9-phenyl-9H-carbazol-3-yl)triphenylamine (PCBAPA) which was a first light-emitting substance and 4-phenyl-4'-(9-phenyl-9H-carbazol-3-yl) triphenylamine (PCBA1BP) which was a hole-transporting organic compound and represented by the above structural formula (17). The first light-emitting layer 102a was deposited such that PCBAPA:PCBA1BP was 1:0.5 in the light-emitting element 3, 1:1 in the light-emitting element 4, and 1:2 in the light-emitting element 5 (mass ratio). The first light-emitting layer 102a of the reference light-emitting element 3 was formed by evaporation of PCBA1BP. In each of the light-emitting elements, the thickness of the first light-emitting layer 102a was 25 nm.

Next, on the first light-emitting layer 102a of each of the light-emitting elements, a second light-emitting layer 102b was stacked. In this manner, a light-emitting layer 102 including the first light-emitting layer 102a and the second light-emitting layer 102b was formed. Then, on the light-emitting layer 102, an electron-transporting layer 106, an electron-injecting layer 107, and a cathode 101 were stacked in sequence, so that the light-emitting elements and the reference light-emitting element were completed. These layers were formed in a manner similar to those of the light-emitting elements 1 and 2 and the reference light-emitting elements 1 and 2 in Example 1.

Table 3 shows the element structures of the light-emitting element 3, the light-emitting element 4, the light-emitting element 5, the reference light-emitting element 1, and the reference light-emitting element 3 manufactured as described above. The light-emitting element 3, the light-emitting element 4, and the light-emitting element 5 are each a light-emitting element having the structure described in Embodiment 1. In addition, the reference light-emitting element 1 has a structure including the first light-emitting layer 102a formed using PCBAPA which is the first light-emitting substance, and the reference light-emitting element 2 has a structure including the first light-emitting layer 102a formed using PCBA1BP which is the hole-transporting organic compound.

TABLE 3

| | Anode | Hole-injecting layer | Hole-transporting layer | First light-emitting layer | Second light-emtting layer | Electron-transporting layer | Electron-injecting layer | Cathode |
| --- | --- | --- | --- | --- | --- | --- | --- | --- |
| Light-emitting element 3 | ITSO 110 nm | NPB:MoOx (=4:1) 50 nm | NPB 10 nm | PCBAPA:PCBA1BP (=1:0.5) 25 nm | CzPA:PCBNAPA (=1:0.1) 30 nm | Alq 10 nm | BPhen 15 nm | LiF 1 nm | Al 200 nm |
| Light-emitting element 4 | ITSO 110 nm | NPB:MoOx (=4:1) 50 nm | NPB 10 nm | PCBAPA:PCBA1BP (=1:1) 25 nm | CzPA:PCBNAPA (=1:0.1) 30 nm | Alq 10 nm | BPhen 15 nm | LiF 1 nm | Al 200 nm |
| Light-emitting element 5 | ITSO 110 nm | NPB:MoOx (=4:1) 50 nm | NPB 10 nm | PCBAPA:PCBA1BP (=1:2) 25 nm | CzPA:PCBNAPA (=1:0.1) 30 nm | Alq 10 nm | BPhen 15 nm | LiF 1 nm | Al 200 nm |

TABLE 3-continued

| | Anode | Hole-injecting layer | Hole-transporting layer | First light-emitting layer | Second light-emtting layer | Electron-transporting layer | Electron-injecting layer | Cathode |
|---|---|---|---|---|---|---|---|---|
| Reference light emitting element 1 | ITSO 110 nm | NPB:MoOx (=4:1) 50 nm | NPB 10 nm | PCBAPA 25 nm | CzPA:PCBNAPA (=1:0.1) 30 nm | Alq 10 nm | BPhen 15 nm | LiF 1 nm | Al 200 nm |
| Reference light emitting element 3 | ITSO 110 nm | NPB:MoOx (=4:1) 50 nm | NPB 10 nm | PCBA1BP 25 nm | CzPA:PCBNAPA (=1:0.1) 30 nm | Alq 10 nm | BPhen 15 nm | LiF 1 nm | Al 200 nm |

The thus obtained light-emitting element 3, light-emitting element 4, light-emitting element 5, reference light-emitting element 1, and reference light-emitting element 3 were put into a glove box under a nitrogen atmosphere so that the light-emitting elements were sealed from the air. Then, the operating characteristics of these light-emitting elements were measured. The measurement was carried out at room temperature (under an atmosphere kept at 25° C.).

Figure 12:
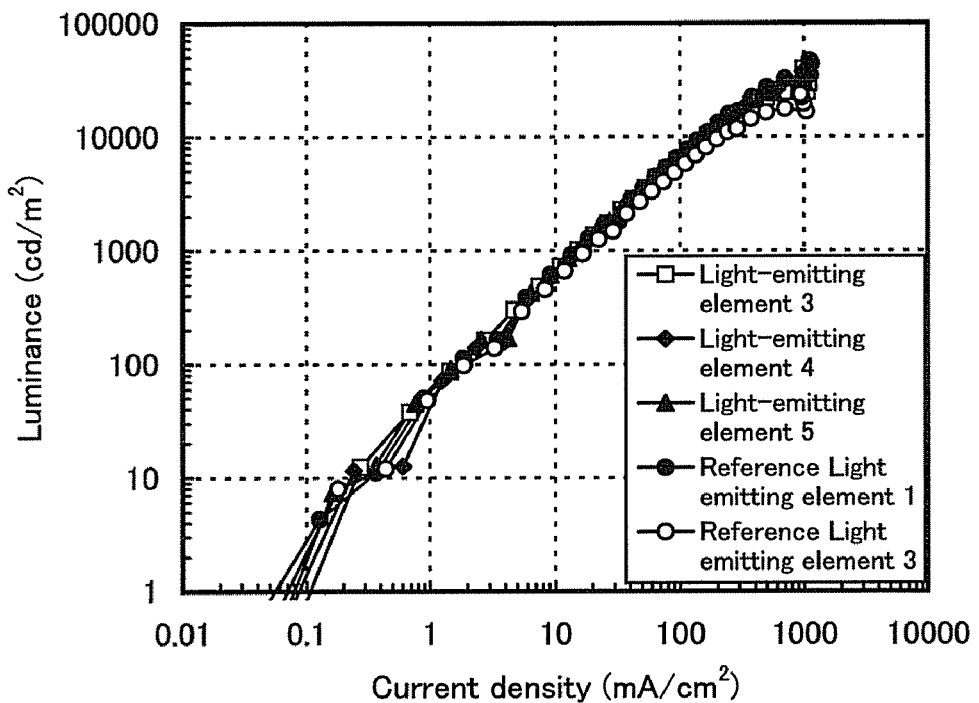
FIG. 12 shows characteristics of light-emitting elements and reference light-emitting elements of Example 2.
Figure 13:
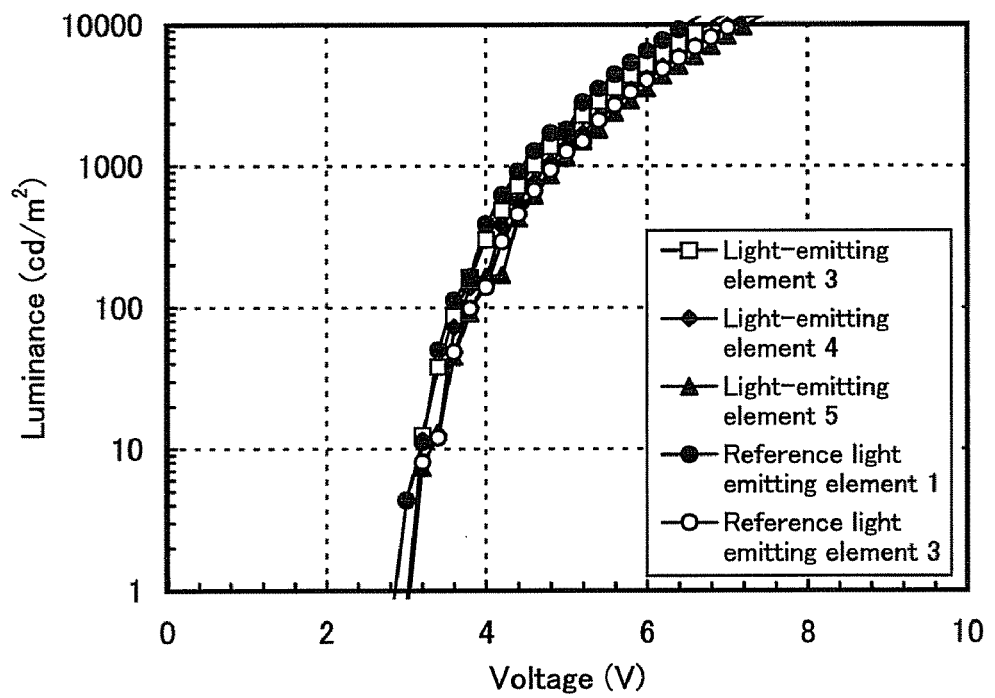
FIG. 13 shows characteristics of light-emitting elements and reference light-emitting elements of Example 2.
Figure 14:
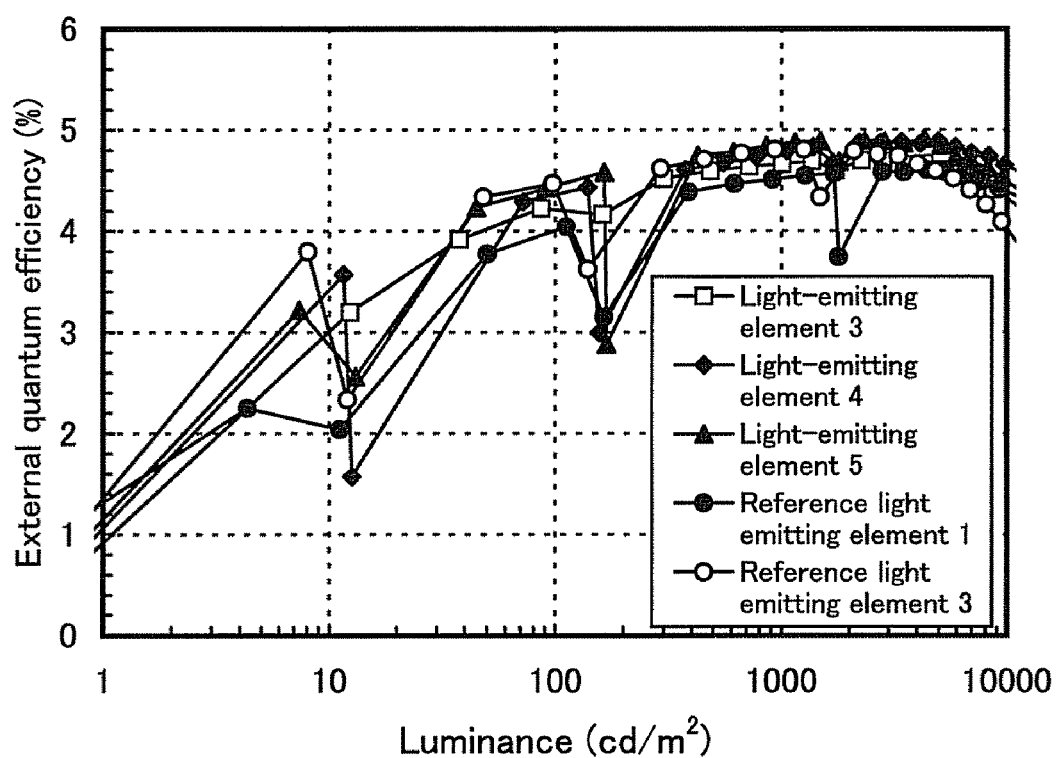
FIG. 14 shows characteristics of light-emitting elements and reference light-emitting elements of Example 2.

FIG. 12 shows current density-luminance characteristics, FIG. 13 shows voltage-luminance characteristics, and FIG. 14 shows luminance-external quantum efficiency characteristics of the light-emitting elements. Table 4 shows voltage, external quantum efficiency, chromaticity, and emission peak wavelength of each of the light-emitting elements at around 1000 cd/m$^2$.

TABLE 4

| | Luminance (cd/m$^2$) | Voltage (V) | External quantum efficiency (%) | Chromaticity (x, y) | Emission peak wavelength (nm) |
|---|---|---|---|---|---|
| Light emitting element 3 | 1010 | 4.6 | 4.66 | (0.15, 0.20) | 471 |
| Light emitting element 4 | 1050 | 4.8 | 4.79 | (0.15, 0.19) | 472 |
| Light emitting element 5 | 860 | 4.8 | 4.84 | (0.15, 0.20) | 471 |
| Reference light emitting element 1 | 910 | 4.4 | 4.51 | (0.15, 0.22) | 472 |
| Reference light emitting element 3 | 940 | 4.8 | 4.80 | (0.15, 0.15) | 461 |

As is clear from FIG. 14 and Table 4, the light-emitting elements 3, 4, and 5 had higher external quantum efficiency than the reference light-emitting element 1. In addition, the light-emitting elements 3, 4, and 5 had blue light emission having a higher chromaticity than the reference light-emitting element 1. The reason for this is probably as follows. In the light-emitting elements 3, 4, and 5, since the first light-emitting layer 102a contains the first light-emitting substance (PCBAPA in this example) and the hole-transporting organic compound (PCBA1BP in this example), transport of electrons is controlled in the first light-emitting layer 102a and a light-emitting region is formed around the interface between the first and second light-emitting layers. On the other hand, in the reference light-emitting element 1 in which the first light-emitting layer is formed with a single film of the first light-emitting substance, electrons are easily transported in the first light-emitting layer 102a, and a light-emitting region is possibly formed throughout the first light-emitting layer 102a.

Figure 15:
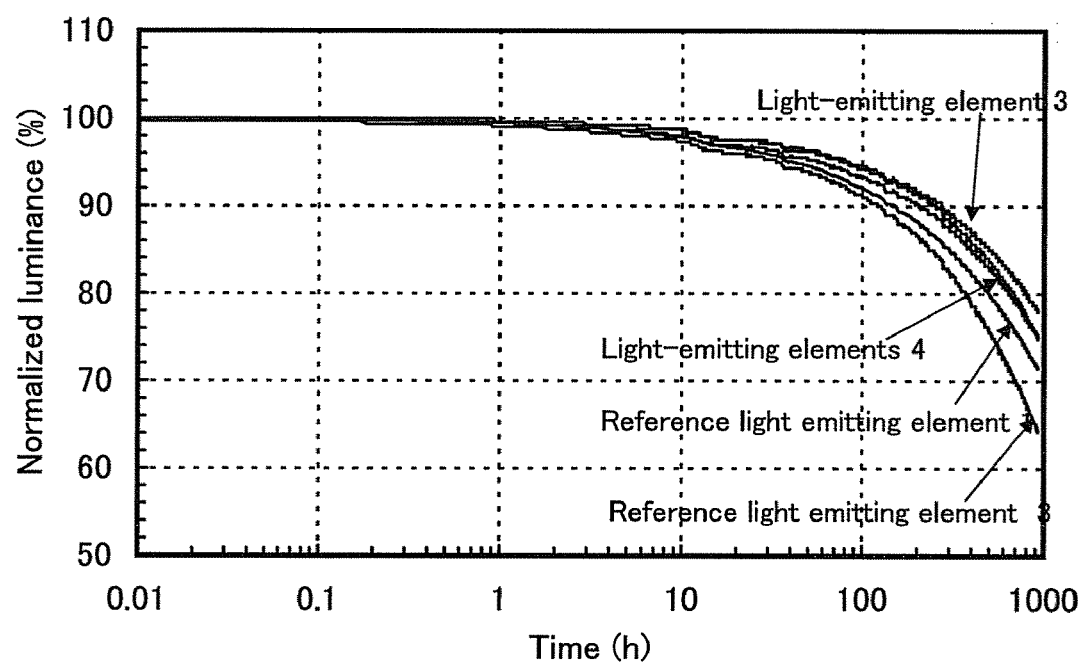
FIG. 15 shows characteristics of light-emitting elements and reference light-emitting elements of Example 2.

Reliability tests were conducted on the light-emitting element 3, 4, and 5, and the reference light-emitting elements 1 and 3 manufactured as described above. In the reliability tests, the initial luminance was set at 1000 cd/m$^2$, and the elements were driven at a constant current density. The luminance was measured every time a predetermined period of time passed. FIG. 15 shows the results obtained by the reliability tests. In FIG. 15, the horizontal axis represents current flow time (hour) and the vertical axis represents the percentage of luminance to the initial luminance at each time, that is, normalized luminance (%).

As is clear from FIG. 15, the light-emitting element 3 kept 78% of the initial luminance after having been driven for 930 hours, and the light-emitting elements 4 and 5 kept 75% of the initial luminance after having been driven for 930 hours. Furthermore, the luminance of the reference light-emitting element 1 after driving for 930 hours was 71% of the initial luminance, whereas that of the reference light-emitting element 3 decreased to 64% of the initial luminance. Accordingly, it is found that the luminance of each of the light-emitting elements 3, 4, and 5 does not easily decrease with the passage of time compared to the reference light-emitting elements in this example, particularly, the reference light-emitting element 3, and the light-emitting elements 3, 4, and 5 have long lifetime.

In the light-emitting elements 3, 4, and 5, since the first light-emitting layer 102a contains the first light-emitting substance having a LUMO level that is substantially the same as that of the electron-transporting organic compound (CzPA in this example) contained in the second light-emitting layer 102b, electrons can be easily transported between the first light-emitting layer 102a and the second light-emitting layer 102b. On the other hand, in the reference light-emitting element 3 in which the first light-emitting layer 102a is formed with a single film of the hole-transporting organic compound, an injection barrier is high and electrons cannot be easily injected, so it is probable that the electrons are accumulated at the interface between the first light-emitting layer 102a and the second light-emitting layer 102b, and that the light-emitting element deteriorates with the passage of time.

As described above, the light-emitting elements 3, 4, and 5 of this example can have improved emission efficiency and longer lifetime, and furthermore, high color purity.

Example 3

In this example, a light-emitting element having a structure different from those of Examples 1 and 2 will be described. Note that organic compounds used in this example are the organic compounds whose molecular structures are already shown in the other examples and therefore are not shown in this example. The element structure is the same as that in Example 1, about which FIG. 2 is referred to.

Hereinafter, a manufacturing method of a light-emitting element 6 of this example is described. Note that the light-emitting element 6 was manufactured by a method similar to that of the light-emitting element 1 of Example 1, including and up to formation of a hole-transporting layer 105.

On the hole-transporting layer 105, a first light-light-emitting layer 102a was formed by co-evaporation of 4-(10-phenyl-9-anthryl)-4'-(9-phenyl-9H-carbazol-3-yl)triphenylamine (PCBAPA) which was a first light-emitting substance and 4-(1-naphthyl)-4'-(9-phenyl-9H-carbazol-3-yl)-triphenylamine (PCBANB) which was a hole-transporting organic compound. The first light-emitting layer 102a was deposited such that PCBAPA:PCBANB was 1:1 (mass ratio). The thickness of the first light-emitting layer 102a was 25 nm.

Next, on the first light-emitting layer 102a, a second light-emitting layer 102b was stacked. In this manner, a light-emitting layer 102 including the first light-emitting layer 102a and the second light-emitting layer 102b was formed. Then, on the light-emitting layer 102, an electron-transporting layer 106, an electron-injecting layer 107, and a cathode 101 were stacked in sequence, so that the light-emitting element 6 was completed. These layers were formed in a manner similar to that of the light-emitting element 1 in Example 1.

Table 5 shows the element structure of the light-emitting element 6 manufactured as described above.

is probably as follows. In the light-emitting element 6, since the first light-emitting layer 102a contains the first light-emitting substance (PCBAPA in this example) and the hole-transporting organic compound (PCBANB in this example), transport of electrons is controlled in the first light-emitting layer 102a and a light-emitting region is formed around the interface between the first and second light-emitting layers.

Figure 19:
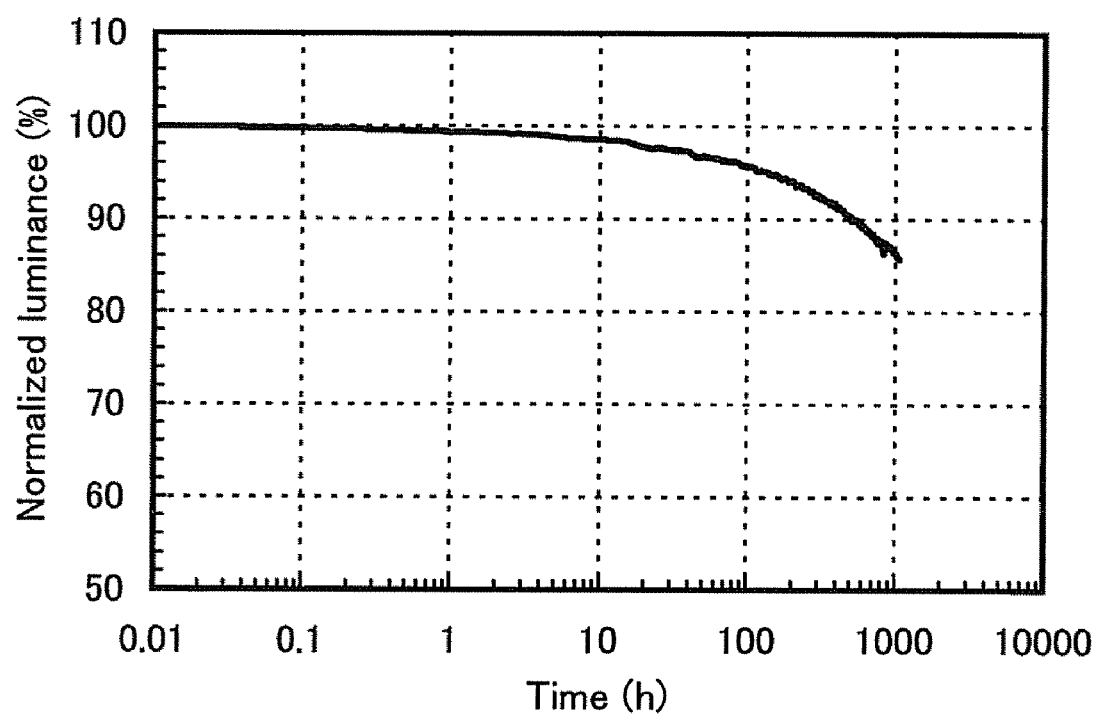
FIG. 19 shows characteristics of a light-emitting element of Example 3.

A reliability test was conducted on the light-emitting element 6 manufactured as described above. In the reliability test, the initial luminance was set at 1000 cd/m$^2$, and the element was driven at a constant current density. The luminance was measured every time a predetermined period of time passed. FIG. 19 shows the results obtained by the reliability test. In FIG. 19, the horizontal axis represents current flow time (hour) and the vertical axis represents the percentage of luminance to the initial luminance at each time, that is, normalized luminance (%).

As is clear from FIG. 19, the light-emitting element 6 kept 86% of the initial luminance after having been driven for 1100 hours. Accordingly, it is found that the luminance of the light-emitting element 6 does not easily decrease with the passage of time, and the light-emitting element 6 has long

TABLE 5

|  | Anode | Hole-injecting layer | Hole-transporting layer | First light-emitting layer | Second light-emitting layer | Electron-transporting layer | Electron-injecting layer | Cathode |
|---|---|---|---|---|---|---|---|---|
| Light-emitting element 6 | ITSO 110 nm | NPB:MoOx (=4:1) 50 nm | NPB 10 nm | PCBAPA:PCBANB (=1:1) 25 nm | CzPA:PCBNAPA (=1:0.1) 30 nm | Alq 10 nm | BPhen 15 nm | LiF 1 nm | Al 200 nm |

The thus obtained light-emitting element 6 was put into a glove box under a nitrogen atmosphere so that the light-emitting element was sealed from the air. Then, the operating characteristics of the light-emitting element were measured. The measurement was carried out at room temperature (under an atmosphere kept at 25° C.).

Figure 16:
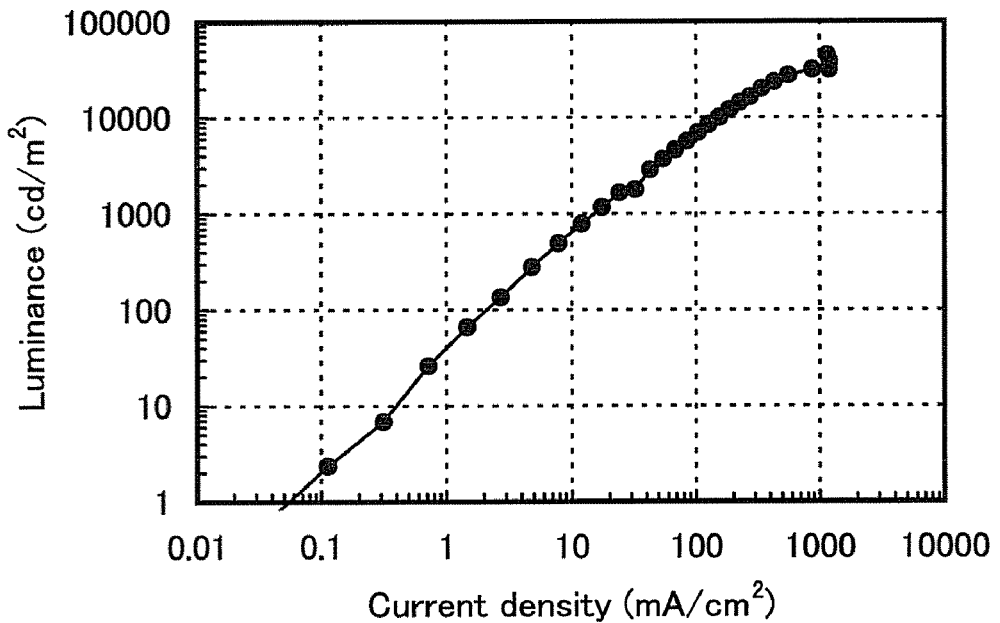
FIG. 16 shows characteristics of a light-emitting element of Example 3.
Figure 17:
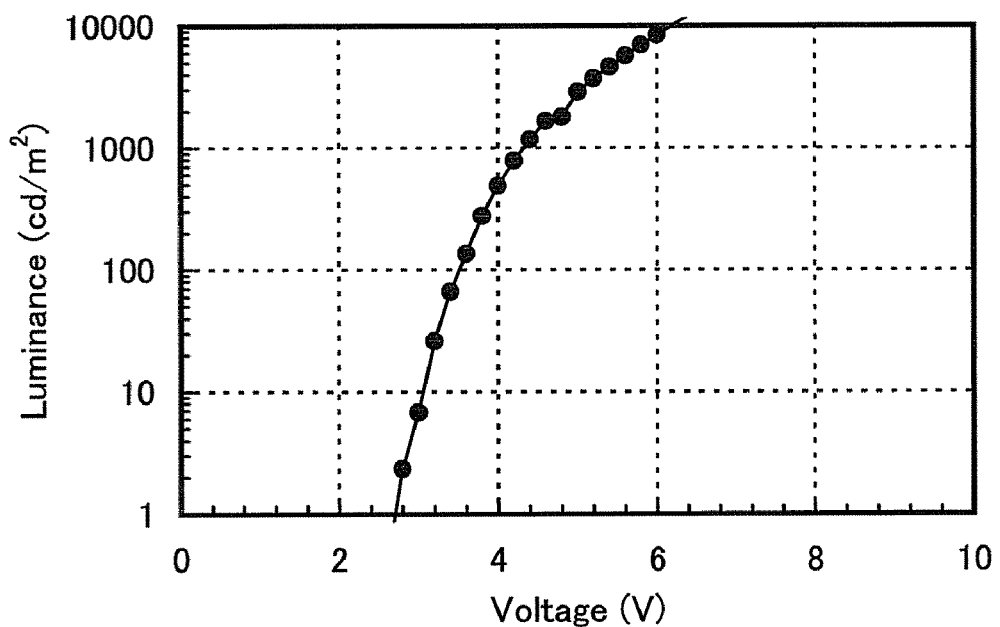
FIG. 17 shows characteristics of a light-emitting element of Example 3.
Figure 18:
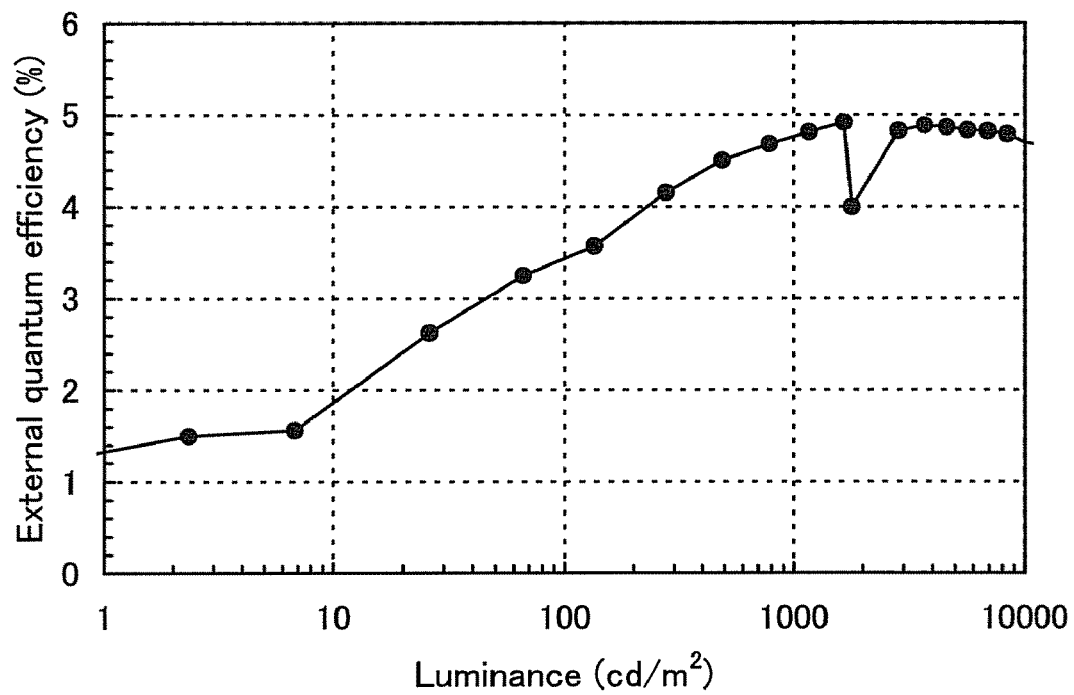
FIG. 18 shows characteristics of a light-emitting element of Example 3.

FIG. 16 shows current density-luminance characteristics, FIG. 17 shows voltage-luminance characteristics, and FIG. 18 shows luminance-external quantum efficiency characteristics of the light-emitting element. Table 6 shows voltage, external quantum efficiency, chromaticity, and emission peak wavelength of the light-emitting element at around 1000 cd/m$^2$.

TABLE 6

|  | Luminance (cd/m$^2$) | Voltage (V) | External quantum efficiency(%) | Chromaticity (x, y) | Emission peak wavelength (nm) |
|---|---|---|---|---|---|
| Light-emitting element 6 | 1170 | 4.4 | 4.81 | (0.16, 0.20) | 466 |

As is clear from FIG. 18 and Table 6, the light-emitting element 6 had high external quantum efficiency. In addition, according to Table 6, the light-emitting element 6 had blue light emission having a high chromaticity. The reason for this lifetime. In the light-emitting element 6, since the first light-emitting layer 102a contains the first light-emitting substance having a LUMO level that is substantially the same as that of the electron-transporting organic compound (CzPA in this example) contained in the second light-emitting layer 102b, electrons can be easily transported between the first light-emitting layer 102a and the second light-emitting layer 102b, and accumulation of the electrons at the interface between the first light-emitting layer 102a and the second light-emitting layer 102b is suppressed.

As described above, the light-emitting element 6 of this example can have improved emission efficiency and longer lifetime, and furthermore, high color purity.

Example 4

In this example, materials used in other examples will be described.

<<Synthesis Example of PCBAPA>>

An example of a synthesis method of 4-(10-phenyl-9-anthryl)-4'-(9-phenyl-9H-carbazol-3-yl)triphenylamine (PCBAPA) which is used in Examples 1 to 3 and represented by the structural formula (11) is described below.

Step 1: Synthesis of 9-phenyl-9H-carbazole-3-boronic acid

A synthetic scheme of 9-phenyl-9H-carbazole-3-boronic acid is shown in the following reaction formula (a-1).

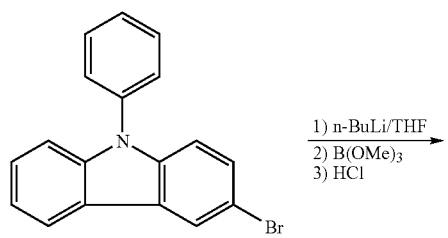

(a-1)

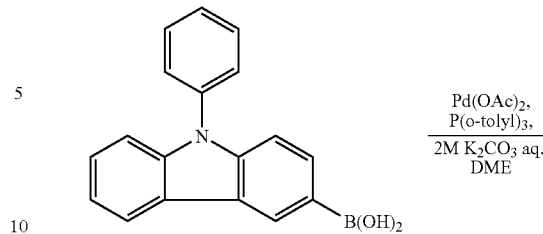

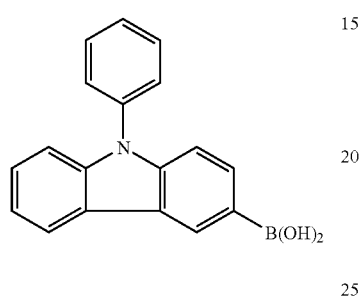

First, 10 g (31 mmol) of 3-bromo-9-phenyl-9H-carbazole was put into a 500-mL three-neck flask. The air in the flask was replaced with nitrogen. Then, 150 mL of tetrahydrofuran (THF) was put into the flask, and 3-bromo-9-phenyl-9H-carbazole was dissolved therein. This solution was cooled to −80° C. After that, 20 mL (32 mmol) of n-butyllithium (a 1.58 mol/L hexane solution) was added to the solution by being dripped with the use of a syringe. After the dripping, this solution was stirred at the same temperature for 1 hour. After the stirring, 3.8 mL (34 mmol) of trimethyl borate was added to the solution, and the solution was stirred for about 15 hours while the temperature of the solution was brought back to room temperature. After that, about 150 mL (1.0 mol/L) of dilute hydrochloric acid was added to the solution, and then the solution was stirred for 1 hour. Then, an aqueous layer of this mixture was extracted with ethyl acetate, and the extracted solution and an organic layer were combined and washed with saturated sodium hydrogen carbonate. The organic layer was dried with magnesium sulfate, and then this mixture was subjected to gravity filtration. The resulting filtrate was concentrated to give an oily light brown substance. The obtained oily substance was dried under low pressure to give 7.5 g of a light brown solid, which was an object, in a yield of 86%.

Step 2: Synthesis of 4-(9-phenyl-9H-carbazol-3-yl)diphenylamine (PCBA)

A synthetic scheme of PCBA is shown in the following reaction formula (a-2).

(a-2)

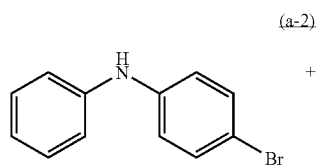 +

First, 6.5 g (26 mmol) of 4-bromodiphenylamine, 7.5 g (26 mmol) of 9-phenyl-9H-carbazole-3-boronic acid which was synthesized in Step 1, and 400 mg (1.3 mmol) of tri(o-tolyl)phosphine were put into a 500-mL three-neck flask. The air in the flask was replaced with nitrogen. Then, 100 mL of toluene, 50 mL of ethanol, and 14 mL of a potassium carbonate aqueous solution (0.2 mol/L) were added to the mixture. Under low pressure, the mixture was degassed while being stirred. After the degassing, 67 mg (30 mmol) of palladium (II) acetate was added to the mixture. This mixture was refluxed at 100° C. for 10 hours. After the reflux, an aqueous layer of the mixture was extracted with toluene, and the extracted solution was combined with an organic layer and then washed with a saturated saline solution. The organic layer was dried with magnesium sulfate, and then this mixture was subjected to gravity filtration. The resulting filtrate was concentrated to give an oily light brown substance. This oily substance was purified by silica gel column chromatography (a developing solvent was hexane:toluene=4:6). A white solid obtained by the purification was recrystallized with a mixed solvent of dichloromethane and hexane to give 4.9 g of a white solid, which was an object, in a yield of 45%.

The white solid which was obtained through Step 2 described above was measured by a nuclear magnetic resonance (NMR) method. The measurement results of $^1$H NMR are shown below. The measurement results show that PCBA serving as a source material to synthesize PCBAPA was obtained.

$^1$H NMR (CDCl$_3$, 300 MHz): δ=7.08-7.14 (m, 3H), 7.32-7.72 (m, 33H), 7.88 (d, J=7.8 Hz, 2H), 8.19 (d, J=7.8 Hz, 1H), 8.37 (d, J=1.5 Hz, 1H).

Step 3: Synthesis of PCBAPA

A synthetic scheme of PCBAPA is shown in the following reaction formula (a-3).

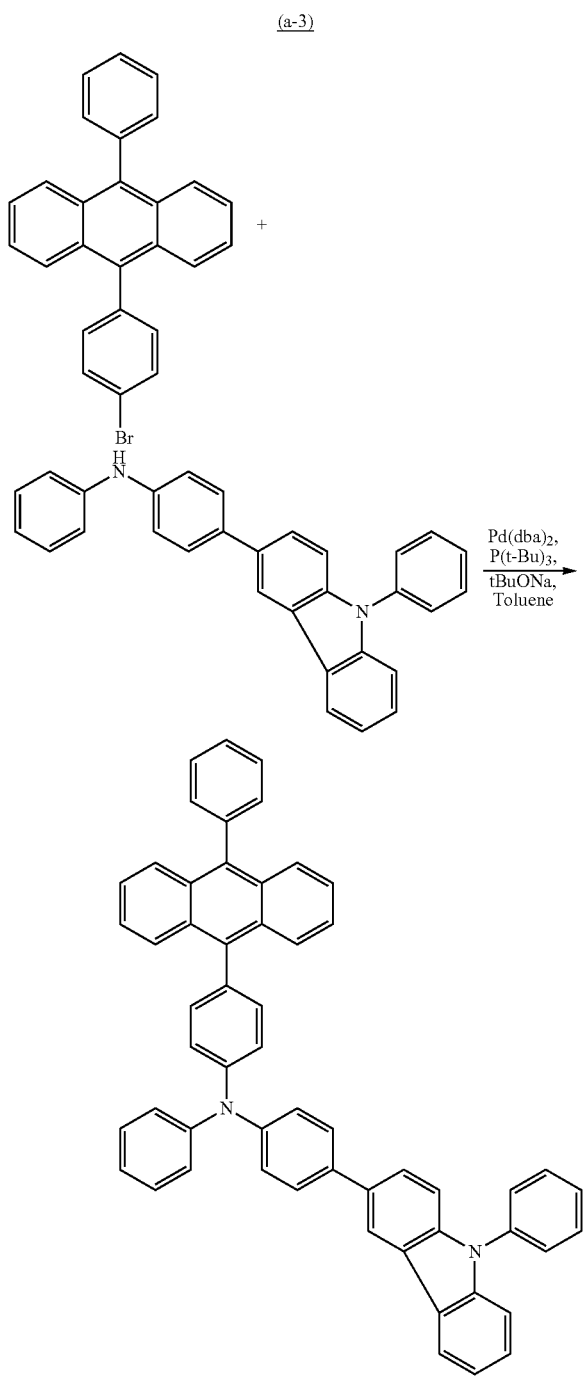

First, 7.8 g (12 mmol) of 9-(4-bromophenyl)-10-phenylanthracene, 4.8 g (12 mmol) of PCBA, and 5.2 g (52 mmol) of sodium tert-butoxide were put into a 300-mL three-neck flask. The air in the flask was replaced with nitrogen. To this mixture, 60 mL of toluene and 0.30 mL of tri(tert-butyl) phosphine (a 10 wt % hexane solution) were added. Under low pressure, this mixture was degassed while being stirred. After the degassing, 136 mg (0.24 mmol) of bis(dibenzylideneacetone)palladium(0) was added to the mixture. Then, the mixture was stirred at 100° C. for 3 hours. After the stirring, about 50 mL of toluene was added to this mixture. The mixture was subjected to suction filtration through Celite (produced by Wako Pure Chemical Industries, Ltd., Catalog No. 531-16855), alumina, and Florisil (produced by Wako Pure Chemical Industries, Ltd., Catalog No. 540-00135). The resulting filtrate was concentrated to give a yellow solid. The solid was recrystallized with a mixed solvent of toluene and hexane, so that 6.6 g of a light yellow solid of PCBAPA, which was an object, was obtained in a yield of 75%. Then, 3.0 g of the obtained light yellow powdered solid was sublimated and purified by a train sublimation method. For sublimation purification conditions, PCBAPA was heated at 350° C. under a pressure of 8.7 Pa with a flow rate of argon gas of 3.0 mL/min. After the sublimation purification, 2.7 g of a light yellow solid PCBAPA was obtained in a yield of 90%.

The obtained solid was measured by a nuclear magnetic resonance (NMR) method. The measurement results of $^1$H NMR are shown below. The measurement results show that PCBAPA was obtained.

$^1$H NMR (DMSO-$d_6$, 300 MHz): δ=7.08-7.14 (m, 3H), 7.32-7.72 (m, 33H), 7.88 (d, J=7.8 Hz, 2H), 8.19 (d, J=7.8 Hz, 1H), 8.37 (d, J=1.5 Hz, 1H).

<<Synthesis Example of PCBANB>>

An example of a synthesis method of 4-(1-naphthyl)-4'-(9-phenyl-9H-carbazol-3-yl)-triphenylamine (PCBANB) which is used in Examples 1 to 3 and represented by the structural formula (12) is described below.

Step 1: Synthesis of 3-(4-bromophenyl)-9-phenyl-9H-carbazole

A synthetic scheme of 3-(4-bromophenyl)-9-phenyl-9H-carbazole is shown in the following reaction formula (b-1).

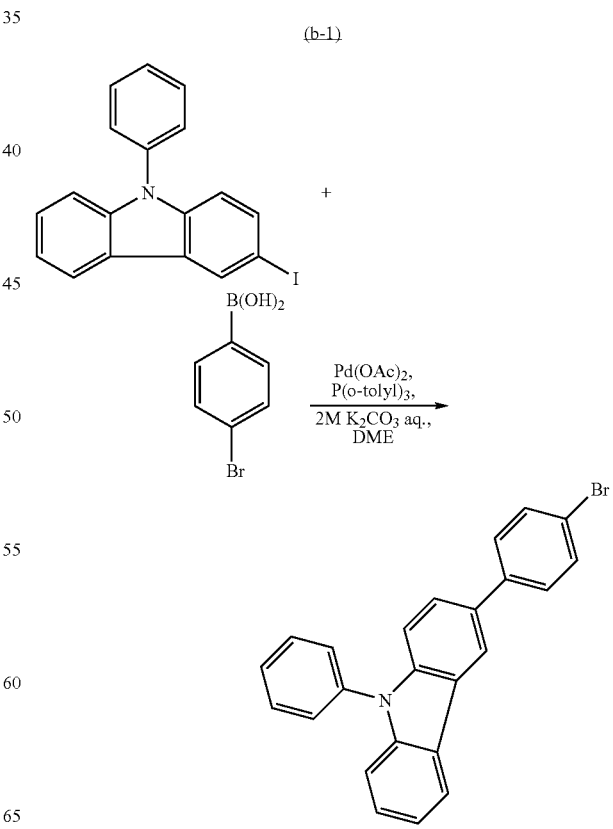

First, 3.7 g (9.9 mmol) of 3-iodo-9-phenyl-9H-carbazole, 2.0 g (9.9 mmol) of 4-bromo phenylboronic acid, and 0.61 g (2.0 mmol) of tri(o-tolyl)phosphine were put into a 200-mL three-neck flask, and 50 mL of 1,2-dimethoxyethane (DME) and 10 mL of a potassium carbonate solution (2 mol/L) were added to this mixture. This mixture was degassed while being stirred under low pressure. After the degassing, the air in the flask was replaced with nitrogen.

Then, 0.11 g (0.50 mmol) of palladium(II) acetate was added to this mixture. This mixture was stirred at 80° C. for 9.5 hours. After the stirring, this mixture was cooled to room temperature and then washed twice with water. An aqueous layer which was obtained was extracted twice with toluene. Then, the extracted solution was combined with an organic layer and then washed with a saturated saline solution. The organic layer was dried with magnesium sulfate, the mixture was subjected to gravity filtration, and then the filtrate was concentrated.

The obtained oily substance was dissolved in about 20 mL of toluene. This solution was subjected to suction filtration through Celite (manufactured by Wako Pure Chemical Industries, Ltd., Catalog No. 531-16855), alumina, and Florisil (manufactured by Wako Pure Chemical Industries, Ltd., Catalog No. 540-00135). A solid which was obtained by concentrating the resulting filtrate was purified by silica gel column chromatography (developing solvent, toluene:hexane=1:4) to obtain 1.9 g of a white powdered solid, which was an object, in a yield of 49%.

Step 2: Synthesis of 4-(1-naphthyl)diphenylamine

A synthetic scheme of 4-(1-naphthyl)diphenylamine is shown in the following reaction formula (b-2).

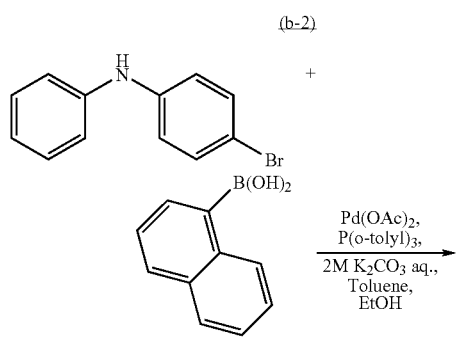

(b-2)

First, 12 g (50 mmol) of 4-bromodiphenylamine, 8.6 g (50 mmol) of 1-naphthaleneboronic acid, 22 mg (0.1 mmol) of palladium(II) acetate, and 60 mg (0.2 mmol) of tri(orthotolyl)phosphine were put into a 200-mL three-neck flask, and 50 mL of toluene, 20 mL of ethanol, and 35 mL of a potassium carbonate solution (2 mol/L) were added to this mixture. This mixture was degassed while being stirred under low pressure. After the degassing, the mixture was heated and stirred under a nitrogen atmosphere at 90° C. for 2 hours.

After the stirring, 100 mL of toluene was added to this mixture, and the mixture was filtered through Florisil (produced by Wako Pure Chemical Industries, Ltd., Catalog No. 540-00135) and Celite (produced by Wako Pure Chemical Industries, Ltd., Catalog No. 531-16855). The resulting filtrate was washed with water, and magnesium sulfate was added thereto to dry the filtrate. This mixture was filtered. A compound which was obtained by concentrating the resulting filtrate was purified by silica gel column chromatography (developing solvent, toluene:hexane:ethyl acetate=1:8:1). The fractions obtained were concentrated to give a compound, and methanol was added thereto. The mixture was irradiated with supersonic waves and then recrystallized to give 3.0 g of a white powder, which was an object, in a yield of 20%.

Step 3: Synthesis of 4-(1-naphthyl)-4'-(9-phenyl-9H-carbazol-3-yl)-triphenylamine (PCBANB)

A synthetic scheme of PCBANB is shown in the following reaction formula (b-3).

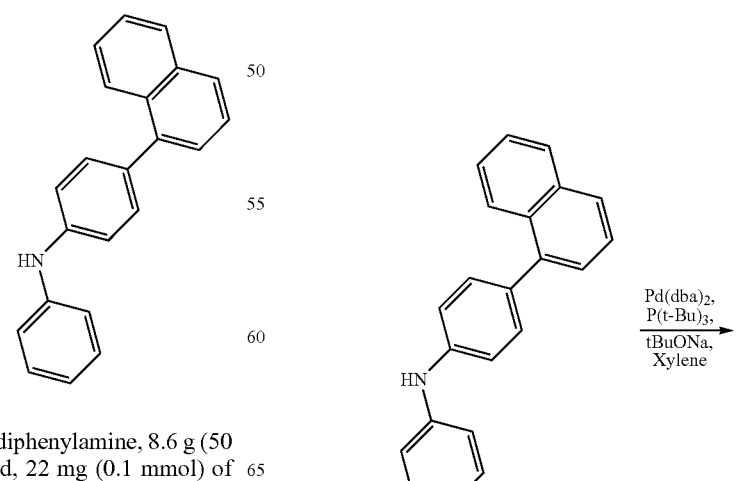

(b-3)

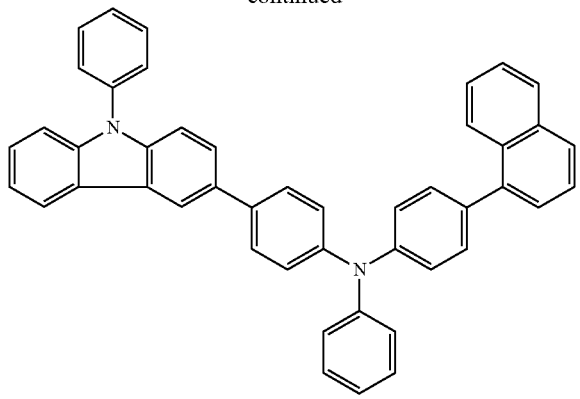

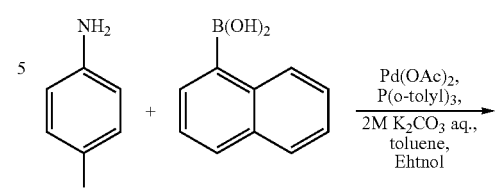

First, 1.2 g (3.0 mmol) of 3-(4-bromophenyl)-9-phenyl-9H-carbazole, 0.9 g (3.0 mmol) of 4-(1-naphthyl)diphenylamine, 0.5 g (5.0 mmol) of sodium tert-butoxide, and 6.0 mg (0.01 mmol) of bis(dibenzylideneacetone)palladium(0) were put into a 50-mL three-neck flask, and 15 mL of dehydrated xylene was added to this mixture. This mixture was degassed while being stirred under low pressure. After the degassing, 0.06 mL (0.03 mmol) of tri(tert-butyl)phosphine (10 wt % hexane solution) was added thereto. This mixture was heated and stirred under a nitrogen atmosphere at 120° C. for 4.5 hours.

After the stirring, 250 mL of toluene was added to this mixture, and the mixture was filtered through Florisil (produced by Wako Pure Chemical Industries, Ltd., Catalog No. 540-00135), silica gel, alumina, and Celite (produced by Wako Pure Chemical Industries, Ltd., Catalog No. 531-16855). The resulting filtrate was washed with water, and magnesium sulfate was added thereto to dry the filtrate. This mixture was filtered through Florisil (produced by Wako Pure Chemical Industries, Ltd., Catalog No. 540-00135), alumina, silica gel, and Celite (produced by Wako Pure Chemical Industries, Ltd., Catalog No. 531-16855) to obtain a filtrate. The resulting filtrate was concentrated, and acetone and methanol were added thereto. The mixture was irradiated with supersonic waves and then recrystallized to give 1.5 g of a white powder, which was an object, in a yield of 82%.

An Rf value of the objective substance, obtained by a silica gel thin layer chromatography (TLC) (developing solvent, ethyl acetate:hexane=1:10) was 0.34, that of 3-(4-bromophenyl)-9-phenyl-9H-carbazole was 0.46, and that of 4-(1-naphthyl)diphenylamine was 0.25.

The compound which was obtained through Step 3 described above was measured by a nuclear magnetic resonance (NMR) method. The measurement results of $^1$H NMR are shown below. The measurement results show that PCBANB was obtained.

$^1$H NMR (CDCl$_3$, 300 MHz): δ (ppm)=7.07 (t, J=6.6 Hz, 1H), 7.25-7.67 (m, 26H), 7.84 (d, J=7.8 Hz, 1H), 7.89-7.92 (m, 1H), 8.03-8.07 (m, 1H), 8.18 (d, J=7.8 Hz, 1H), 8.35 (d, J=0.9 Hz, 1H).

<<Synthesis Example of PCBNAPA>>

An example of a synthesis method of 4-(1-naphthyl)-4'-(10-phenyl-9-anthryl)-4"-(9-phenyl-9H-carbazol-3-yl)triphenylamine (PCBNAPA) which is used in Examples 1 to 3 and represented by the structural formula (14) is described below.

Step 1: Synthesis of 4-(1-naphthyl)aniline

A synthesis scheme of 4-(1-naphthyl)aniline is shown in the following reaction formula (c-1).

First, 5.0 g (29 mmol) of 4-bromoaniline, 5.0 g (29 mmol) of 1-naphthylboronic acid, and 0.45 g (1.5 mmol) of tri(ortho-tolyl)phosphine were put into a 500-mL three-neck flask, and the air in the flask was replaced with nitrogen. Then, 100 mL of toluene, 50 mL of ethanol, and 31 mL of a potassium carbonate aqueous solution (2 mol/L) were added to this mixture. The mixture in the flask was stirred and degassed while reducing pressure in the flask. Then, after the mixture was heated at 60° C., 66.2 mg (0.29 mmol) of palladium(II) acetate was added to the mixture. The mixture was refluxed at 80° C. for 2.3 hours. After the reflux, toluene and water were added to the mixture, an organic layer and an aqueous layer were separated, and the aqueous layer was extracted twice with toluene. The extract and the organic layer were combined, washed with a saturated saline solution, and dried with magnesium sulfate. The mixture was subjected to gravity filtration to remove magnesium sulfate. Then, the filtrate was concentrated to give an oily substance, which was subjected to suction filtration through Florisil (produced by Wako Pure Chemical Industries, Ltd., Catalog No. 540-00135), Celite (produced by Wako Pure Chemical Industries, Ltd., Catalog No. 531-16855), and alumina to obtain a filtrate. The resulting filtrate was concentrated to give 2.5 g of an oily substance, which was an object, in a yield of 40%.

Step 2: Synthesis of 4-(1-naphthyl)-4'-(9-phenyl-9H-carbazol-3-yl)diphenylamine (PCBNA)

A synthetic scheme of PCBNA is shown in the following reaction formula (c-2).

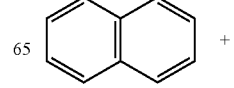

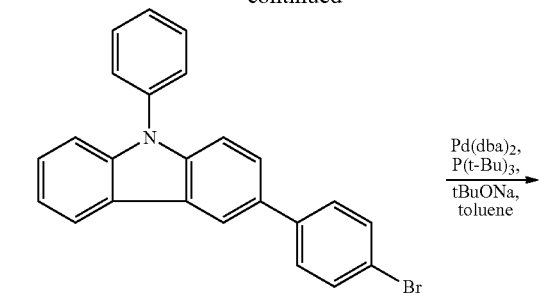

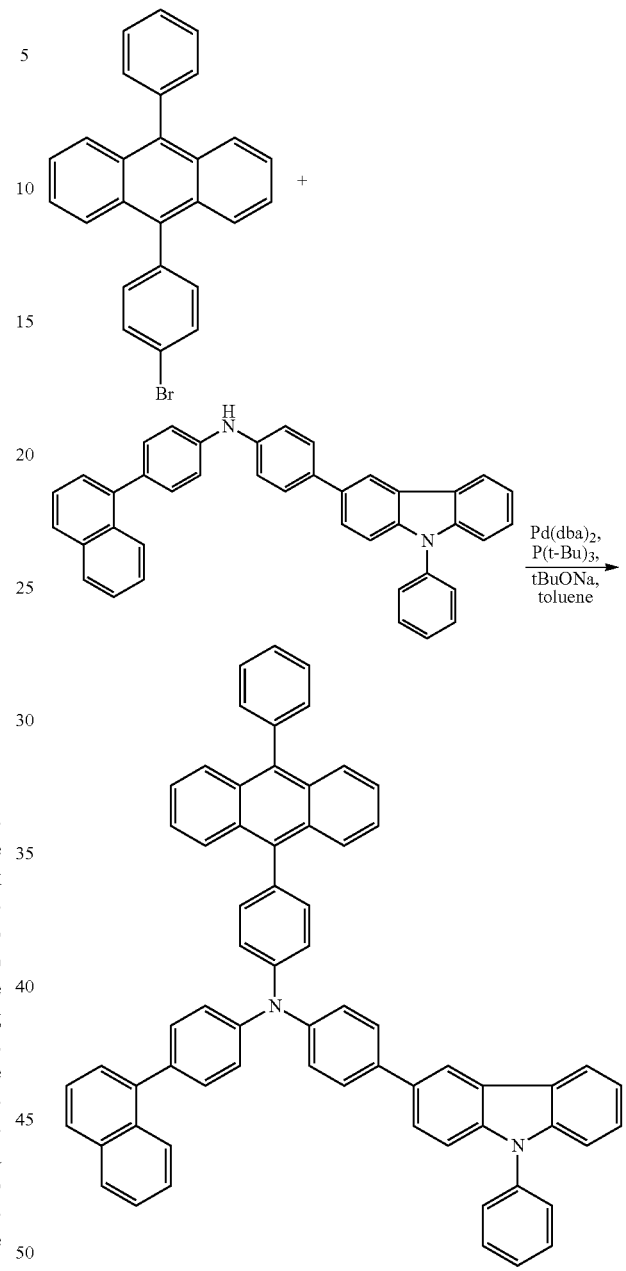

First, 0.8 g (2.0 mmol) of 3-(4-bromophenyl)-9-phenyl-9H-carbazole and 0.6 g (6.0 mmol) of sodium tert-butoxide were put into a 50-mL three-neck flask, and the air in the flask was replaced with nitrogen. After 0.4 g (2.0 mmol) of 4-(1-naphthyl)aniline dissolved in 4 mL of toluene was added to the mixture, 1.8 mL of toluene and 0.1 mL of tri(tert-butyl)phosphine (a 10 wt % hexane solution) were added to the mixture. The mixture was heated at 60° C., and then 37 mg (0.06 mmol) of bis(dibenzylideneacetone)palladium(0) was added. The mixture was stirred at 80° C. for 3 hours. After the stirring, toluene was added to the mixture, and suction filtration through Celite (produced by Wako Pure Chemical Industries, Ltd., Catalog No. 531-16855) and alumina was carried out to give a filtrate. The resulting filtrate was concentrated to give a solid, which was purified by silica gel column chromatography (developing solvent, hexane:toluene=3:2). The obtained fractions were concentrated to give 0.7 g of a brown solid, which was an object, in a yield of 63%.

A solid which was obtained through the above Step 2 was measured by a nuclear magnetic resonance (NMR) method. The measurement results of $^1$H NMR are shown below. The measurement results show that PCBNA was obtained.

$^1$H NMR (CDCl$_3$, 300 MHz): δ=7.25-7.70 (m, 23H), 7.84 (d, J=7.8 Hz, 1H), 7.91 (d, J=7.2 Hz, 1H), 8.03 (d, J=8.1 Hz, 1H), 8.12 (d, J=7.2 Hz, 1H), 8.34 (s, 1H).

Step 3: Synthesis of 4-(1-naphthyl)-4'-(10-phenyl-9-anthryl)-4''-(9-phenyl-9H-carbazol-3-yl)triphenylamine (PCBNAPA)

A synthetic scheme of PCBNAPA is shown in the following reaction formula (c-3).

First, 0.45 g (1.1 mmol) of 9-(4-bromophenyl)-10-phenylanthracene and 0.4 g (4.3 mmol) of sodium tert-butoxide were put into a 50-mL three-neck flask, and the air in the flask was replaced with nitrogen. After 0.8 g (1.4 mmol) of PCBNA dissolved in 10 mL of toluene was added to the mixture, 4.3 mL of toluene and 0.1 mL of tri(tert-butyl)phosphine (a 10 wt % hexane solution) were added thereto. The mixture was heated at 60° C., and then 23 mg (4.0 mmol) of bis(dibenzylideneacetone)palladium(0) was added. The mixture was stirred at 80° C. for 2 hours. After the stirring, suction filtration through Florisil (produced by Wako Pure Chemical Industries, Ltd., Catalog No. 540-00135), Celite (produced by Wako Pure Chemical Industries, Ltd., Catalog No. 531-16855), and alumina was carried out to obtain a filtrate. The resulting filtrate was concentrated to give a solid, which was purified by silica gel column chromatography (developing solvent, hexane:toluene=3:7), and the obtained fractions were concentrated to give a yellow solid which was an object. The resulting solid was recrystallized with a mixed solvent of toluene and hexane, to obtain 1.07 g of a light yellow powdered solid, which was an object, in a yield of 85%.

Then, 0.84 g of the obtained yellow solid was sublimated and purified by a train sublimation method. For sublimation purification conditions, the light yellow solid was heated at 380° C. under a pressure of 4.5 Pa with a flow rate of argon gas of 5 mL/min. After the sublimation purification, 0.76 g of a yellow prism crystal which was an object was obtained in a yield of 91%.

A compound which was obtained through Step 3 described above was measured by a nuclear magnetic resonance (NMR) method. The measurement results of $^1$H NMR are shown below. The measurement results show that PCBNAPA was obtained.

$^1$H NMR (CDCl$_3$, 300 MHz): δ=7.28-7.66 (m, 31H), 7.70-7.78 (m, 6H), 7.85-7.94 (m, 4H), 8.09-8.12 (m, 1H), 8.20 (d, J=7.8 Hz, 1H), 8.40 (d, J=1.2 Hz, 1H).

<<Synthesis Example of PCBA1BP>>

An example of a synthesis method of 4-phenyl-4'-(9-phenyl-9H-carbazol-3-yl)triphenylamine (PCBA1BP) which is used in Example 2 and represented by the structural formula (17) is described below.

A synthetic scheme of 4-phenyl-4'-(9-phenyl-9H-carbazol-3-yl)triphenylamine (PCBA1BP) is shown in the following reaction formula (d-1).

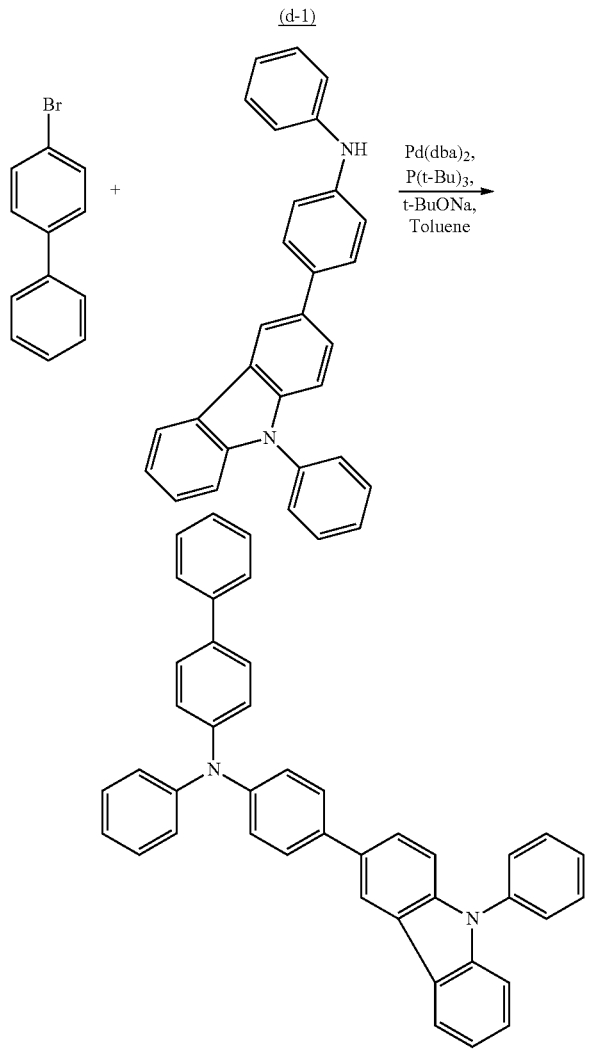

First, 2.0 g (4.9 mmol) of 4-(9-phenyl-9H-carbazol-3-yl) diphenylamine (PCBA), 1.1 g (4.9 mmol) of 4-bromobiphenyl, and 2.0 g (20 mmol) of sodium tert-butoxide were put into a 100-mL three-neck flask, and the air in the flask was replaced with nitrogen. Then, 50 mL of toluene and 0.30 mL of tri(tert-butyl)phosphine (10 wt % hexane solution) were added to this mixture. This mixture was degassed while being stirred under low pressure. After the degassing, 0.10 g of bis(dibenzylideneacetone)palladium(0) was added.

Next, this mixture was heated and stirred at 80° C. for 5 hours. After the stirring, toluene was added to this mixture, followed by suction filtration through Celite (manufactured by Wako Pure Chemical Industries, Ltd., Catalog No. 531-16855), alumina, and Florisil (manufactured by Wako Pure Chemical Industries, Ltd., Catalog No. 540-00135), to obtain a filtrate. The resulting filtrate was washed with a saturated sodium carbonate solution and a saturated saline solution in this order. Then, magnesium sulfate was added to an organic layer to dry the layer. After the drying, the mixture was subjected to suction filtration to remove the magnesium sulfate, and thus a filtrate was obtained.

A compound obtained by concentrating the resulting filtrate was purified by silica gel column chromatography. The silica gel column chromatography was performed by, first, using a mixture solvent of toluene:hexane=1:9 as a developing solvent, and then using a mixture solvent of toluene:hexane=3:7 as another developing solvent. The resulting fractions were concentrated to give a solid, and the solid was recrystallized with a mixed solvent of chloroform and hexane, so that 2.3 g of a powdered white solid was obtained in a yield of 84%.

Sublimation purification of 1.2 g of the obtained white solid was performed by a train sublimation method. The sublimation purification was performed under a low pressure of 7.0 Pa and with an argon flow rate of 3 mL/min, at 280° C. for 20 hours. Accordingly, 1.1 g of the white solid was obtained in a yield of 89%.

A compound which was obtained through the above was measured by a nuclear magnetic resonance (NMR) method. The measurement results of $^1$H NMR are shown below. The measurement results show that PCBA1BP was obtained.

$^1$H NMR (DMSO-d$_6$, 300 MHz): δ (ppm)=7.05-7.20 (m, 7H), 7.28-7.78 (m, 21H), 8.34 (d, J=7.8 Hz, 1H), 8.57 (s, 1H).

Example 5

In this example, the HOMO levels and the LUMO levels of the materials used for the light-emitting elements 1 to 6 and the reference light-emitting elements 1 to 3 which were manufactured in Examples 1 to 3 were measured.

Measurement Example 1

PCBAPA

In this measurement example, the HOMO level and the LUMO level of PCBAPA represented by the structural formula (11) were measured. PCBAPA was used as the first light-emitting substance in the light-emitting elements 1 to 6 and the reference light-emitting element 1. The ionization potential of a thin film of PCBAPA, measured by a photoelectron spectrometer (AC-2, manufactured by Riken Keiki Co., Ltd.) in the air, was 5.40 eV. As a result, the HOMO level was found to be −5.40 eV. Furthermore, with the use of the absorption spectrum data of the thin film of PCBAPA, the absorption edge was obtained by a Tauc plot, assuming direct transition.

By using the absorption edge as an optical energy gap, the energy gap was found to be 2.82 eV. From the obtained value of the energy gap and the HOMO level, the LUMO level was −2.58 eV.

Measurement Example 2

PCBANB

In this measurement example, the HOMO level and the LUMO level of PCBANB represented by the structural formula (12) were measured. PCBANB was used as the hole-transporting organic compound in the light-emitting elements 1, 2, and 6 and the reference light-emitting element 2. The ionization potential of a thin film of PCBANB, measured by a photoelectron spectrometer (AC-2, manufactured by Riken Keiki Co., Ltd.) in the air, was 5.44 eV. As a result, the HOMO level was found to be −5.44 eV. Furthermore, with the use of the absorption spectrum data of the thin film of PCBANB, the absorption edge was obtained by a Tauc plot, assuming direct transition. By using the absorption edge as an optical energy gap, the energy gap was found to be 3.25 eV. From the obtained value of the energy gap and the HOMO level, the LUMO level was −2.19 eV.

Measurement Example 3

PCBA1BP

In this measurement example, the HOMO level and the LUMO level of PCBA1BP represented by the structural formula (17) were measured. PCBA1BP was used as the hole-transporting organic compound in the light-emitting elements 3 to 5 and the reference light-emitting element 3. The ionization potential of a thin film of PCBA1BP, measured by a photoelectron spectrometer (AC-2, manufactured by Riken Keiki Co., Ltd.) in the air, was 5.42 eV. As a result, the HOMO level was found to be −5.42 eV. Furthermore, with the use of the absorption spectrum data of the thin film of PCBA1BP, the absorption edge was obtained by a Tauc plot, assuming direct transition. By using the absorption edge as an optical energy gap, the energy gap was found to be 3.21 eV. From the obtained value of the energy gap and the HOMO level, the LUMO level was −2.21 eV.

Measurement Example 4

PCBNAPA

In this measurement example, the HOMO level and the LUMO level of PCBNAPA represented by the structural formula (14) were measured. PCBNAPA was used as the second light-emitting substance in the light-emitting elements 1 to 6 and the reference light-emitting elements 1 to 3. The ionization potential of a thin film of PCBNAPA, measured by a photoelectron spectrometer (AC-2, manufactured by Riken Kikei, Co., Ltd.) in the air, was 5.47 eV. As a result, the HOMO level was found to be −5.47 eV. Further, with the use of the absorption spectrum data of the thin film of PCBNAPA, the absorption edge was obtained by a Tauc plot, assuming direct transition. By using the absorption edge as an optical energy gap, the energy gap was found to be 2.92 eV. From the obtained value of the energy gap and the HOMO level, the LUMO level was −2.55 eV.

Measurement Example 5

CzPA

In this measurement example, the HOMO level and the LUMO level of CzPA represented by the structural formula (13) were measured. CzPA was used as the electron-transporting organic compound in the light-emitting elements 1 to 6 and the reference light-emitting elements 1 to 3. The ionization potential of a thin film of CzPA, measured by a photoelectron spectrometer (AC-2, manufactured by Riken Keiki Co., Ltd.) in the air, was 5.64 eV. As a result, the HOMO level was found to be −5.64 eV. Further, with the use of the absorption spectrum data of the thin film of CzPA, the absorption edge was obtained by a Tauc plot, assuming direct transition. By using the absorption edge as an optical energy gap, the energy gap was found to be 2.95 eV. From the obtained value of the energy gap and the HOMO level, the LUMO level was −2.69 eV.

Example 6

In this example, light-emitting elements having structures different from those in Examples 1, 2, and 3 will be described. The molecular structure of one of organic compounds used in this example is shown in the following structural formula (18). Note that the organic compounds whose molecular structures are already shown in the other examples are not described in this example. The element structure in this example is the same as that in Example 1, about which FIG. 2 is referred to.

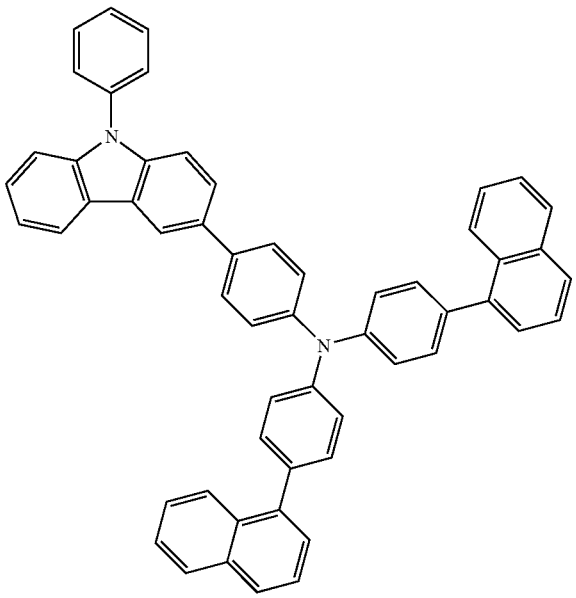

(18)

Hereinafter, manufacturing methods of light-emitting elements 7 and 8 of this example are described. The light-emitting elements 7 and 8 were formed in a manner similar to that of the light-emitting element 1 in Example 1, including and up to formation of a hole-transporting layer 105.

On the hole-transporting layer 105, a first light-light-emitting layer 102*a* was formed by co-evaporation of 4-(10-phenyl-9-anthryl)-4'-(9-phenyl-9H-carbazol-3-yl)triphenylamine (PCBAPA) which was a first light-emitting substance and 4,4'-di(1-naphthyl)-4"-(9-phenyl-9H-carbazol-3-yl)triphenylamine (PCBNBB) which was a hole-transporting organic compound and represented by the above structural formula (18). The first light-emitting layer 102a was deposited such that PCBAPA:PCBNBB was 1:1 in the light-emitting element 7, and 1:2 in the light-emitting element 8 (mass ratio). The thickness of the first light-emitting layer 102a was 25 nm.

Next, on the first light-emitting layer 102a of each of the light-emitting elements, a second light-emitting layer 102b was formed by co-evaporation of 9-[4-(10-phenyl-9-antryl)phenyl]-9H-carbazole (CzPA) which was an electron-transporting organic compound and 4-(10-phenyl-9-anthryl)-4'-(9-phenyl-9H-carbazol-3-yl)triphenylamine (PCBAPA) which was a second light-emitting substance. In this manner, a light-emitting layer 102 including the first light-emitting layer 102a and the second light-emitting layer 102b was formed. Note that the same compound was used for the first and second light-emitting substances in this example. The mass ratio of CzPA to PCBAPA in the second light-emitting layer 102b was set to be 1:0.1, and the thickness of the second light-emitting layer 102b was 30 nm.

Then, on the light-emitting layer 102, an electron-transporting layer 106, an electron-injecting layer 107, and a cathode 101 were stacked in sequence, so that the light-emitting elements 7 and 8 were completed. These layers were formed in a manner similar to that of the light-emitting element 1 in Example 1.

Table 7 shows the element structures of the light-emitting elements 7 and 8 manufactured as described above.

TABLE 7

| | Anode | Hole-injecting layer | Hole-transporting layer | First light-emitting layer | Second light-emitting layer | Electron-transporting layer | Electron-injecting layer | Cathode |
|---|---|---|---|---|---|---|---|---|
| Light-emitting element 7 | ITSO 110 nm | NPB:MoOx (=4:1) 50 nm | NPB 10 nm | PCBAPA:PCBNBB (=1:1) 25 nm | CzPA:PCBAPA (=1:0.1) 30 nm | Alq 10 nm | BPhen 15 nm | LiF 1 nm | Al 200 nm |
| Light-emitting element 8 | ITSO 110 nm | NPB:MoOx (=4:1) 50 nm | NPB 10 nm | PCBAPA:PCBNBB (=1:2) 25 nm | CzPA:PCBAPA (=1:0.1) 30 nm | Alq 10 nm | BPhen 15 nm | LiF 1 nm | Al 200 nm |

The thus obtained light-emitting element 7 and light-emitting element 8 were put into a glove box under a nitrogen atmosphere so that the light-emitting elements 7 and 8 were sealed from the air. Then, the operating characteristics of these light-emitting elements were measured. The measurement was carried out at room temperature (under an atmosphere kept at 25° C.).

Figure 20:
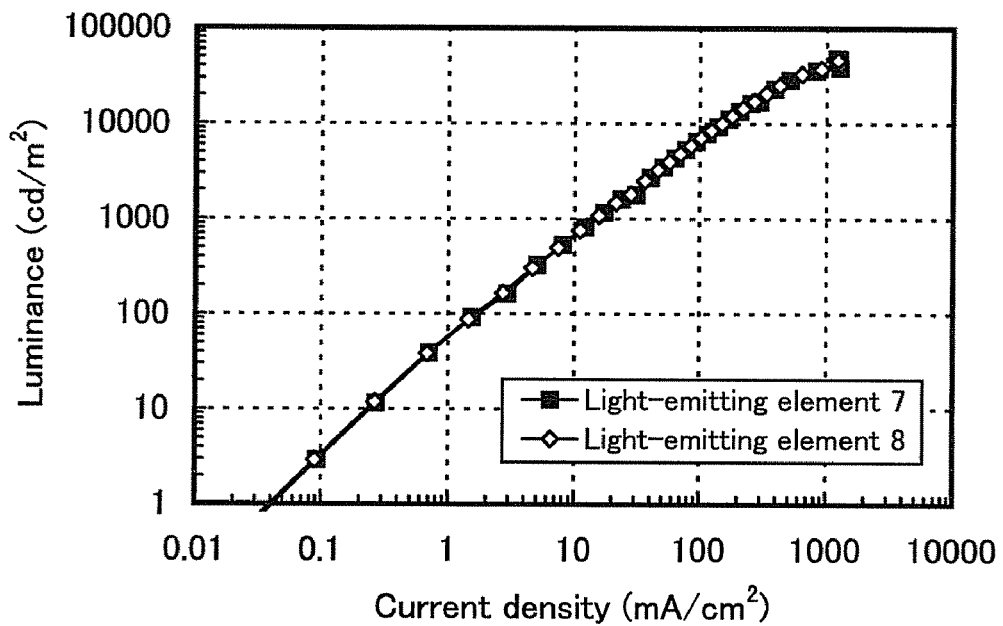
FIG. 20 shows characteristics of light-emitting elements of Example 6.
Figure 21:
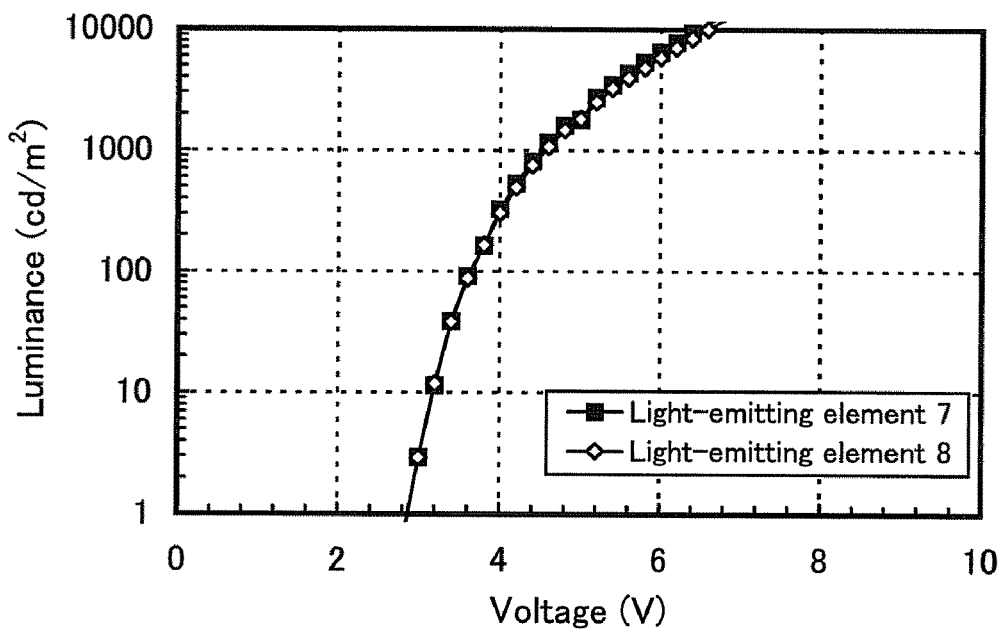
FIG. 21 shows characteristics of light-emitting elements of Example 6.
Figure 22:
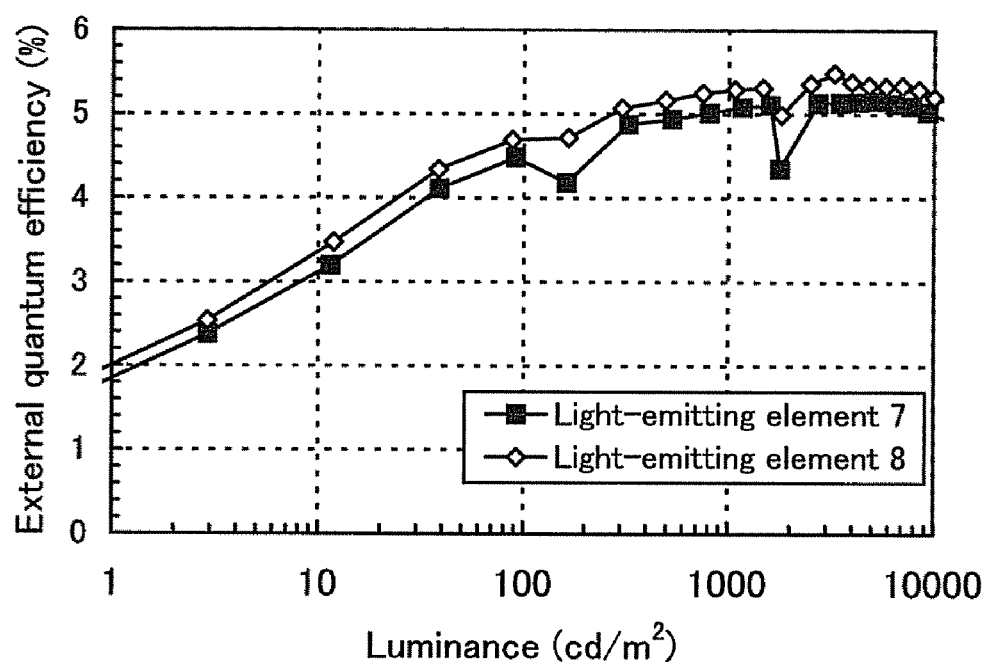
FIG. 22 shows characteristics of light-emitting elements of Example 6.

FIG. 20 shows current density-luminance characteristics, FIG. 21 shows voltage-luminance characteristics, and FIG. 22 shows luminance-external quantum efficiency characteristics of the light-emitting elements. Table 8 shows voltage, external quantum efficiency, chromaticity, and emission peak wavelength of each of the light-emitting elements at around 1000 cd/m$^2$.

TABLE 8

| | Luminance (cd/m$^2$) | Voltage (V) | External quantum efficiency (%) | Chromaticity (x, y) | Emission peak wavelength (nm) |
|---|---|---|---|---|---|
| Light-emitting element 7 | 1160 | 4.6 | 5.08 | (0.15, 0.18) | 466 |
| Light-emitting element 8 | 1070 | 4.6 | 5.29 | (0.15, 0.18) | 464 |

As is clear from FIG. 22 and Table 8, the light-emitting elements 7 and 8 had high external quantum efficiency. In addition, according to Table 8, the light-emitting elements 7 and 8 had blue light emission having a high chromaticity. The reason for this is probably as follows. In the light-emitting elements 7 and 8, since the first light-emitting layer 102a contains the first light-emitting substance (PCBAPA in this example) and the hole-transporting organic compound (PCBNBB in this example), transport of electrons is controlled in the first light-emitting layer 102a and a light-emitting region is formed around the interface between the first and second light-emitting layers.

Figure 23:
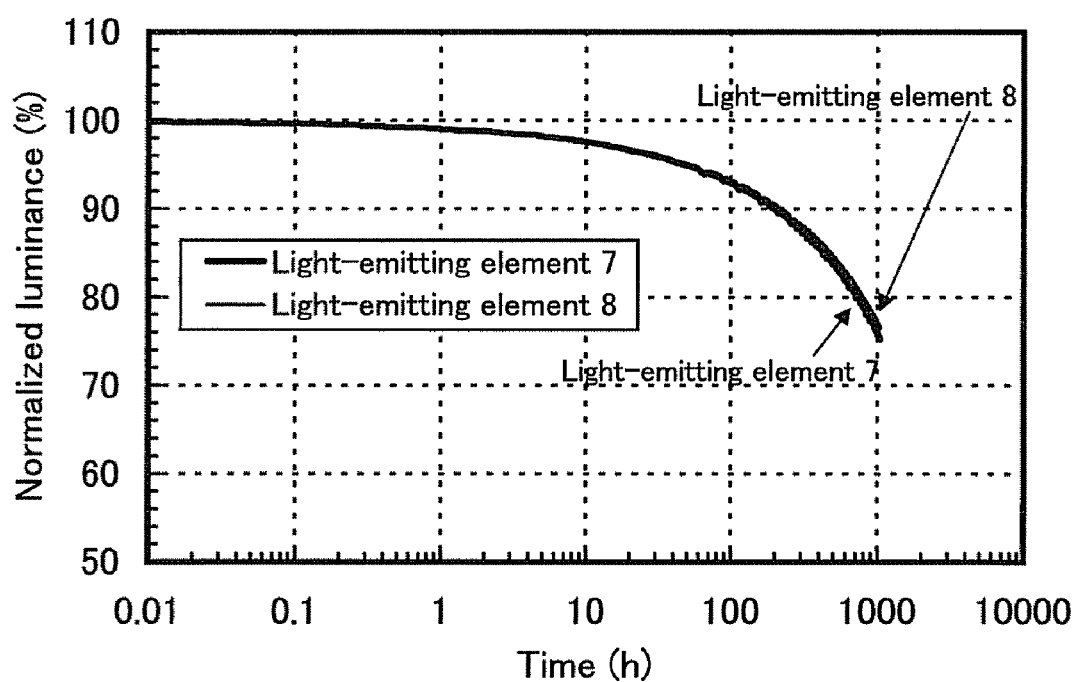
FIG. 23 shows characteristics of light-emitting elements of Example 6.

Reliability tests were conducted on the light-emitting elements 7 and 8 manufactured as described above. In the reliability tests, the initial luminance was set at 1000 cd/m$^2$, and the elements were driven at a constant current density. The luminance was measured every time a predetermined period of time passed. FIG. 23 shows the results obtained by the reliability tests. In FIG. 23, the horizontal axis represents current flow time (hour) and the vertical axis represents the percentage of luminance to the initial luminance at each time, that is, normalized luminance (%).

As is clear from FIG. 23, the light-emitting element 7 kept 75% of the initial luminance, and the light-emitting element 8 kept 76% of the initial luminance, after having been driven for 1000 hours. Accordingly, it is found that the luminance of each of the light-emitting elements of this example does not decrease easily with the passage of time, and the light-emitting elements have long lifetime. In the light-emitting elements 7 and 8, since the first light-emitting layer 102a contains the first light-emitting substance having a LUMO level that is substantially the same as that of the electron-transporting organic compound (CzPA in this example) contained in the second light-emitting layer 102b and the same compound is used for the first and second light-emitting substances, electrons can be easily transported between the first light-emitting layer 102a and the second light-emitting layer 102b, and accumulation of the electrons at the interface between the first light-emitting layer 102a and the second light-emitting layer 102b is suppressed, whereby the light-emitting elements have long lifetime.

As described above, the light-emitting elements 7 and 8 of this example can have improved emission efficiency and longer lifetime, and furthermore, high color purity.

Example 7

In this example, a materials used in other examples will be described.

<<Synthesis Example of PCBNBB>>

A synthesis example of 4,4'-di(1-naphthyl)-4''-(9-phenyl-9H-carbazol-3-yl)-triphenylamine (PCBNBB) which is used in Example 6 and represented by the structural formula (18) is described below.

Step 1: Synthesis of 4,4'-dibromotriphenylamine

A synthetic scheme of 4,4'-dibromotriphenylamine is shown in the following reaction formula (K-1).

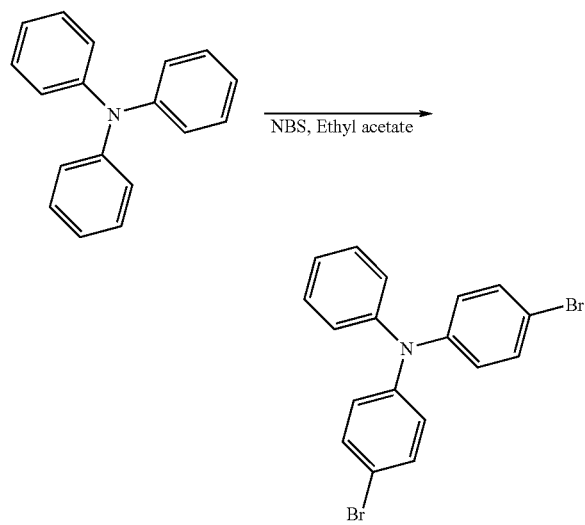

After 12 g (50 mmol) of triphenylamine was dissolved in a mixture solvent of 250 mL of ethyl acetate in a 500-mL conical flask, 18 g (100 mmol) of N-bromo succinimide (NBS) was added to this solution. After that, this mixture was stirred at room temperature for 24 hours. After completion of the reaction, this mixture solution was washed with water, and magnesium sulfate was added thereto to remove moisture. This mixture solution was filtered and the resulting filtrate was concentrated and dried to obtain 20 g of a white solid, which was an object, in a yield of 99%.

Step 2: Synthesis of 4,4'-di(1-naphthyl)triphenylamine

A synthetic scheme of 4,4'-di(1-naphthyl)triphenylamine is shown in the following reaction formula (K-2).

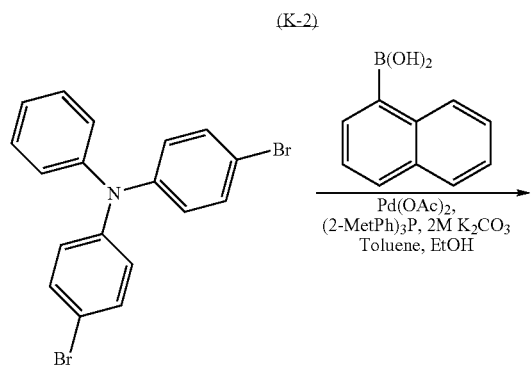

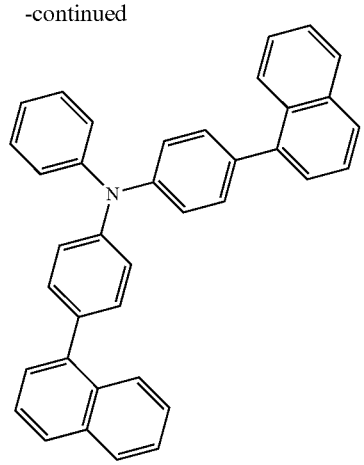

First, 6.0 g (15 mmol) of 4,4'-dibromotriphenylamine, 5.2 g (30 mmol) of 1-naphthaleneboronic acid, 2.0 mg (0.01 mmol) of palladium(II) acetate, and 6.0 mg (0.02 mmol) of tri(o-tolyl)phosphine were put into a 100-mL three-neck flask, and 20 mL of toluene, 5 mL of ethanol, and 20 mL of a potassium carbonate aqueous solution (2 mol/L) were added to this mixture. This mixture was degassed while being stirred under low pressure. After the degassing, the mixture was heated and stirred under a nitrogen atmosphere at 90° C. for 4.5 hours to be reacted.

After the reaction, 150 mL of toluene was added to this reaction mixture, and the suspension was filtered through Florisil and Celite. The resulting filtrate was washed with water. Then, magnesium sulfate was added to remove moisture. The suspension was filtered through Florisil, alumina, silica gel, and then Celite to obtain a filtrate. The resulting filtrate was concentrated, and methanol was added thereto. The mixture was irradiated with supersonic waves and then recrystallized to obtain 6.4 g of a white powder, which was an object, in a yield of 86%.

An Rf value of the objective substance, obtained by a silica gel thin layer chromatography (TLC) (developing solvent, ethyl acetate:hexane=1:10) was 0.53 and that of 4,4'-dibromotriphenylamine was 0.69.

Step 3: Synthesis of 4-bromo-4',4''-di(1-naphthyl) triphenylamine

A synthetic scheme of 4-bromo-4',4''-di(1-naphthyl)triphenylamine is shown in the following reaction formula (K-3).

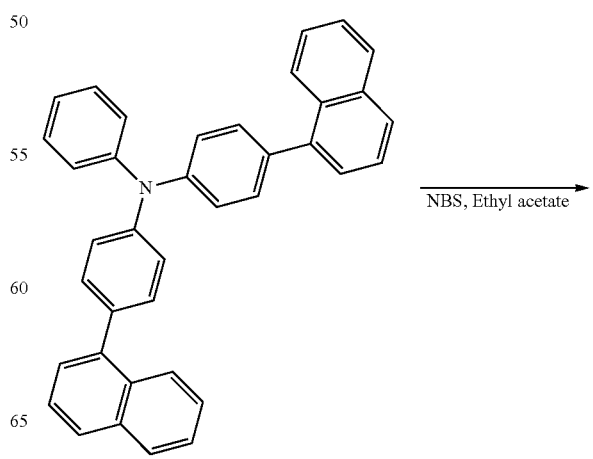

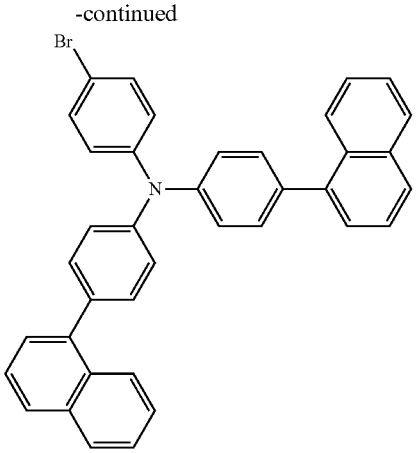

After 6.4 g (13 mmol) of 4,4'-di(1-naphthyl)triphenylamine was dissolved in 150 mL of ethyl acetate in a 300-mL conical flask, 2.3 g (13 mmol) of N-bromo succinimide (NBS) was added to this solution. After that, the mixture was stirred at room temperature for 24 hours. After completion of the reaction, the mixture solution was washed with water, and magnesium sulfate was added thereto to remove moisture. The mixture solution was filtered, the resulting filtrate was concentrated, and methanol was added thereto. The mixture was irradiated with supersonic waves and then recrystallized and purified by silica gel column chromatography (developing solvent, toluene:hexane=1:5). Accordingly, 1.6 g of a white powder, which was an object, was obtained in a yield of 22%.

Step 4: Synthesis of 4,4'-di(1-naphthyl)-4''-(9-phenyl-9H-carbazol-3-yl)-triphenylamine (PCBNBB)

A synthesis scheme of 4,4'-di(1-naphthyl)-4''-(9-phenyl-9H-carbazol-3-yl)-triphenylamine is shown in the following reaction formula (K-4).

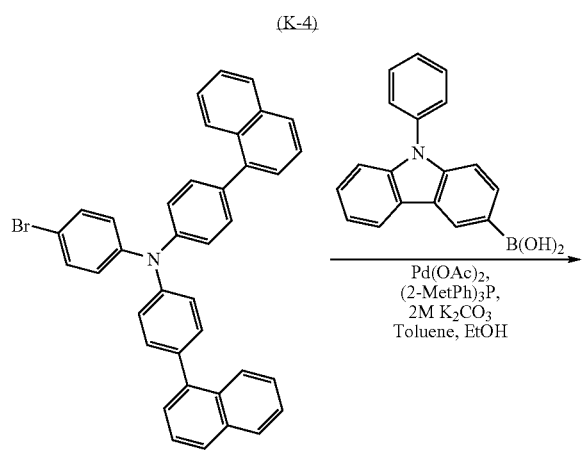

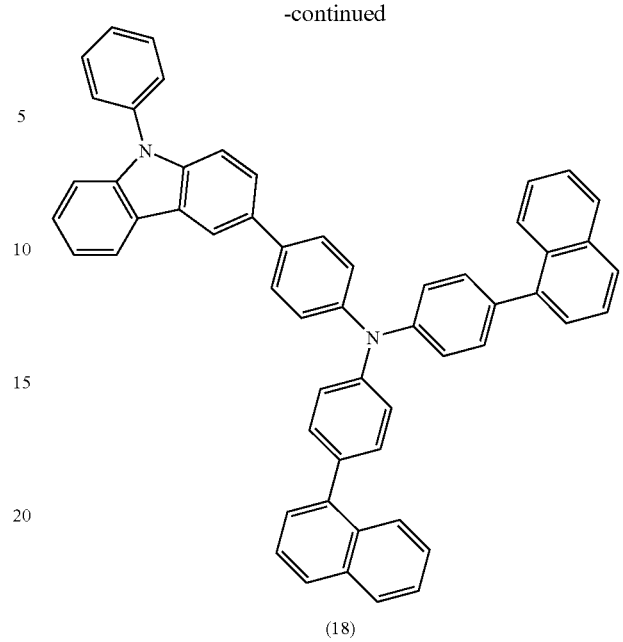

First, 1.4 g (2.5 mmol) of 4-bromo-4',4''-di(1-naphthyl)triphenylamine, 0.7 g (2.5 mmol) of 9-phenyl-9H-carbazol-3-yl-boronic acid, 4.0 mg (0.02 mmol) of palladium(II) acetate, and 6.0 mg (0.02 mmol) of tri(o-tolyl)phosphine were put into a 50-mL three-neck flask, and 20 mL of toluene, 5 mL of ethanol, and 2.5 mL of a potassium carbonate aqueous solution (2 mol/L) were added to this mixture. This mixture was degassed while being stirred under low pressure. After the degassing, the mixture was heated and stirred under a nitrogen atmosphere at 90° C. for 6.5 hours to be reacted.

After the reaction, 150 mL of toluene was added to this reaction mixture, and the suspension was filtered through Florisil and then Celite. The resulting filtrate was washed with water. Then, magnesium sulfate was added to remove moisture. The suspension was filtered through Florisil, alumina, silica gel, and then Celite to obtain a filtrate. The resulting filtrate was concentrated and purified by silica gel column chromatography (developing solvent, toluene:hexane=1:4). The obtained fractions were concentrated, and methanol was added thereto. The mixture was irradiated with supersonic waves and then recrystallized to obtain 0.4 g of a white powder, which was an abject, in a yield of 22%.

A compound which was obtained through the above Step 4 was measured by a nuclear magnetic resonance (NMR) method. The measurement data of $^1$H NMR are shown below. The measurement results show that PCBNBB was obtained.

$^1$H NMR (CDCl$_3$, 300 MHz): δ (ppm)=7.28-7.72 (m, 30H), 7.85 (d, J=7.8 Hz, 2H), 7.90-7.93 (m, 2H), 8.06-8.09 (m, 2H), 8.19 (d, J=7.5 Hz, 1H), 8.38 (d, J=1.5 Hz, 1H).

The ionization potential of a thin film of PCBNBB, measured by a photoelectron spectrometer (AC-2, manufactured by Riken Keiki, Co., Ltd.) in the air, was 5.46 eV. As a result, the HOMO level was found to be −5.46 eV. Further, with the use of the absorption spectrum data of the thin film of PCBNBB, the absorption edge was obtained by a Tauc plot, assuming direct transition. By using the absorption edge as an optical energy gap, the energy gap was found to be 3.15 eV. From the obtained value of the energy gap and the HOMO level, the LUMO level was −2.31 eV.

This application is based on Japanese Patent Application serial no. 2009-011410 filed with Japan Patent Office on Jan. 21, 2009, the entire contents of which are hereby incorporated by reference.

What is claimed is:

1. A light-emitting element comprising:
a first electrode;
a first light-emitting layer formed over the first electrode;
a second light-emitting layer formed on and in contact with the first light-emitting layer; and
a second electrode formed over the second light-emitting layer,
wherein the first light-emitting layer includes a first light-emitting substance and a hole-transporting organic compound,
wherein the second light-emitting layer includes a second light-emitting substance and an electron-transporting organic compound,
wherein a difference in highest occupied molecular orbital levels between the hole-transporting organic compound, the first light-emitting substance, and the second light-emitting substance is less than or equal to 0.2 eV, and
wherein the hole-transporting organic compound includes an arylamine skeleton and does not include a tricyclic, teracyclic, pentacyclic, or hexacyclic aromatic hydrocarbon skeleton.

2. The light-emitting element according to claim 1, wherein the first and second light-emitting layers emit light of the same color.

3. The light-emitting element according to claim 1, wherein a maximum peak of an emission spectrum of light from the first and second light-emitting layers is located in a wavelength of greater than or equal to 430 nm and less than or equal to 470 nm.

4. A light-emitting device comprising the light-emitting element according to claim 1.

5. An electronic device comprising the light-emitting device according to claim 4.

6. A light-emitting element comprising:
a first electrode;
a first light-emitting layer formed over the first electrode;
a second light-emitting layer formed on and in contact with the first light-emitting layer; and
a second electrode formed over the second light-emitting layer,
wherein the first light-emitting layer includes a first light-emitting substance and a hole-transporting organic compound,
wherein the second light-emitting layer includes a second light-emitting substance and an electron-transporting organic compound,
wherein a difference in highest occupied molecular orbital levels between the hole-transporting organic compound, the first light-emitting substance, and the second light-emitting substance is less than or equal to 0.2 eV, and
wherein a difference in lowest unoccupied molecular orbital levels between the hole-transporting organic compound and the first light-emitting substance is greater than 0.3 eV.

7. The light-emitting element according to claim 6, wherein the first and second light-emitting layers emit light of the same color.

8. The light-emitting element according to claim 6, wherein a maximum peak of an emission spectrum of light from the first and second light-emitting layers is located in a wavelength of greater than or equal to 430 nm and less than or equal to 470 nm.

9. A light-emitting device comprising the light-emitting element according to claim 6.

10. An electronic device comprising the light-emitting device according to claim 9.

11. A light-emitting element comprising:
a first electrode;
a first light-emitting layer formed over the first electrode;
a second light-emitting layer formed on and in contact with the first light-emitting layer; and
a second electrode formed over the second light-emitting layer,
wherein the first light-emitting layer includes a first light-emitting substance and a hole-transporting organic compound,
wherein the second light-emitting layer includes a second light-emitting substance and an electron-transporting organic compound,
wherein the hole-transporting organic compound is a compound including an arylamine skeleton, and
wherein each of the first and second light-emitting substances is a compound including a tricyclic, tetracyclic, pentacyclic, or hexacyclic aromatic hydrocarbon skeleton and an arylamine skeleton.

12. The light-emitting element according to claim 11, wherein a proportion of the first light-emitting substance in the first light-emitting layer is greater than or equal to 30 wt % and less than or equal to 70 wt %.

13. The light-emitting element according to claim 11, wherein the first and second light-emitting layers emit light of the same color.

14. The light-emitting element according to claim 11, wherein a maximum peak of an emission spectrum of light from the first and second light-emitting layers is located in a wavelength of greater than or equal to 430 nm and less than or equal to 470 nm.

15. A light-emitting device comprising the light-emitting element according to claim 11.

16. An electronic device comprising the light-emitting device according to claim 15.

17. A light-emitting element comprising:
a first electrode;
a first light-emitting layer formed over the first electrode;
a second light-emitting layer formed on and in contact with the first light-emitting layer; and
a second electrode formed over the second light-emitting layer,
wherein the first light-emitting layer includes a first light-emitting substance and a hole-transporting organic compound,
wherein the second light-emitting layer includes a second light-emitting substance and an electron-transporting organic compound,
wherein the hole-transporting organic compound is a compound represented by a general formula (1) below, wherein each of the first and second light-emitting substances is a compound represented by a general formula (2) below,

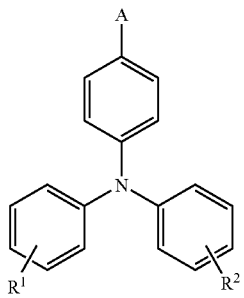

(1)

wherein, in the general formula (1), A represents any one of a substituted or unsubstituted phenyl group and a substituted or unsubstituted naphthyl group, and each of $R^1$ and $R^2$ represents any one of hydrogen, an alkyl group including 1 to 4 carbon atoms, a substituted or unsubstituted phenyl group, a substituted or unsubstituted naphthyl group, and a substituted or unsubstituted carbazolyl group, and

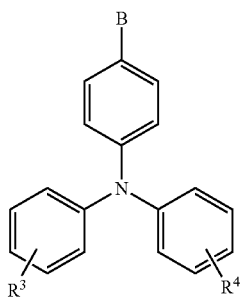

(2)

wherein, in the general formula (2), B represents a tricyclic, tetracyclic, pentacyclic, or hexacyclic aromatic hydrocarbon skeleton and each of $R^3$ and $R^4$ represents any one of hydrogen, an alkyl group including 1 to 4 carbon atoms, a substituted or unsubstituted phenyl group, a substituted or unsubstituted naphthyl group, and a substituted or unsubstituted carbazolyl group.

18. The light-emitting element according to claim 17, wherein a proportion of the first light-emitting substance in the first light-emitting layer is greater than or equal to 30 wt % and less than or equal to 70 wt %.

19. The light-emitting element according to claim 17, wherein the first and second light-emitting layers emit light of the same color.

20. The light-emitting element according to claim 17, wherein a maximum peak of an emission spectrum of light from the first and second light-emitting layers is located in a wavelength of greater than or equal to 430 nm and less than or equal to 470 nm.

21. A light-emitting device comprising the light-emitting element according to claim 17.

22. An electronic device comprising the light-emitting device according to claim 21.

23. A light-emitting element comprising:
a first electrode;
a first light-emitting layer formed over the first electrode;
a second light-emitting layer formed on and in contact with the first light-emitting layer; and
a second electrode formed over the second light-emitting layer,
wherein the first light-emitting layer includes a first light-emitting substance and a hole-transporting organic compound,
wherein the second light-emitting layer includes a second light-emitting substance and an electron-transporting organic compound,
wherein the hole-transporting organic compound is a compound represented by a general formula (3) below,
wherein each of the first and second light-emitting substances is a compound represented by a general formula (4) below,

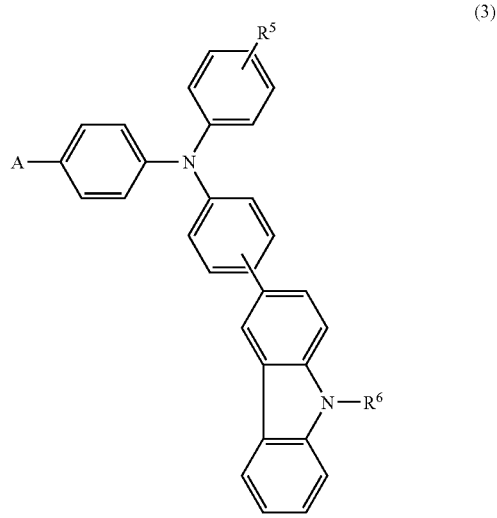

(3)

wherein, in the general formula (3), A represents any one of a substituted or unsubstituted phenyl group and a substituted or unsubstituted naphthyl group, $R^5$ represents any one of hydrogen, an alkyl group including 1 to 4 carbon atoms, a substituted or unsubstituted phenyl group, and a substituted or unsubstituted naphthyl group, and $R^6$ represents any one of an alkyl group including 1 to 4 carbon atoms, a substituted or unsubstituted phenyl group, and a substituted or unsubstituted naphthyl group, and

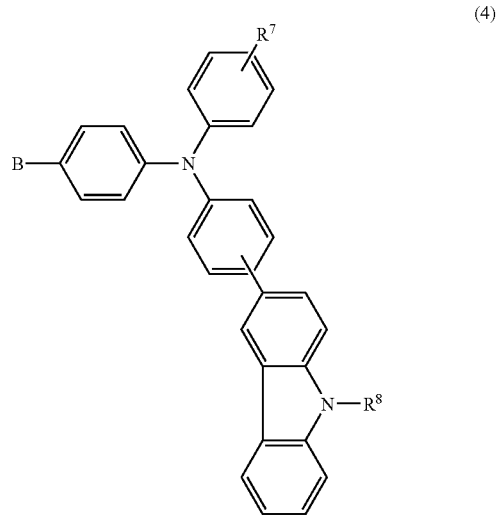

(4)

wherein, in the general formula (4), B represents a tricyclic, tetracyclic, pentacyclic, or hexacyclic aromatic hydrocarbon skeleton, $R^7$ represents any one of hydrogen, an alkyl group including 1 to 4 carbon atoms, a substituted or unsubstituted phenyl group, and a substituted or unsubstituted naphthyl group, and $R^8$ represents any one of an alkyl group including 1 to 4 carbon atoms, a substituted or unsubstituted phenyl group, and a substituted or unsubstituted naphthyl group.

24. The light-emitting element according to claim 23, wherein a proportion of the first light-emitting substance in the first light-emitting layer is greater than or equal to 30 wt % and less than or equal to 70 wt %.

25. The light-emitting element according to claim 23, wherein the first and second light-emitting layers emit light of the same color.

26. The light-emitting element according to claim 23, wherein a maximum peak of an emission spectrum of light from the first and second light-emitting layers is located in a wavelength of greater than or equal to 430 nm and less than or equal to 470 nm.

27. A light-emitting device comprising the light-emitting element according to claim 23.

28. An electronic device comprising the light-emitting device according to claim 27.

* * * * *